(12) United States Patent  
Han et al.

(10) Patent No.: US 12,317,695 B2  
(45) Date of Patent: May 27, 2025

(54) LIGHT-EMITTING SUBSTRATE AND DISPLAY APPARATUS

(71) Applicant: BOE TECHNOLOGY GROUP CO., LTD., Beijing (CN)

(72) Inventors: Ying Han, Beijing (CN); Yicheng Lin, Beijing (CN); Guang Yan, Beijing (CN); Pan Xu, Beijing (CN); Dongfang Yang, Beijing (CN); Xing Zhang, Beijing (CN); Zhan Gao, Beijing (CN); Guoying Wang, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,248

(22) PCT Filed: May 31, 2021

(86) PCT No.: PCT/CN2021/097496  
§ 371 (c)(1),  
(2) Date: Jun. 27, 2022

(87) PCT Pub. No.: WO2022/252086  
PCT Pub. Date: Dec. 8, 2022

(65) Prior Publication Data  
US 2024/0188344 A1 Jun. 6, 2024

(51) Int. Cl.  
*H10K 59/123* (2023.01)  
*H10K 59/60* (2023.01)  
(Continued)

(52) U.S. Cl.  
CPC ........... *H10K 59/123* (2023.02); *H10K 59/60* (2023.02); *H10K 59/80522* (2023.02); *H10K 59/80524* (2023.02); *H10K 2102/103* (2023.02)

(58) Field of Classification Search  
CPC .... H10K 59/123; H10K 59/126; H10K 59/60; H10K 59/878; H10K 59/80522;  
(Continued)

(56) References Cited

U.S. PATENT DOCUMENTS

2005/0012454 A1 1/2005 Yamazaki et al.  
2008/0158108 A1 7/2008 Hwang et al.  
(Continued)

FOREIGN PATENT DOCUMENTS

CN 107316884 A 11/2017  
CN 107749419 A 3/2018  
(Continued)

OTHER PUBLICATIONS

PCT International Search Report and Written Opinion (with English translation) for corresponding PCT Application No. PCT/CN2021/097509, mailed on Jan. 30, 2022, 17 pages.  
(Continued)

*Primary Examiner* — Shahed Ahmed  
*Assistant Examiner* — Adam D Weiland  
(74) *Attorney, Agent, or Firm* — Dority & Manning, P.A.

(57) ABSTRACT

A light-emitting substrate includes a base substrate, light-emitting device(s) and a first insulating layer. A light-emitting device includes a first electrode, a light-emitting functional layer and a second electrode that are sequentially stacked. The first electrode includes a second sub-electrode and a first sub-electrode. The second sub-electrode includes a first portion covered by the first sub-electrode and a second portion except for the first portion. The first insulating layer has a first opening and a second opening. A portion of a side face of the first sub-electrode located on the second sub-electrode is covered by the first insulating layer. A portion of the light-emitting functional layer located in the first opening is in contact with the first sub-electrode, and a portion of  
(Continued)

the light-emitting functional layer located in the second opening is in contact with the second portion in the second sub-electrode.

20 Claims, 35 Drawing Sheets

(51) Int. Cl.
*H10K 59/80* (2023.01)
*H10K 102/10* (2023.01)
(58) Field of Classification Search
CPC ....... H10K 59/80524; H10K 2102/103; H10K 2102/10–20; H10K 50/813; H10K 50/822; H10K 50/805–828; H10K 50/816; H10K 50/826; H10K 50/00–88
See application file for complete search history.

(56) References Cited

U.S. PATENT DOCUMENTS

| | | | |
|---|---|---|---|
| 2012/0001182 A1* | 1/2012 | Choi | H10D 30/6739 438/34 |
| 2012/0115260 A1 | 5/2012 | Hwang et al. | |
| 2014/0299879 A1 | 10/2014 | Yamazaki | |
| 2015/0069356 A1 | 3/2015 | Lee et al. | |
| 2016/0086546 A1 | 3/2016 | Noh et al. | |
| 2018/0190935 A1 | 7/2018 | Kim et al. | |
| 2019/0197284 A1 | 6/2019 | Park | |
| 2019/0272407 A1 | 9/2019 | Park et al. | |
| 2020/0052241 A1 | 2/2020 | Li et al. | |
| 2020/0098839 A1 | 3/2020 | Xu et al. | |
| 2020/0321417 A1 | 10/2020 | Cheng et al. | |
| 2021/0167143 A1 | 6/2021 | He et al. | |
| 2021/0296411 A1 | 9/2021 | Gao et al. | |
| 2022/0037616 A1 | 2/2022 | Liu et al. | |
| 2022/0093894 A1 | 3/2022 | Song et al. | |
| 2022/0336566 A1 | 10/2022 | Chen et al. | |

FOREIGN PATENT DOCUMENTS

| | | |
|---|---|---|
| CN | 110047906 A | 7/2019 |
| CN | 110429114 A | 11/2019 |
| CN | 210200763 U | 3/2020 |
| CN | 112331801 A | 2/2021 |

OTHER PUBLICATIONS

PCT International Search Report (w/ English translation) and Written Opinion for corresponding PCT/Application No. PCT/CN2021/097496, mailed Jan. 13, 2022, 9 pages.

* cited by examiner

LIGHT-EMITTING SUBSTRATE AND DISPLAY APPARATUS

CROSS-REFERENCE TO RELATED APPLICATION

The present application is a national phase entry under 35 USC 371 of International Patent Application No. PCT/CN2021/097496, filed on May 31, 2021, which is incorporated herein by reference in its entirety.

TECHNICAL FIELD

The present disclosure relates to the field of display technologies, and in particular, to a light-emitting substrate and a display apparatus.

BACKGROUND

Display apparatuses may be classified into various types according to different display principles. For example, an organic light-emitting diode (OLED) display apparatus may include a plurality of OLED devices including an organic light-emitting material. The organic light-emitting material can emit light under driving of an electrical signal. Light-emitting brightness of each OLED device may be changed by adjusting an electrical signal for driving the OLED device, so that the OLED display apparatus may display an image. OLED display apparatuses have a broad development prospect due to their advantages of self-luminescence, high contrast, low energy consumption, wide viewing angle, fast response speed, wide temperature range, ease of manufacture, and the like.

SUMMARY

In an aspect, a light-emitting substrate is provided. The light-emitting substrate includes a base substrate, at least one light-emitting device, and a first insulating layer. The at least one light-emitting device is disposed above the base substrate, and a light-emitting device includes a first electrode, a light-emitting functional layer and a second electrode that are sequentially stacked in a direction moving away from the base substrate. The first electrode includes a second sub-electrode and a first sub-electrode that are sequentially stacked in the direction moving away from the base substrate. The second sub-electrode includes a first portion and a second portion except for the first portion, and the first portion is covered by the first sub-electrode. The first insulating layer is disposed above the base substrate, and the first insulating layer has a first opening and a second opening. An orthogonal projection of a lower edge of the first opening on the base substrate is located within an orthogonal projection of the first sub-electrode on the base substrate, and an orthogonal projection of a lower edge of the second opening on the base substrate is located within an orthogonal projection of a second portion of the second sub-electrode on the base substrate. A portion of a side face of the first sub-electrode located on the second sub-electrode is covered by the first insulating layer. A portion of the light-emitting functional layer located in the first opening is in contact with the first sub-electrode, and a portion of the light-emitting functional layer located in the second opening is in contact with the second portion of the second sub-electrode. The lower edge of the first opening is an edge of the first opening proximate to the base substrate, and the lower edge of the second opening is an edge of the second opening proximate to the base substrate.

In some embodiments, the first sub-electrode includes a first conductive pattern and a second conductive pattern that are sequentially stacked in the direction moving away from the base substrate, and an orthogonal projection of the first conductive pattern on the base substrate is within an orthogonal projection of the second conductive pattern on the base substrate.

In some embodiments, the second sub-electrode is a transparent conductive electrode. The first conductive pattern is a light-reflecting pattern.

In some embodiments, an area of the first opening is larger than an area of the second opening.

In some embodiments, the light-emitting substrate further includes at least one light-detecting device. The at least one light-detecting device is disposed above the base substrate and located on a side of the first electrode away from the light-emitting functional layer. An orthogonal projection of a light-detecting device on the base substrate overlaps with the orthogonal projection of the lower edge of the second opening on the base substrate; the light-detecting device is configured to detect light emitted by one or more light-emitting devices.

In some embodiments, the light-detecting device includes a third electrode and a fourth electrode. The fourth electrode is closer to the second opening than the third electrode. The fourth electrode is a transparent conductive electrode, and the second sub-electrode is a transparent conductive electrode.

In some embodiments, the light-emitting substrate further includes data lines, and the third electrode is disposed in a same layer as the data lines.

In some embodiments, the light-emitting substrate further includes a plurality of transistors. The plurality of transistors include at least one first transistor coupled to the light-emitting device, and a second transistor coupled to the light-detecting device. The plurality of transistors are disposed on the base substrate, each transistor includes an active layer, and the active layer is located on a side of the light-detecting device proximate to the base substrate. The light-detecting device further includes a semiconductor pattern, and an orthogonal projection of the semiconductor pattern on the base substrate is non-overlap with an orthogonal projection of each active layer of the plurality of transistors on the base substrate.

In some embodiments, an area of an orthogonal projection of the semiconductor pattern of the light-detecting device on the base substrate is larger than an area of an orthogonal projection of an active layer of the second transistor on the base substrate.

In some embodiments, the at least one first transistor includes a driving transistor, and a width-to-length ratio of a channel region of the second transistor is less than a width-to-length ratio of a channel region of the driving transistor.

In some embodiments, a length direction of a channel region of the second transistor is non-parallel to a length direction of a channel region of each first transistor.

In some embodiments, the light-emitting substrate includes at least two light-detecting devices and at least two second transistors coupled to the at least two light-detecting devices in a one-to-one correspondence. Each second transistor in the at least two second transistors further includes a first conductive portion and a second conductive portion that are respectively located on two sides of an active layer and in contact with the active layer, first conductive portions of the at least two second transistors are an integral pattern, and each second conductive portion is coupled to a light-detecting device of the at least two light-detecting devices.

In some embodiments, the at least two second transistors include four second transistors, the at least two light-detecting devices includes four light-detecting devices. First conductive portions, active layers and second conductive portions of the four second transistors provide a cross pattern.

In some embodiments, the light-emitting substrate further includes a photoelectric detection signal line, and the photoelectric detection signal line is coupled to the integral pattern.

In some embodiments, the light-emitting substrate further includes at least one conductive ring, and each conductive ring is located on a side of the active layer away from the base substrate. A portion of a conductive ring opposite to the active layer of each second transistor of the at least two second transistors serves as a gate of the second transistor. An orthogonal projection of the integral pattern on the base substrate is located inside an orthogonal projection of the conductive ring on the base substrate.

In some embodiments, the light-emitting substrate further includes a photoelectric detection control line. The photoelectric detection control line includes two control line segments coupled to the conductive ring, and each control line segment and the conductive ring provide an obtuse angle at a position where the control line segment and the conductive ring are coupled.

In some embodiments, the light-emitting substrate further includes an auxiliary electrode line. The auxiliary electrode line is disposed on a side of second electrode of light-emitting device proximate to the base substrate, and coupled to the second electrode of the light-emitting device.

In some embodiments, the light-emitting substrate further includes a first connection portion. The first connection portion is disposed on a side of the auxiliary electrode line away from the base substrate and the side of the second electrode of the light-emitting device proximate to the base substrate. The first connection portion is coupled to the second electrode and the auxiliary electrode line.

In some embodiments, the first connection portion includes a first connection pattern, a second connection pattern, and a third connection pattern that are sequentially stacked in the direction moving away from the base substrate. An orthogonal projection of the second connection pattern on the base substrate is within an orthogonal projection of the third connection pattern on the base substrate, and is within an orthogonal projection of the first connection pattern on the base substrate. The first insulating layer further has a third opening, and the third opening exposes at least a portion of the first connection pattern, at least a portion of the second connection pattern and at least a portion of the third connection pattern. The light-emitting functional layer further extends into the third opening, and a portion of the light-emitting functional layer located in the third opening is discontinuous; the second electrode further extends into the third opening, and a portion of the second electrode located in the third opening is in contact with at least one of the first connection pattern, the second connection pattern, and the third connection pattern.

In some embodiments, the portion of the second electrode located in the third opening is at least in contact with the first connection pattern.

In some embodiments, the first sub-electrode includes a first conductive pattern and a second conductive pattern that are sequentially stacked in the direction moving away from the base substrate. The first connection pattern of the first connection portion is disposed in a same layer as the second sub-electrode, the second connection pattern of the first connection portion is disposed in a same layer as the first conductive pattern of the first sub-electrode, and the third connection pattern of the connection portion is disposed in a same layer as the second conductive pattern of the first sub-electrode.

In some embodiments, the light-emitting substrate further includes a second connection portion. The second connection portion is disposed on a side of the first connection portion proximate to the base substrate and the side of the auxiliary electrode line away from the base substrate. The second connection portion is in contact with the first connection portion, and the auxiliary electrode line.

In some embodiments, the light-emitting substrate further includes a light-detecting device disposed above the base substrate and located on a side of the first electrode away from the light-emitting functional layer, and configured to detect light emitted by the at least one light-emitting device. The light-detecting device includes a third electrode and a fourth electrode, and the fourth electrode is closer to the second opening than the third electrode, and the auxiliary electrode line is coupled to the third electrode or the fourth electrode.

In some embodiments, the light-emitting substrate further includes a light-detecting device disposed above the base substrate and located on a side of the first electrode away from the light-emitting functional layer, and configured to detect light emitted by the at least one light-emitting device. The light-detecting device includes a third electrode and a fourth electrode, and the fourth electrode is closer to the second opening than the third electrode; the first connection pattern in the first connection portion is in contact with the fourth electrode.

In some embodiments, the light-emitting substrate further includes a light-detecting device disposed above the base substrate and located on a side of the first electrode away from the light-emitting functional layer, and configured to detect light emitted by the at least one light-emitting device; the light-detecting device including a third electrode and a fourth electrode, and the fourth electrode being closer to the second opening than the third electrode. The light-emitting substrate further includes a second insulating layer and a third insulating layer that are sequentially stacked above the base substrate in the direction moving away from the base substrate, and located on a side of the first connection portion proximate to the base substrate, and a side of the fourth electrode away from the base substrate. The second insulating layer has a fourth opening, and the third insulating layer has a fifth opening; an orthogonal projection of an upper edge of the fourth opening on the base substrate is within an orthogonal projection of a lower edge of the fifth opening on the base substrate, and overlaps with an orthogonal projection of the fourth electrode on the base substrate. The first connection portion is in contact with the fourth electrode through the fourth opening and the fifth opening. The upper edge of the fourth opening is an edge of the fourth opening away from the base substrate, and the lower edge of the fifth opening is an edge of the fifth opening proximate to the base substrate.

In some embodiments, the light-emitting substrate is a display panel.

In another aspect, a display apparatus is provided. The display apparatus includes the light-emitting substrate according to any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Figure 1:
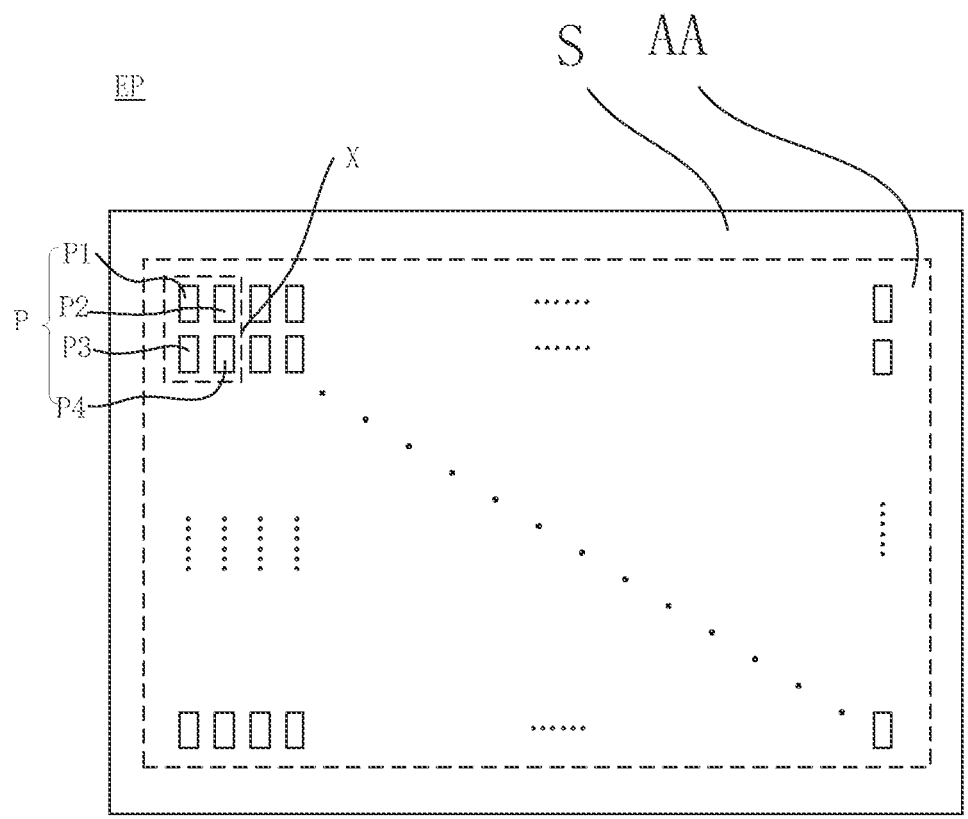
FIG. 1 is a top view of a light-emitting substrate, in accordance with some embodiments.

Technical solutions in some embodiments of the present disclosure will be described clearly and completely with reference to accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, terms such as "one embodiment", "some embodiments", "exemplary embodiments", "an example", "a specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phrase "based on" or "according to" is meant to be open and inclusive, since a process, step, calculation or other action that is "based on" or "according to" one or more of the stated conditions or values may, in practice, be based on additional conditions or values exceeding those stated.

As used herein, the term "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

The phrase "an orthogonal projection of A on B" herein means a projection of A on B in a direction perpendicular to a plane where B is located.

Exemplary embodiments are described herein with reference to sectional views and/or plan views as idealized exemplary drawings. In the accompanying drawings, thickness of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing. For example, an etched region shown as a rectangle shape generally has a curved feature. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display apparatus. The display apparatus is a product with an image display function. For example, the display apparatus may be a display, a television, a billboard, a digital photo frame, a laser printer with a display function, a telephone, a mobile phone, a personal digital assistant (PDA), a digital camera, a camcorder, a viewfinder, a navigator, a vehicle, a large-area wall, a home appliance, an information search device (e.g., a business search device in a department such as an electronic government, a bank, a hospital or an electric power department), a monitor, or the like.

The display apparatus may include a light-emitting substrate, and may further include a light-emitting control circuit coupled to the light-emitting substrate, and the like. The light-emitting control circuit is configured to drive the light-emitting substrate to emit light, and includes, for example, a circuit board, an integrated circuit (IC), and the like.

In some embodiments, the light-emitting substrate may be a display panel configured to display an image, which may be referred to as the light-emitting substrate since the display panel is required to emit light in a process of displaying the image. For example, the display panel may emit light of three primary colors (for example, including red, green, and blue). The display panel may display a color image by adjusting brightness of the light of the three primary colors. For another example, the display panel may emit light of three primary colors and white light. The display panel may display a color image by adjusting brightness of the light of the three primary colors and the white light. For yet another example, the display panel may only emit white light. The display panel may display a grayscale image by adjusting brightness of the white light. In this case, the display apparatus may further include a color filter disposed on a light exit side of the display panel to convert the white light into light of three primary colors, thereby realizing display of a color image.

For example, the display panel may be an organic light-emitting diode (OLED) display panel, a quantum dot light-emitting diode (QLED) display panel, or a tiny light-emitting diode (LED, which includes mini LED or micro LED) display panel, etc.

In some other embodiments, the light-emitting substrate may be configured to be used as a light source. For example, the display apparatus is a liquid crystal display apparatus. The liquid crystal display apparatus includes a liquid crystal display panel and a light-emitting substrate disposed on a back surface of the display panel (i.e., a surface facing away from a display surface of the display panel). The light-emitting substrate may be used as a backlight source for providing backlight for the liquid crystal display panel.

Some embodiments of the present disclosure provide a light-emitting substrate. The light-emitting substrate may be applied to the display apparatus, or may be applied to a lighting device such as a lamp. The embodiments are described by taking an example in which the light-emitting substrate is a display panel.

FIG. 1 is a top view of the light-emitting substrate. As shown in FIG. 1, the light-emitting substrate EP includes at least one sub-pixel unit (e.g., one or more sub-pixel units) P. For example, the light-emitting substrate EP has an active area PA and a peripheral area S located on at least one side of the active area AA. A plurality of sub-pixel units P are disposed in the active area AA. The plurality of sub-pixel units P may include sub-pixel units that are of different light-emitting colors. For example, the plurality of sub-pixel units P includes a sub-pixel unit P1, a sub-pixel unit P2, a sub-pixel unit P3, and a sub-pixel unit P4 that are of different light-emitting colors; the four sub-pixel units may respectively emit red light, green light, blue light, and white light. For example, the sub-pixel unit P1 may emit red light, the sub-pixel unit P2 may emit green light, the sub-pixel unit P3 may emit blue light, and the sub-pixel unit P4 may emit white light. For another example, the plurality of sub-pixel units P may include three sub-pixel units that are of different light-emitting colors; the three sub-pixel units may respectively emit red light, green light, and blue light.

Figure 2:
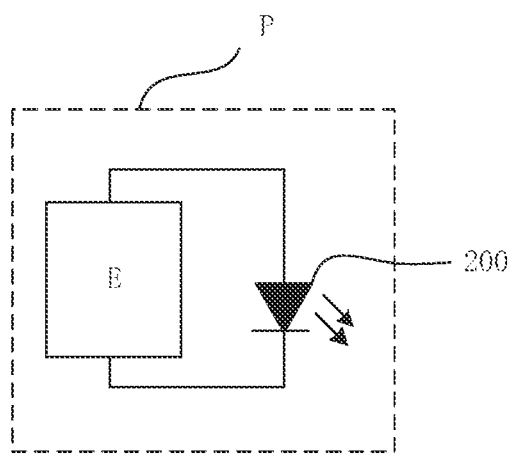
FIG. 2 is a structural diagram of a sub-pixel unit in a light-emitting substrate, in accordance with some embodiments.

FIG. 2 shows a structure of a sub-pixel unit. Referring to FIG. 2, the sub-pixel unit P includes a light-emitting device 200 and a pixel driving circuit E that provides a driving current and/or a driving voltage for the light-emitting device 200.

The light-emitting device 200 may be an electroluminescent device, such as an organic electroluminescent device (e.g., OLED), or an inorganic electroluminescent device (e.g., LED or tiny LED). Alternatively, the light-emitting device 200 may be QLED.

Figure 3:
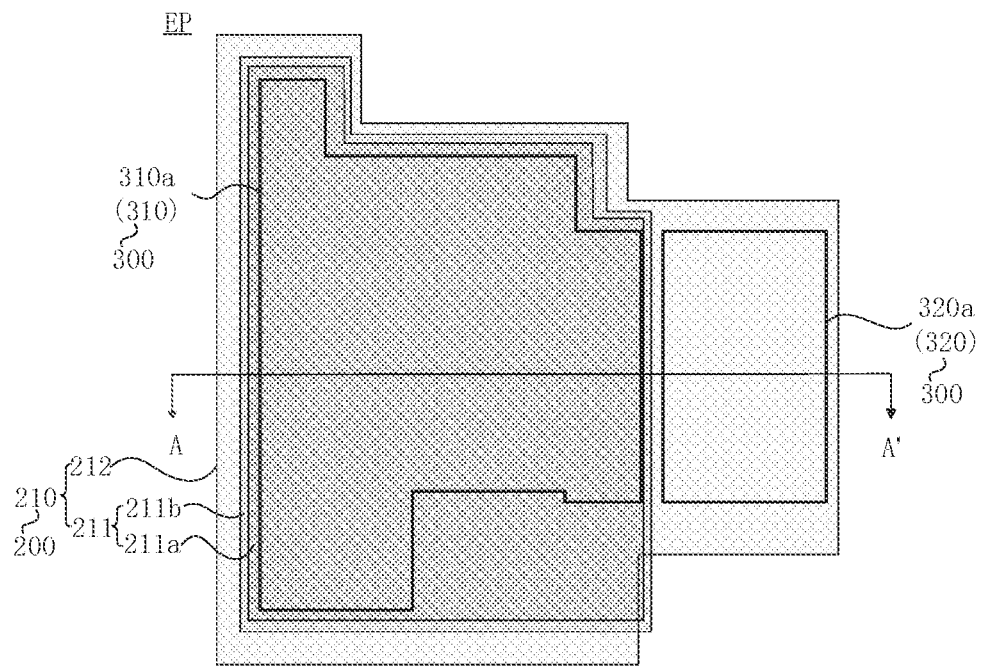
FIG. 3 is a partial top view of another light-emitting substrate, in accordance with some embodiments.
Figure 4A:
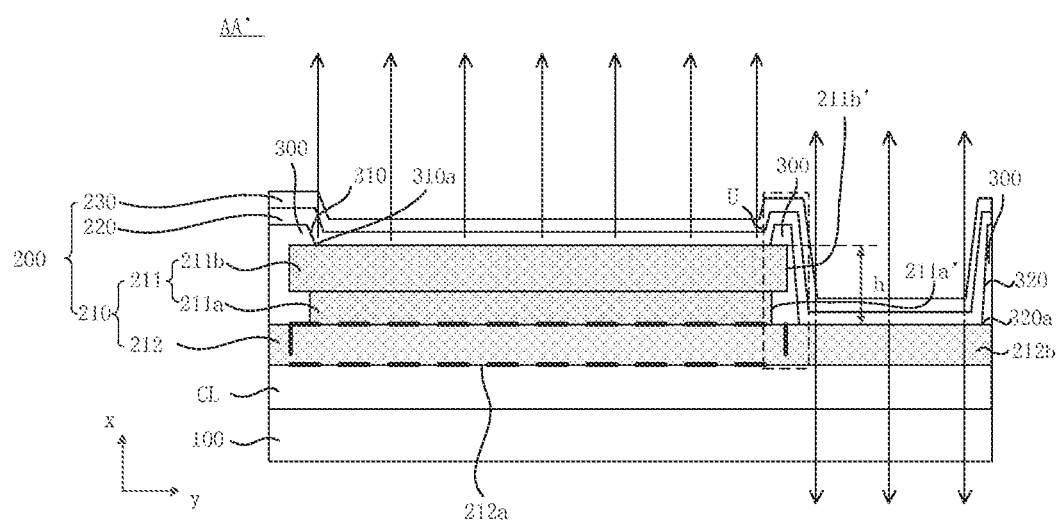
FIG. 4A is a sectional view of the light-emitting substrate in FIG. 3 taken along the line AA'.

FIG. 3 is a partial top view of the light-emitting substrate. It will be noted that FIG. 3 only shows a plurality of layers for forming the light-emitting device 200 in the light-emitting substrate EP, and omits some other layers in the light-emitting substrate EP. FIG. 4A is a sectional view of the light-emitting substrate taken along the section line AA' in FIG. 3. Referring to FIGS. 3 and 4A, the light-emitting substrate EP includes a base substrate 100, the light-emitting device 200, and a first insulating layer 300. In addition, the light-emitting substrate EP may further include a circuit layer CL located between the base substrate 100 and the light-emitting device 200. The circuit layer CL includes one or more (e.g., a plurality of) pixel driving circuits.

The base substrate 100 may be a rigid base substrate. The rigid base substrate may be a glass base substrate or a polymethyl methacrylate (PMMA) base substrate, etc. Alternatively, the base substrate may be a flexible base substrate. The flexible base substrate may be a polyethylene terephthalate (PET) base substrate, a polyethylene naphthalate two formic acid glycol ester (PEN) base substrate or a polyimide (PI) base substrate, etc.

With continued reference to FIG. 4A, the light-emitting device 200 may be disposed above the base substrate 100. The light-emitting device 200 may include a first electrode 210, a light-emitting functional layer 220 and a second electrode 230 that are sequentially stacked in a direction moving away from the base substrate 100 (i.e., the x direction in FIG. 4A). For example, the first electrode 210 is closer to the base substrate 100 than the second electrode 230, and the light-emitting functional layer 230 is located between the first electrode 210 and the second electrode 230 in a thickness direction (e.g., parallel to the x direction) of the light-emitting device 200. One of the first electrode 210 and the second electrode 230 is a cathode, and the other is an anode.

The light-emitting functional layer 230 may have a single-layer structure or a multi-layer structure. For example, the light-emitting functional layer 220 may include a light-emitting layer. The light-emitting functional layer 220 may further include at least one of a hole injection layer, a hole transport layer, and an electron blocking layer that are located between the anode and the light-emitting layer; alternatively, the light-emitting functional layer 220 may further include at least one of a hole blocking layer, an electron transport layer, and an electron injection layer that are located between the light-emitting layer and the cathode. The light-emitting layer in the light-emitting device may be a red light-emitting layer, a green light-emitting layer, a blue light-emitting layer or a white light-emitting layer.

In some embodiments, the second electrode may be a cathode. In a case where the light-emitting device 200 is a top emission light-emitting device, the second electrode 230 may be transparent or translucent, so as to allow light emitted by the light-emitting functional layer 220 to exit through the second electrode 230. A material of the second electrode 230 may be metal oxide, such as indium tin oxide (ITO), or indium zinc oxide (IZO). Alternatively, the material of the second electrode 230 may be metal, such as alloy. In this case, the first electrode 210 may be an anode.

In some other embodiments, the first electrode 210 may be a cathode, and the second electrode 230 may be an anode.

Referring to FIGS. 3 and 4A, the first electrode 210 may include a second sub-electrode 212 and a first sub-electrode 211 that are sequentially stacked in the direction moving away from the base substrate 100 (i.e., the x direction). That is, the second sub-electrode 212 is closer to the base substrate 100 than the first sub-electrode 211.

Figure 4B:
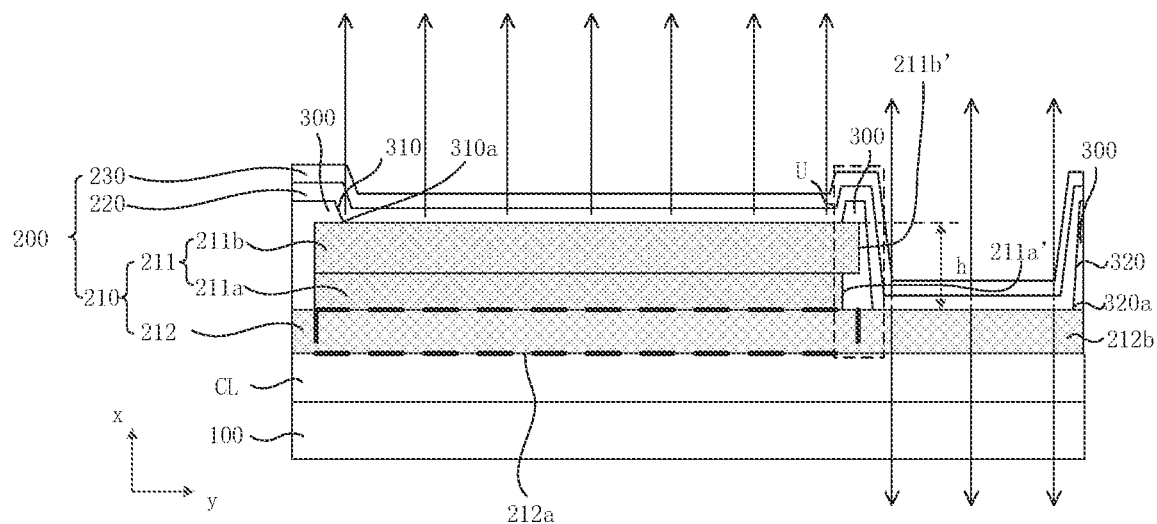
FIG. 4B is a sectional view of another light-emitting substrate, in accordance with some embodiments.

In some embodiments, the first sub-electrode 211 includes a first conductive pattern 211a and a second conductive pattern 211b that are sequentially stacked in the direction moving away from the base substrate 100 (e.g., the x direction). That is, the first conductive pattern 211a is closer to the base substrate 100 than the second conductive pattern 211b. An orthogonal projection of the first conductive pattern 211a on the base substrate 100 is within an orthogonal projection of the second conductive pattern 211b on the base substrate 100. FIG. 4B is a sectional view of another light-emitting substrate. Referring to FIGS. 4A and 4B, in a case where the orthogonal projection of the first conductive pattern 211a on the base substrate 100 is within the orthogonal projection of the second conductive pattern 211b on the base substrate 100, a positional relationship of the two orthogonal projections may be one of the following two cases.

In a first case, referring to FIG. 4A, there is an annular gap between a border of the orthogonal projection of the first conductive pattern 211a on the base substrate 100 and a border of the orthogonal projection of the second conductive pattern 211b on the base substrate 100, so that a structure that the whole edge of the first conductive pattern 211a is indented inward compared to the second conductive pattern 211b in FIG. 3 is formed. That is, the first sub-electrode 211 having a "T"-shaped section in FIG. 4A is obtained.

In a second case, referring to FIG. 4B, a portion of the border of the orthogonal projection of the first conductive pattern 211a on the base substrate 100 may coincide with a portion of the border of the orthogonal projection of the second conductive pattern 211b on the base substrate 100; another portion of the border of the orthogonal projection of the first conductive pattern 211a on the base substrate 100 may not coincide with another portion of the border of the orthogonal projection of the second conductive pattern 211b on the base substrate 100, and may be indented inward compared to the border of the orthogonal projection of the second conductive pattern 211b on the base substrate 100 in an extending direction of the patterns (e.g., parallel to the y direction). In this case, in the first conductive pattern 211a, a portion of the edge of the first conductive pattern 211a is indented inward compared to the second conductive pattern 211b in the extending direction of the patterns (e.g., parallel to the y direction).

The orthogonal projection of the first conductive pattern 211a on the base substrate 100 is within the orthogonal projection of the second conductive pattern 211b on the base substrate 100, so that an area of a lower surface (a Surface proximate to the base substrate) of the first sub-electrode 211 is less than an area of an upper surface (a surface away from the base substrate) of the first sub-electrode 211. For example, there is a gap between an edge of an orthogonal projection of the lower surface of the first sub-electrode 211 on the base substrate 100 and an edge of an orthogonal projection of the upper surface of the first sub-electrode 211 on the base substrate 100. For example, there is an annular gap between the edge of the orthogonal projection of the lower surface of the first sub-electrode 211 on the base substrate 100 and the edge of the orthogonal projection of the upper surface of the first sub-electrode 211 on the base substrate 100.

It will be noted that, herein, in a case where an orthogonal projection of a pattern (e.g., the first conductive pattern or the second conductive pattern) on the base substrate is described, a thickness of the pattern may be ignored. That is, the orthogonal projection of the pattern on the base substrate may be an orthogonal projection of an upper surface of the pattern (i.e., a surface of the pattern away from the base substrate) on the base substrate, or may be an orthogonal projection of a lower surface of the pattern (i.e., a surface of the pattern proximate to the base substrate) on the base substrate. For example, the orthogonal projection of the pattern on the base substrate may be an orthogonal projection of a surface with a larger area in the upper surface and the lower surface of the pattern on the base substrate.

In some possible implementations, the first conductive pattern 211a may be a light-reflecting pattern, so that the first sub-electrode 211 may reflect light. A material of the first conductive pattern 211a may be metal, such as aluminum (Al). For example, in a case where the light-emitting device 200 is the top emission light-emitting device, a portion of light emitted by the light-emitting functional layer 220 included in the light-emitting device 200 directly exits from the second electrode 230. Light emitted by the light-emitting functional layer 220 in a direction toward the first electrode 210 may be reflected by the first conductive pattern 211a, so that the light may also exit from the second electrode 230, which improves light exit amount.

In some possible implementations, in an example in which the light-emitting substrate EP is an OLED display panel or a QLED display panel, a material of the second conductive pattern 211b of the first electrode 210 of the light-emitting substrate EP may include a material with a high work function. The material of the second conductive pattern 211b may be metal oxide, such as indium tin oxide (ITO), or indium zinc oxide (IZO). In this case, the second conductive pattern 211b in the first electrode 210 of the light-emitting device 200 may be configured to contact the light-emitting functional layer 220 and inject holes into the light-emitting functional layer 220. Since the material of the second conductive pattern 211b includes the material with the high work function, it is easy for the first electrode 210 to inject holes into the light-emitting functional layer 220.

In some other embodiments, the first sub-electrode may only include one conductive pattern, and an orthogonal projection of a lower surface of the conductive pattern on the base substrate is within an orthogonal projection of an upper surface of the conductive pattern on the base substrate. In this case, a section of the first sub-electrode in a direction parallel to a thickness direction of the base substrate may be in a shape of an inverted trapezoid, or a shape similar to the inverted trapezoid. The shape similar to the inverted trapezoid refers to a shape obtained by replacing an oblique edge of the inverted trapezoid with other line (such as a concave arc edge).

Figure 5:
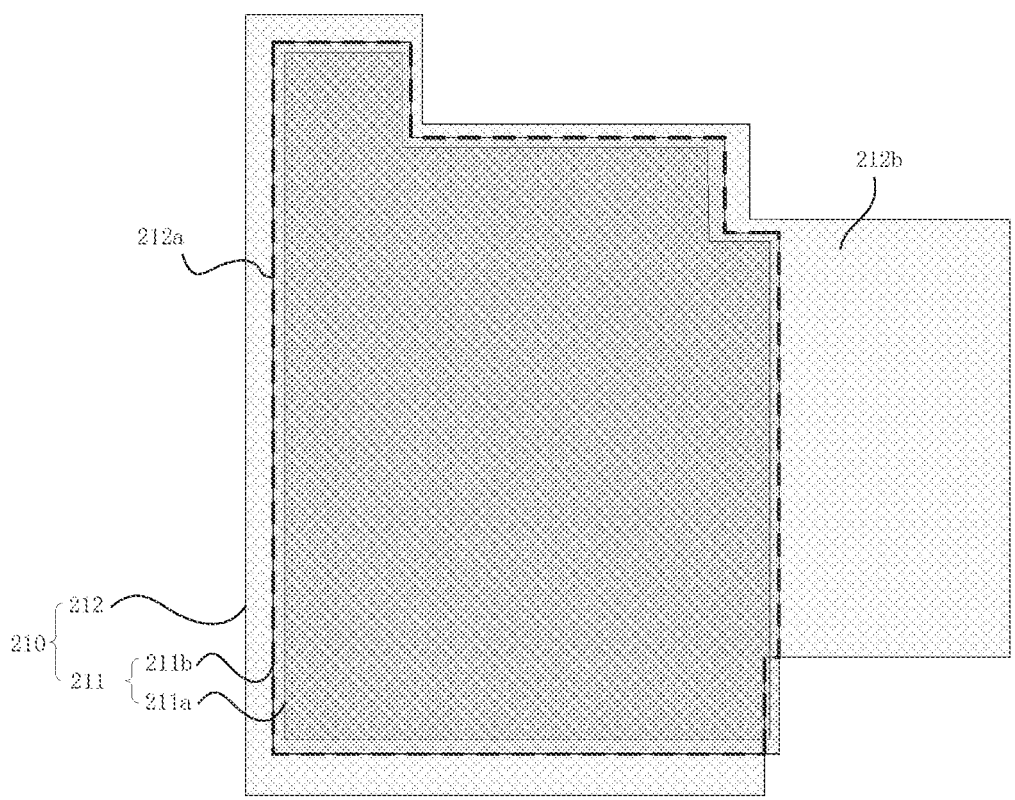
FIG. 5 is a structural diagram of a first sub-electrode and a second sub-electrode in a light-emitting substrate, in accordance with some embodiments.

Referring to FIG. 5, the second sub-electrode 212 includes a first portion 212a and a second portion 212b except for the first portion. The first portion 212a is covered by the first sub-electrode 211. That is, a portion of the second sub-electrode 212 that overlaps with an orthogonal projection of the first sub-electrode 211 on the second sub-electrode 212 is referred to as the first portion 212a of the second sub-electrode. The orthogonal projection of the first sub-electrode 211 on the second sub-electrode 212 is a figure enclosed by an orthogonal projection of an outer contour of the first sub-electrode 211 on the second sub-electrode 212. For example, it may be an orthogonal projection of the lower surface of the second conductive pattern 211b in FIG. 4A on the second sub-electrode 212. Since the first portion 212a of the second sub-electrode 212 is covered by the first sub-electrode 211, and the second portion 212b of the second sub-electrode 212 is not covered by the first sub-electrode 211, the first electrode 210 has a stepped structure at a boundary between the first portion 212a and the second portion 212b. For example, referring to FIGS. 4A and 4B, in the region U, there is a height difference h between a portion of the edge of the first sub-electrode 211 located on the second sub-electrode 212 and the second sub-electrode 212, where the stepped structure may be formed.

In some embodiments, referring to FIG. 4A, the second sub-electrode 212 may be a transparent conductive electrode, and a material of the second sub-electrode 212 may be metal oxide, such as indium tin oxide (ITO), or indium zinc oxide (IZO). In this way, the second portion 212b (i.e., a portion that is not covered by the first sub-electrode 211) of the second sub-electrode 212 may transmit light. In this case, the first electrode 210 may have various functions. For example, a portion corresponding to the first sub-electrode 211 in the first electrode 210 may reflect light to achieve normal light emission of the top emission light-emitting device, and a portion corresponding to the second portion 212b of the second sub-electrode 212 in the first electrode 210 may transmit light to achieve other functions by using this light transmittance. For example, the light emitted by the light-emitting functional layer 220 may exit upward or downward. A portion of the light emitted downward by the light-emitting functional layer 220 may exit downward through the second portion 212b of the second sub-electrode 212, and a light-emitting condition of the light-emitting device may be detected by using the portion of light. For example, a light-detecting device may be provided on a side of the first electrode 210 away from the light-emitting functional layer 220 and in a region opposite to the second portion 212b of the second sub-electrode 212, so that the light transmitted from the second portion may be incident onto the light-detecting device, so as to achieve the detection of the light-emitting condition of the light-emitting device by the light-detecting device.

Figure 6:
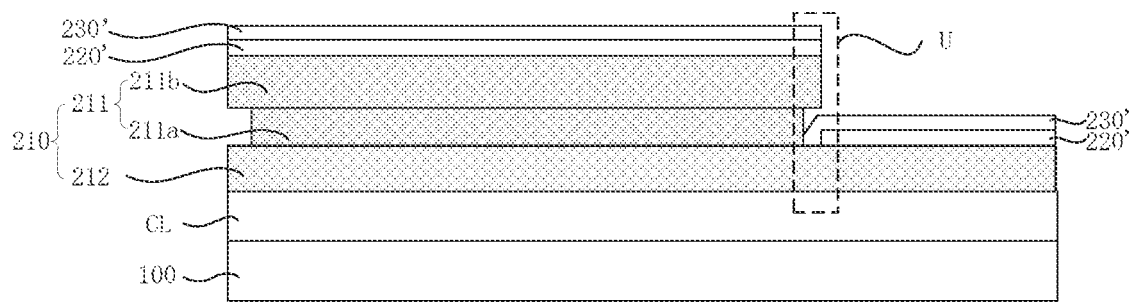
FIG. 6 is a sectional view of a light-emitting substrate.

Referring to FIG. 6, in a case where the first electrode 210 has such the stepped structure, if a light-emitting functional layer 220' is directly formed thereon, for example, if the light-emitting functional layer 220' is directly formed on the first electrode 210 by evaporation, the light-emitting functional layer 220' may be disconnected at a position where the stepped structure of the first electrode 210 is located; that is, the light-emitting functional layer 220' is discontinuous in the region U. Further, as the region U shown in the FIG. 6, in a case where the edge of the first conductive pattern 211a is indented inward compared to the second conductive pattern 211b, the light-emitting functional layer 220' is more prone to be disconnected at the position where the step structure of the first electrode 210 is located, so that a portion of a surface of the first electrode 210 (referred to as an exposed surface of the first electrode 210 hereinafter) is not covered by the light-emitting functional layer 220'. In subsequent steps, when a second electrode 230' is formed on a base substrate with the light-emitting functional layer 220', the second electrode 230' may be in contact with the exposed surface of the first electrode 210 in the region U, so that there is a short circuit between the second electrode 230' and the first electrode 210. As a result, the light-emitting device can not emit light normally.

Based on this, the light-emitting substrate provided by embodiments of the present disclosure may further include a first insulating layer.

With continued reference to FIGS. 3 and 4A, the first insulating layer 300 may be disposed above the base substrate 100. In some embodiments, the first insulating layer 300 may be disposed on a side of the first electrode 210 of the light-emitting device 200 away from the base substrate 100 and a side of the light-emitting functional layer 220 of the light-emitting device 200 proximate to the base substrate 100. That is, in the thickness direction of the light-emitting substrate EP (e.g., parallel to the x direction), the first insulating layer 300 may be located between the first electrode 210 and the light-emitting functional layer 220.

In some embodiments, the first insulating layer 300 may be a pixel defining layer.

In some embodiments, as shown in FIGS. 3, 4A and 4B, the first insulating layer 300 may have a plurality of openings (e.g., at least one first opening 310 and at least one second opening 320). Each opening is located in a sub-pixel unit P. At least a portion of the light-emitting functional layer 220 of the light-emitting device is disposed in an opening, and in contact with the first electrode 210, so as to receive carriers provided by the first electrode 210.

A first opening 310 and a second opening 320 may correspond to a same light-emitting device 200. That is, a first opening 310 and a second opening 320 may be disposed on a first electrode 210 of a light-emitting device 200. On this basis, a portion of the light-emitting functional layer 220 of the light-emitting device 200 is disposed in the first opening 310, and another portion is disposed in the second opening 320, so that the two portions of the light-emitting functional layer 220 respectively located in the first opening 310 and the second opening 320 may emit light simultaneously under driving of a same first electrode 210. Therefore, the two portions belong to the same light-emitting device 200. In the light-emitting device 200, light-emitting colors of the two portions of the light-emitting functional layer 220 respectively located in the first opening 310 and the second opening 320 are the same.

FIG. 3 shows an orthogonal projection of a lower edge 310a of the first opening 310 on the base substrate and an orthogonal projection of a lower edge 320a of the second opening 320 on the base substrate.

A lower edge of an opening may be an edge of the opening proximate to the base substrate, and correspondingly, an upper edge of an opening may be an edge of the opening away from the base substrate. Referring to FIG. 4A, for example, the lower edge 310a of the first opening 310 may be an edge of the first opening 310 proximate to the base substrate 100, and the lower edge 320a of the second opening 320 may be an edge of the second opening 320 proximate to the base substrate 100.

As shown in FIGS. 4A and 4B, the orthogonal projection of the lower edge 310a of the first opening 310 on the base substrate 100 is within the orthogonal projection of the first sub-electrode 211 on the base substrate 100. In this case, there is an annular gap between a border of the orthogonal projection of the lower edge 310a of the first opening 310 on the base substrate 100 and a border of the orthogonal projection of the first sub-electrode 211 on the base substrate 100. The orthogonal projection of the first sub-electrode 211 on the base substrate 100 may be a figure enclosed by an orthogonal projection of the outer contour of the first sub-electrode 211 on the base substrate 100.

The orthogonal projection of the lower edge 320a of the second opening 320 on the base substrate is within an orthogonal projection of the second portion 212b of the second sub-electrode 212 on the base substrate. In this case, there is an annular gap between a border of the orthogonal projection of the lower edge 320a of the second opening 320 on the base substrate 100 and a border of the orthogonal projection of the second portion of the second sub-electrode 212 on the base substrate 100.

The first opening 310 and the second opening 320 have the above feature, so that the portion of the light-emitting functional layer 220 of the light-emitting device 200 located in the first opening 310 may be in contact with the first sub-electrode 211 in the first electrode 210, and the portion of the light-emitting functional layer 220 located in the second opening 320 may be in contact with the second portion 212b of the second sub-electrode 212.

In some embodiments, an area of the first opening 310 is larger than an area of the second opening 320. In this way, as for a light-emitting device 200, compared with the portion of the light-emitting functional layer 220 located in the second opening 320, the portion of the light-emitting functional layer 220 located in the first opening 310 (i.e., the portion that is in contact with the first sub-electrode 211 in the first electrode 210) has a larger area. In some possible implementations, the first sub-electrode 211 has a light-reflecting function, and the portion of the light-emitting functional layer 220 that is in contact with the first sub-electrode 211 has the large area, so that more of the light emitted by the light-emitting functional layer 220 may be reflected. As a result, more light exits from the second electrode 230 of the light-emitting substrate, and the light exit amount is increased.

In addition, since the first opening 310 and the second opening 320 have the above feature, as shown in FIGS. 4A and 4B, a portion of a side face of the first sub-electrode 211 (for example, which are constituted by a side face 211a' of the first conductive pattern 211a and a side face 211b' of the second conductive pattern 211b) located on the second sub-electrode 212 is covered by the first insulating layer 300. As described above, since the first electrode 210 includes the first sub-electrode 211 and the second sub-electrode 212, the first electrode 210 has the stepped structure. In the light-emitting substrate provided by the embodiments of the present disclosure, the portion of the side face of the first sub-electrode 211 located on the second sub-electrode 212 (i.e., the stepped structure) may be covered by the first insulating layer 300. The light-emitting functional layer 220 and the second electrode 230 are formed on the first insulating layer 300. In this way, since the orthogonal projection of the upper edge of the opening formed according to a conventional process on the base substrate is outside the orthogonal projection of the lower edge of the opening on the base substrate, sidewalls of the openings (including the first opening 310 and the second opening 320) are inclined as shown in FIG. 4A. In this way, the light-emitting functional layer 220 formed on the first insulating layer 300 is not easy to disconnect, and the second electrode 230 is not easy to directly contact the first electrode 210, so that a problem that there is a short circuit between the first electrode 210 and the second electrode 230 due to the stepped structure of the first electrode 210 may be solved. Of course, it will be understood that, even if the light-emitting functional layer 220 is disconnected on the first insulating layer 300, since the side face of the first sub-electrode 211 is covered by the first insulating layer 300, the second electrode 230 is not in contact with the first electrode 210, and thus there is no short circuit.

In some embodiments, sheet resistance of the second electrode 230 in the light-emitting device 200 may be relatively large. In an example in which the light-emitting substrate is the top emission OLED display panel, the second electrode 230 may be a transparent cathode, and a material thereof may be metal oxide, such as indium tin oxide (ITO), or indium zinc oxide (IZO). In a case where the light-emitting substrate EP includes a plurality of light-emitting devices 200, cathodes of the light-emitting devices 200 may be in contact with one another to form a whole electrode layer. However, resistance of the transparent cathode electrode layer is relatively large due to properties of the material itself, and there is a problem of voltage drop (IR drop) on a large-sized OLED display panel, which affects light-emitting effect and/or display effect of the OLED display panel.

In order to solve the problem, the light-emitting substrate provided by embodiments of the present disclosure may further include at least one auxiliary electrode line.

Figure 7:
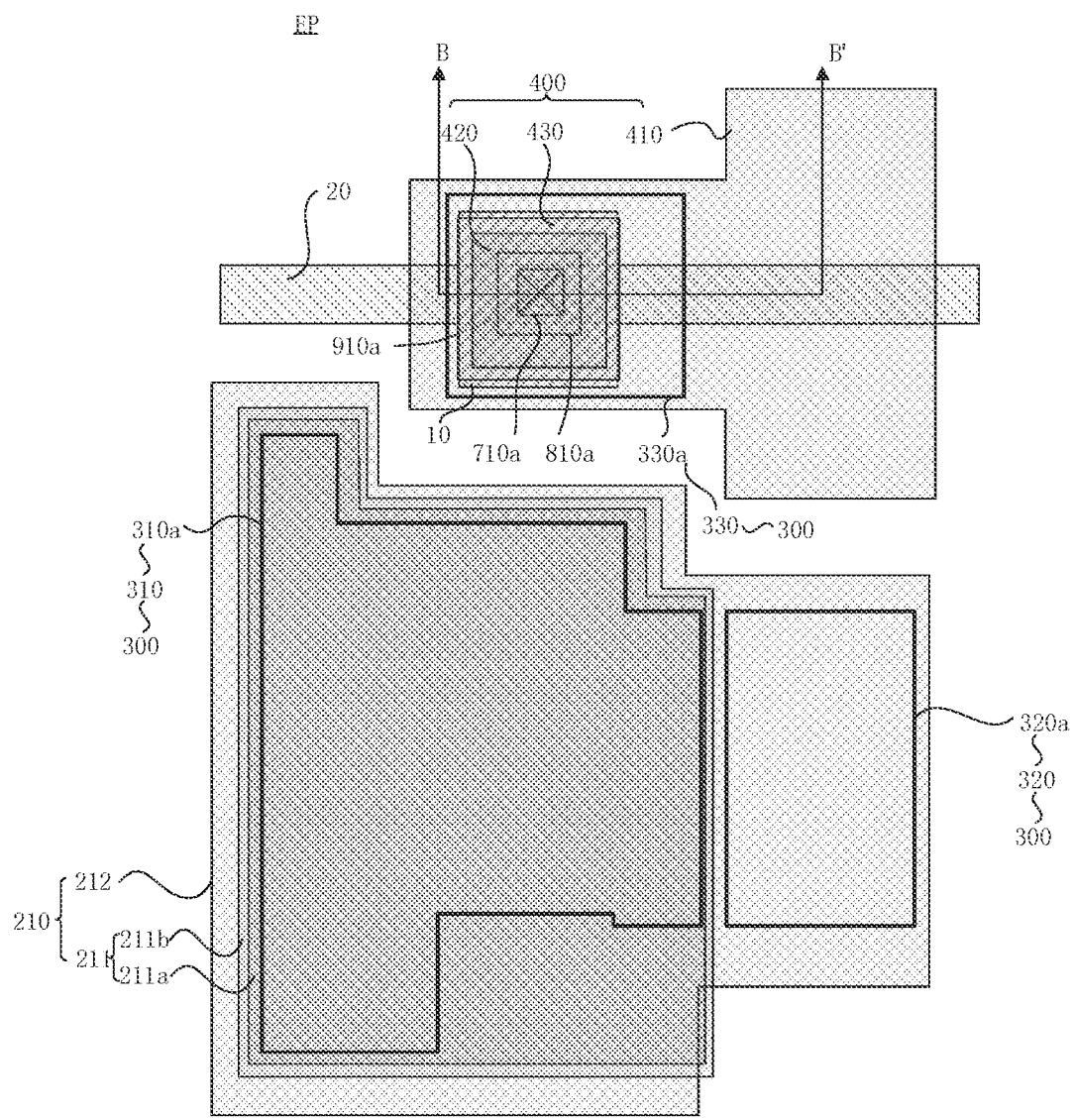
FIG. 7 is a partial top view of another light-emitting substrate, in accordance with some embodiments.
Figure 8A:
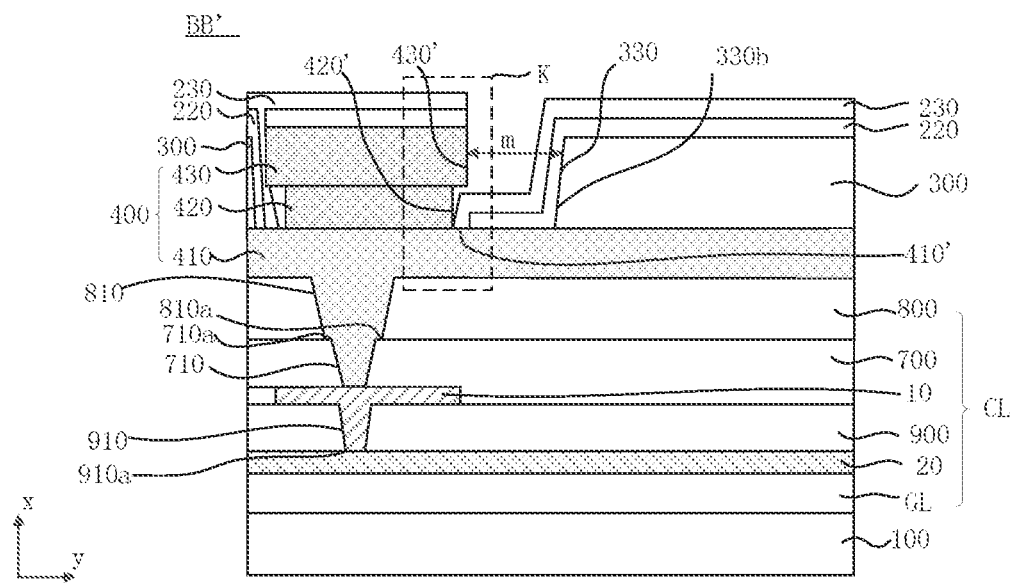
FIG. 8A is a sectional view of the light-emitting substrate in FIG. 7 taken along the line BB'.

FIG. 7 is a partial top view of a light-emitting substrate, and FIG. 8A is a sectional view of the light-emitting substrate taken along the section line BB' in FIG. 7. Referring to FIG. 8A, an auxiliary electrode line 20 may be disposed on a side of the second electrode 230 of the light-emitting device proximate to the base substrate 100. The auxiliary electrode line 20 may be coupled to the second electrode 230 of the light-emitting device. For example, each auxiliary electrode line is coupled to second electrodes of at least two light-emitting devices (e.g., an electrode layer forming the second electrodes of the light-emitting devices). In this case, at least a portion of the auxiliary electrode line is connected in parallel with the electrode layer. Compared with a second electrode that is not coupled to the auxiliary electrode line, sheet resistance of the second electrode coupled to the auxiliary electrode line may be reduced, so as to obtain better light-emitting effect and/or display effect.

A manner in which the auxiliary electrode line is coupled to the second electrode of the light-emitting device will be described below.

FIG. 7 is a partial top view of the light-emitting substrate, and FIG. 8A is a sectional view of the light-emitting substrate taken along the section line BB' in FIG. 7. Referring to FIG. 7 and FIG. 8A, the light-emitting substrate EP provided by embodiments of the present disclosure may further include a first connection portion 400.

The first connection portion 400 may be disposed above the base substrate 100. For example, the first connection portion 400 may be disposed on a side of the auxiliary electrode line 20 away from the base substrate 100 and a side of the second electrode 230 in the light-emitting device proximate to the base substrate 100. For example, in the thickness direction of the light-emitting substrate EP (e.g., parallel to the x direction), the first connection portion 400 may be disposed between the second electrode 230 and the auxiliary electrode line 20.

A relative position of the light-emitting device and the first connection portion 400 may be as shown in FIG. 7 (a position of the light-emitting device may be the same as a position of the first electrode 210 in the light-emitting device). In the light-emitting substrate EP, second electrodes 230 of a plurality of light-emitting devices may be disposed in a same layer. For example, in a manufacturing process of the light-emitting substrate ER, the second electrodes 230 of the plurality of light-emitting devices may be formed as a whole layer through a sputtering process. In this case, the second electrode 230 of the light-emitting device may extend to a position where the first connection portion 400 is located. In this case, the first connection portion 400 may be coupled to the second electrode 230 and the auxiliary electrode line 20, so that the second electrode 230 and the auxiliary electrode line 20 are coupled by the first connection portion 400.

A manner in which the first connection portion 400 is coupled to the second electrode 230 will be described below.

As shown in FIGS. 7 and 8A, the first connection portion 400 includes a first connection pattern 410, a second connection pattern 420, and a third connection pattern 430 that are sequentially stacked in a direction moving away from the base substrate 100 (e.g., the x direction). For example, among the first connection pattern 410, the second connection pattern 420, and the third connection pattern 430, the first connection pattern 410 is closest to the base substrate 100, the third connection pattern 430 is farthest away from the base substrate 100, the second connection pattern 420 is located between the first connection pattern 410 and the third connection pattern 430 in the thickness direction of the light-emitting substrate ER (e.g., parallel to the x direction).

Figure 8B:
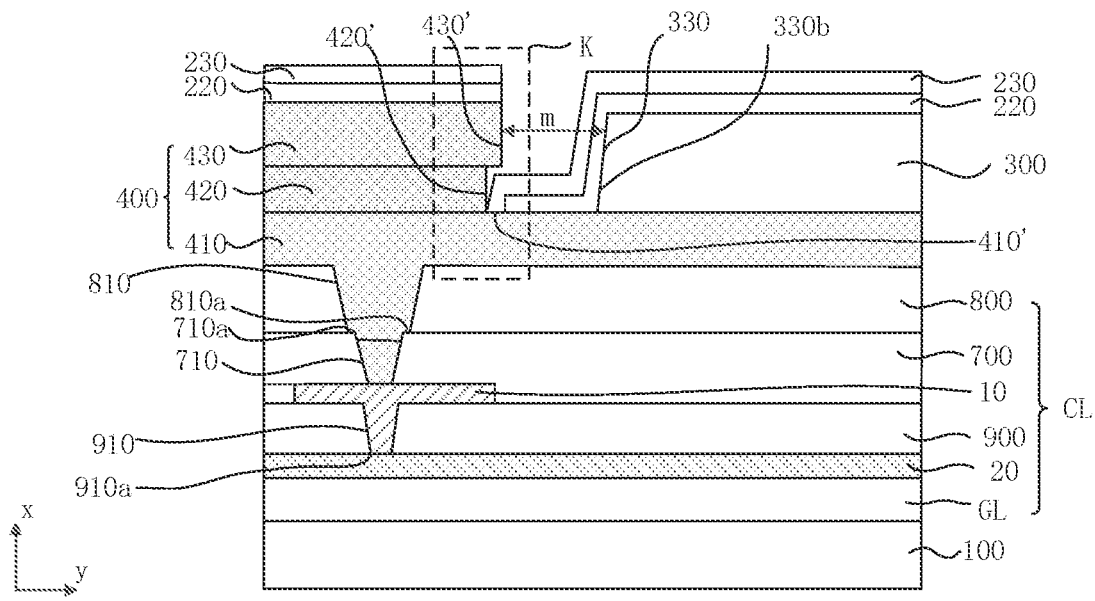
FIG. 8B is a sectional view of another light-emitting substrate, in accordance with some embodiments.

An orthogonal projection of the second connection pattern 420 on the base substrate 100 is within an orthogonal projection of the third connection pattern 430 on the base substrate 100. FIG. 8B is a sectional view of another light-emitting substrate. Referring to FIGS. 8A and 8B, in this case, a positional relationship of the two orthogonal projections may be one of the following two cases.

In a first case, referring to FIG. 8A, there is an annular gap between a border of the orthogonal projection of the second connection pattern 420 on the base substrate 100 and a border of the orthogonal projection of the third connection pattern 430 on the base substrate 100, so that a structure that a whole edge of the second connection pattern 420 is indented inward compared to the third connection pattern 430 in FIG. 7 is formed. In this case, in the first connection portion 400, in an extending direction of the patterns (e.g., parallel to the y direction), the whole edge of the second connection pattern 420 may be indented inward compared to edge of the third connection pattern 430. That is, the whole edge of the third connection pattern 430 may protrude from the second connection pattern 420.

In a second case, referring to FIG. 8B, a portion of the border of the orthogonal projection of the second connection pattern 420 on the base substrate 100 coincide with a portion of the edge of the orthogonal projection of the third connection pattern 430 on the base substrate 100. Another portion of the border of the orthogonal projection of the second connection pattern 420 on the base substrate 100 is indented inward compared to another portion of the border of the orthogonal projection of the third connection pattern 430 on the base substrate 100. In this case, in the first connection portion 400, a portion of the edge of the second connection pattern 420 may be indented inward compared to the edge of the third connection pattern 430 in the extending direction of the patterns (e.g., parallel to the y direction). That is, a portion of the edge of the third connection pattern 430 may protrude from the second connection pattern 420.

The orthogonal projection of the second connection pattern 420 on the base substrate 100 may be within an orthogonal projection of the first connection pattern 410 on the base substrate 100. In this case, the positional relationship of the two orthogonal projections may be one of the following two cases.

In a first case, referring to FIG. 8A, there is an annular gap between a border of the orthogonal projection of the second connection pattern 420 on the base substrate 100 and a border of the orthogonal projection of the first connection pattern 410 on the base substrate 100, so that a structure that the whole edge of the second connection pattern 420 is indented inward compared to the first connection pattern 410 in FIG. 7 is formed. In this case, in the first connection portion 400, the whole edge of the second connection pattern 420 may be indented inward compared to an edge of the first connection pattern 410 in the extending direction of the patterns (e.g., parallel to the y direction). That is, the whole edge of the first connection pattern 410 may protrude from the second connection pattern 420. As described above, the whole edge of the third connection pattern 430 may protrude from the second connection pattern 420, and in this case, the first connection portion 400 having an "I"-shaped section in FIG. 8A is formed.

In a second case, referring to FIG. 8B, a portion of the border of the orthogonal projection of the second connection pattern 420 on the base substrate 100 may coincide with a portion of the border of the orthogonal projection of the first connection pattern 410 on the base substrate 100; another portion of the border of the orthogonal projection of the second connection pattern 420 on the base substrate 100 is indented inward compared to the border of the orthogonal projection of the first connection pattern 410 on the base substrate 100. In this case, in the first connection portion 400, a portion of the edge of the second connection pattern 420 may be indented inward compared to the edge of the first connection pattern 410 in the extending direction of the patterns (e.g., parallel to the y direction). That is, a portion of the edge of the first connection pattern 410 may protrude from the second connection pattern 420.

On this basis, as shown in FIGS. 7, 8A and 8B, the first insulating layer 300 may further include a third opening 330.

The third opening 330 may expose at least a portion of the first connection pattern 410, at least a portion of the second connection pattern 420, and at least a portion of the third connection pattern 430. For example, FIG. 7 shows a positional relationship between an orthogonal projection of a lower edge 330a of the third opening 330 on the base substrate 100 and each of the orthogonal projection of the first connection pattern 410 of the first connection portion 400 on the base substrate 100, the orthogonal projection of the second connection pattern 420 on the base substrate 100 and the orthogonal projection of the third connection pattern 430 on the base substrate 100. The orthogonal projection of the second connection pattern 420 on the base substrate 100 and the orthogonal projection of the third connection pattern 430 on the base substrate 100 may be within the orthogonal projection of the orthogonal projection of the lower edge 330a of the third opening 330 on the base substrate 100. In this case, there may be an annular gap between the border of the orthogonal projection of the second connection pattern 420 on the base substrate 100 and a border of the orthogonal projection of the lower edge 330a of the third opening 330 on the base substrate 100, and there may be an annular gap between the border of the orthogonal projection of the third connection pattern 430 on the base substrate 100 and the border of the orthogonal projection of the lower edge 330a of the third opening 330 on the base substrate 100. In this case, as shown in FIGS. 8A and 8B, there is a gap m between a sidewall 330b of the third opening 330 and a side face 430' of the third connection pattern 430 of the first connection portion 400, so that the third opening 330 exposes the side face 430' of the third connection pattern 430, and further exposes a side face 420' of the second connection pattern 420. The third opening 330 further exposes a portion 410' of an upper surface of the first connection pattern 410.

The first insulating layer 300 has the third opening 330. Therefore, when the light-emitting functional layer 220 is formed (e.g., by an evaporation method) on the base substrate 100 with the first insulating layer 300 after the first insulating layer 300 is formed, as shown in FIGS. 8A and 8B, the light-emitting functional layer 220 may further extend into the third opening 330.

As described above, in the first connection portion 400, the edge of the third connection pattern 430 protrudes from the second connection pattern 420 in the extending direction of the patterns (e.g., parallel to the y direction). In this case, when the light-emitting functional layer 220 is formed (e.g., by an evaporation process) thereon, a portion of the light-emitting functional layer 220 located in the third opening 330 may be disconnected. That is, the portion of the light-emitting functional layer 220 located in the third opening 330 may be discontinuous. For example, as shown in FIGS. 8A and 8B, the light-emitting functional layer 220 may be disconnected in a region K, so that at least a portion of the first connection portion 400 (e.g., the side face 430' of the third connection pattern 430 and the side face 420' of the second connection pattern 420) is not covered by the light-emitting functional layer 220. In this way, when the second electrode 230 is subsequently formed, for example, when the second electrode 230 is formed by a sputtering process, the second electrode 230 may extend into the third opening 330. Moreover, a portion of the second electrode 230 located in the third opening 330 may be in contact with at least one of the first connection pattern 410, the second connection pattern 420 and the third connection pattern 430 of the first connection portion 400. For example, the second electrode 230 may be in contact with the side face 420' of the second connection pattern 420, and the second electrode 230 may further be in contact with the side face 430' of the third connection pattern 430. In this way, it is possible to achieve that the second electrode 230 is coupled to the first connection portion 400.

Further, as described above, the first connection portion 400 may have the "I"-shaped section. For example, as shown in FIGS. 8A and 8B, in the region K, in the first connection portion 400, the second connection pattern 420 is indented inward in the extending direction of the patterns (e.g., parallel to the y direction) compared to the first connection pattern 410 and the third connection pattern 430, so as to form the first connection portion 400 having the "I"-shaped section. The upper surface of the first connection pattern 410 includes a portion 410' that protrudes from the second connection pattern 420 and is covered by the third connection pattern 430, so that the portion 410' of the upper surface of the first connection pattern 410 may not be covered by the light-emitting functional layer 220 when the light-emitting functional layer 220 is formed, and in turn the portion of the second electrode 230 located in the third opening 330 may at least contact the portion 410' of the upper surface of the first connection pattern 410. In this way, compared to a situation where the second electrode 230 only contact the sidewall 420' of the second connection pattern 420 and/or the sidewall 430' of the third connection pattern 430, a contact area between the second electrode 230 and the first connection portion 400 may be increased, which may improve a yield of a product.

Figure 9A:
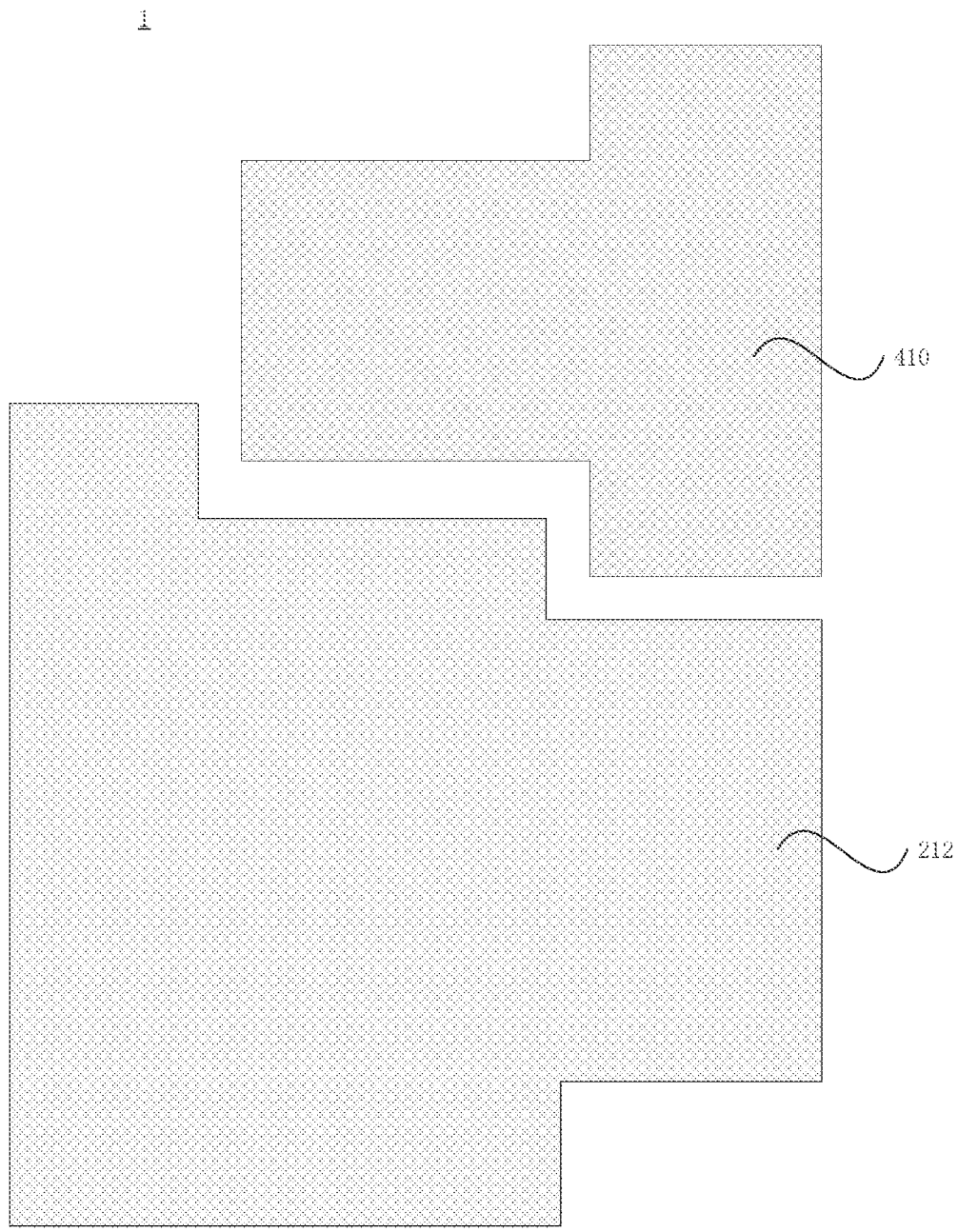
FIG. 9A is a partial top view of a first pattern layer in a light-emitting substrate, in accordance with some embodiments.
Figure 9B:
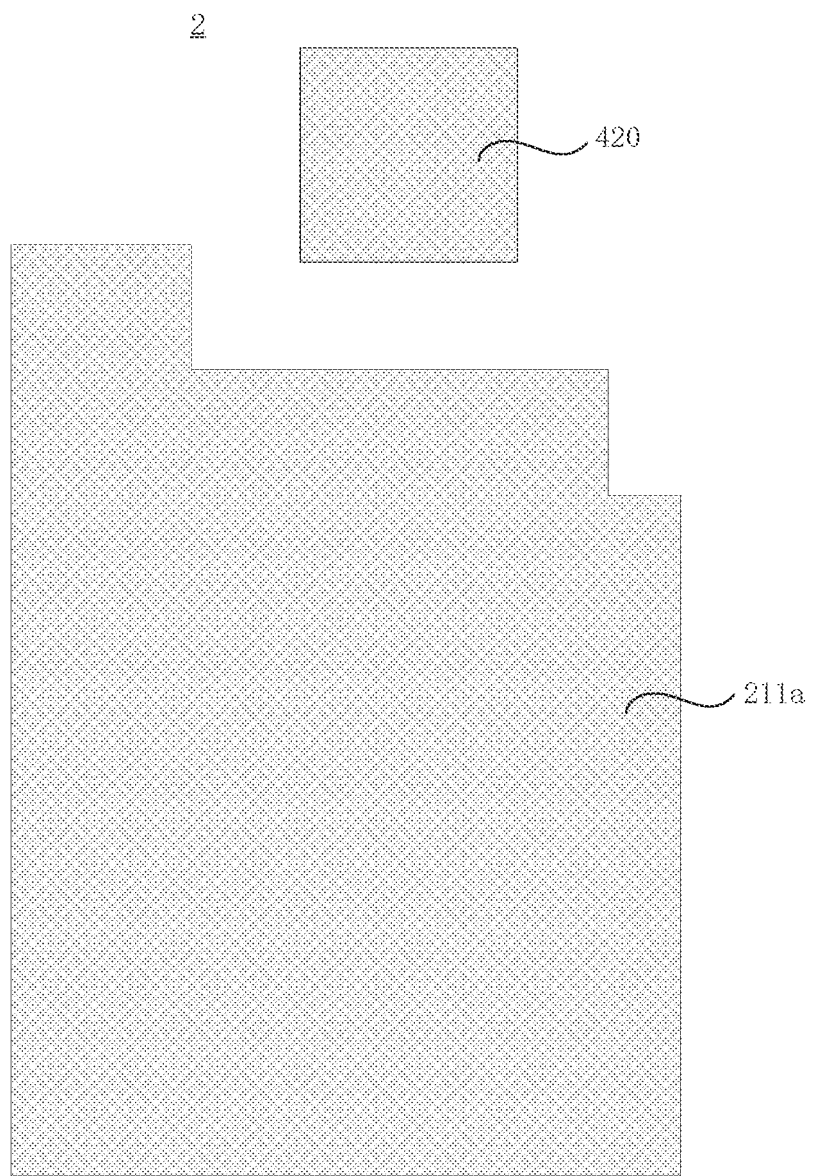
FIG. 9B is a partial top view of a second pattern layer in a light-emitting substrate, in accordance with some embodiments.
Figure 9C:
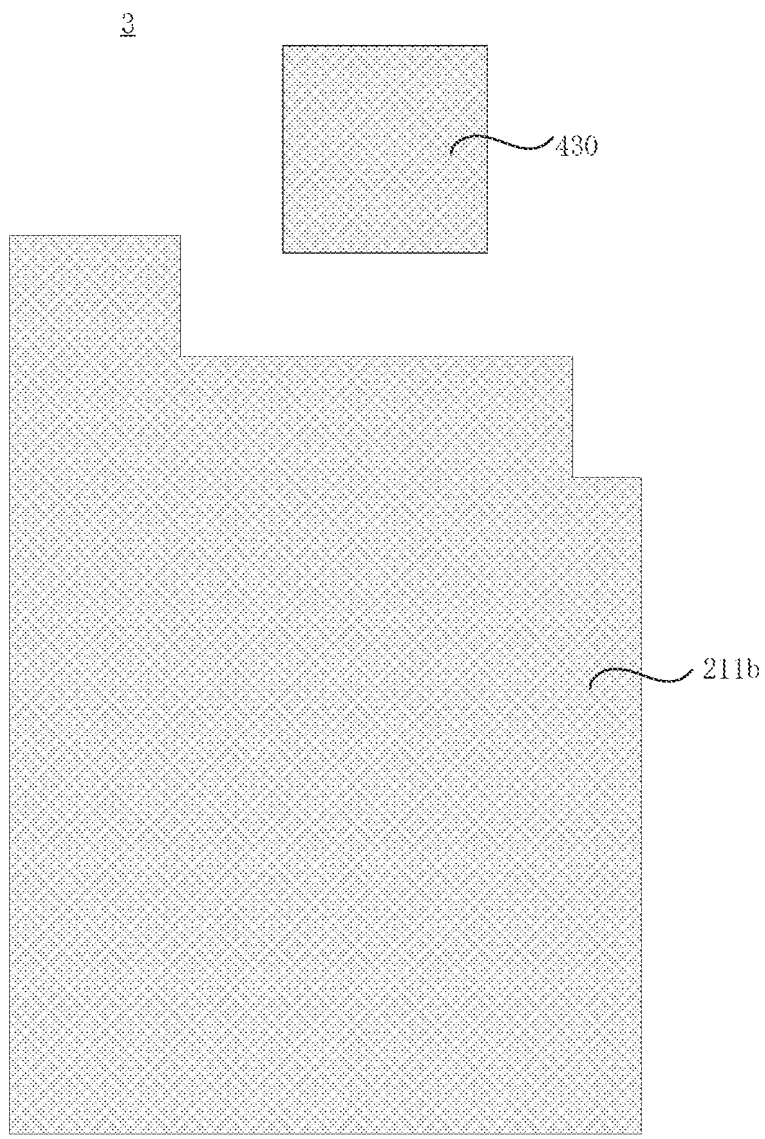
FIG. 9C is a partial top view of a third pattern layer in a light-emitting substrate, in accordance with some embodiments.

In some embodiments, layers of the first connection portion 400 and layers of the first electrode 210 may be disposed in a same layer, respectively. FIG. 9A is a partial top view of a first pattern layer in the light-emitting substrate. FIG. 9B is a partial top view of a second pattern layer in the light-emitting substrate. FIG. 9C is a partial top view of a third pattern layer in the light-emitting substrate. Referring to FIG. 9A, the first pattern layer 1 includes the first connection pattern 410 of the first connection portion and the second sub-electrode 212 of the light-emitting device. That is, the first connection pattern 410 of the first connection portion and the second sub-electrode 212 of the light-emitting device are disposed in a same layer. Referring to FIG. 9B, the second pattern layer 2 includes the second connection pattern 420 of the first connection portion and the first conductive pattern 211a in the first sub-electrode of the light-emitting device. That is, the second connection pattern 420 of the first connection portion and the first conductive pattern 211a in the first sub-electrode of the light-emitting device are disposed in a same layer. Referring to FIG. 9C, the third pattern layer 3 includes the third connection pattern 430 of the first connection portion and the second conductive pattern 211b in the first sub-electrode of the light-emitting device. That is, the third connection pattern 430 of the first connection portion and the second conductive pattern 211b in the first sub-electrode of the light-emitting device are disposed in a same layer.

Each of the pattern layers refers to a layer structure obtained by patterning a film (i.e., a patterning process). In some embodiments, a method for forming the first pattern layer 1, the second pattern layer 2 and the third pattern layer 3 may be as follows. The first pattern layer 1 is formed on the base substrate. A conductive film covering the first pattern layer 1 is formed on the base substrate on which the first pattern layer 1 is formed. The conductive film may be, for example, an aluminum (Al) film. The third pattern layer 3 is formed on the base substrate on which the conductive film is formed, and then the conductive film is etched by using the third pattern layer 3 as a mask, so as to pattern the conductive film to form the second pattern layer 2. Materials of the first pattern layer 1 and the third pattern layer 3 may be a transparent conductive material, such as ITO, or IZO. In this way, the first pattern layer 1 and/or the third pattern layer 3 may be etched by using an etching solution, and the second pattern layer 2 may be etched by using another different etching solution. In this way, when the second pattern layer 2 is etched, the first pattern layer 1 and the third pattern layer 3 will not be etched.

The third connection pattern 430 is used as a mask to form the second connection pattern 420 in the above forming method, so that the orthogonal projection of the second connection pattern 420 on the base substrate may be within the orthogonal projection of the third connection pattern 430 on the base substrate, and in turn the second electrode may be coupled to the first connection portion.

Correspondingly, since the second pattern layer 2 further includes the first conductive pattern 211a of the first sub-electrode, and the third pattern layer 3 further includes the second conductive pattern 211b of the first sub-electrode, the second conductive pattern 211b is used as a mask to form the first conductive pattern 211a in the above forming method, and correspondingly, the orthogonal projection of the first conductive pattern 211a on the base substrate is within the orthogonal projection of the second conductive pattern 211b on the base substrate. That is, the second conductive pattern 211b protrudes from the first conductive pattern 211a in the extending direction of the patterns. In a case where the first electrode has such a structure, there is a need to cover the portion of the edge of the first sub-electrode located above the second sub-electrode with the first insulating layer as described above. Otherwise, it may cause a short circuit between the second electrode and the first electrode. Further, a manner in which the first connection portion is coupled to the auxiliary electrode line will be described below.

Referring to FIGS. 7 and 8A, the light-emitting substrate EP provided by the embodiments of the present disclosure further includes a second connection portion 10. The second connection portion 10 is disposed above the base substrate 100, and is disposed on a side of the first connection portion 400 proximate to the base substrate 100 and a side of the auxiliary electrode line 20 away from the base substrate 100. For example, in the thickness direction of the light-emitting substrate EP (e.g., parallel to the x direction), the second connection portion 10 may be located between the first connection portion 400 and the auxiliary electrode line 20.

The second connection portion 10 may be configured to be in contact with the first connection portion 400, and the second connection portion 10 may further be configured to be in contact with the auxiliary electrode line 20, so that the first connection portion 400 is coupled to the auxiliary electrode line 20 through the second connection portion 10. A manner in which the first connection portion 400 is in contact with the second connection portion 10 will be described below.

In some embodiments, as shown in FIGS. 8A and 8B, the light-emitting substrate EP further includes a second insulating layer 700 and a third insulating layer 800. The second insulating layer 700 and the third insulating layer 800 are sequentially stacked above the base substrate 100 in the direction away from the base substrate 100 (e.g., the x direction). For example, the second insulating layer 700 is closer to the base substrate 100 than the third insulating layer 800. Both the second insulating layer 700 and the third insulating layer 800 are located on the side of the first connection portion 400 proximate to the base substrate 100 and a side of the second connection portion 10 away from the base substrate 100. For example, in the thickness direction of the light-emitting substrate EP (e.g., parallel to the x direction), both the second insulating layer 700 and the third insulating layer 800 are located between the first connection portion 400 and the second connection portion 10. For example, the first connection portion 400 is located on a side of the third insulating layer 800 away from the base substrate 100, and the second connection portion 10 is located on a side of the second insulating layer 700 proximate to the base substrate 100.

The second insulating layer 700 has a sixth opening 710, and the third insulating layer 800 has a seventh opening 810. An orthogonal projection of an upper edge 710a of the sixth opening 710 on the base substrate 100 is within an orthogonal projection of a lower edge 810a of the seventh opening 810 on the base substrate 100, and the orthogonal projection of the upper edge 710a of the sixth opening 710 on the base substrate 100 overlaps with an orthogonal projection of the second connection portion 10 on the base substrate 100.

It will be noted that, the upper edge 710a of the sixth opening 710 may be an edge of the sixth opening 710 away from the base substrate 100, and the lower edge 810a of the seventh opening 810 may be an edge of the seventh opening 810 proximate to the base substrate 100. Reference may be made to the description of the edge of the opening described above, which will not be repeated here.

The sixth opening 710 and the seventh opening 810 have the above structures, so that the first connection portion 400 disposed on the side of the third insulating layer 800 away from the base substrate 100 may be in contact with the second connection portion 10 disposed on the side of the second insulating layer 700 proximate to the base substrate 100 through the sixth opening 710 and the seventh opening 810. That is, the first connection portion 400 is in direct contact with the second connection portion 10.

In addition, since a size of the upper edge 710a of the sixth opening 710 is smaller than a size of the lower edge 810a of the seventh opening 810, it is convenient to control positional accuracy of the openings when the sixth opening 710 and the seventh opening 810 are manufactured.

A manner in which the second connection portion 10 is coupled to the auxiliary electrode line 20 will be described below.

In some embodiments, as shown in FIGS. 8A and 8B, in the thickness direction of the light-emitting substrate EP (e.g., parallel to the y direction), a fourth insulating layer 900 is provided between the second connection portion 10 and the auxiliary electrode line 20. The fourth insulating layer 900 may be an interlayer dielectric layer. The fourth insulating layer 900 may have an eighth opening 910. An orthogonal projection of a lower edge 910a of the eighth opening 910 on the base substrate 100 overlaps with the orthogonal projection of the second connection portion 10 on the base substrate 100, and the orthogonal projection of the lower edge 910a of the eighth opening 910 on the base substrate 100 overlaps with an orthogonal projection of the auxiliary electrode line 20 on the base substrate 100. In this way, the second connection portion 10 may be in direct contact with the auxiliary electrode line 20 through the eighth opening 910 in the fourth insulating layer 900.

Figure 10:
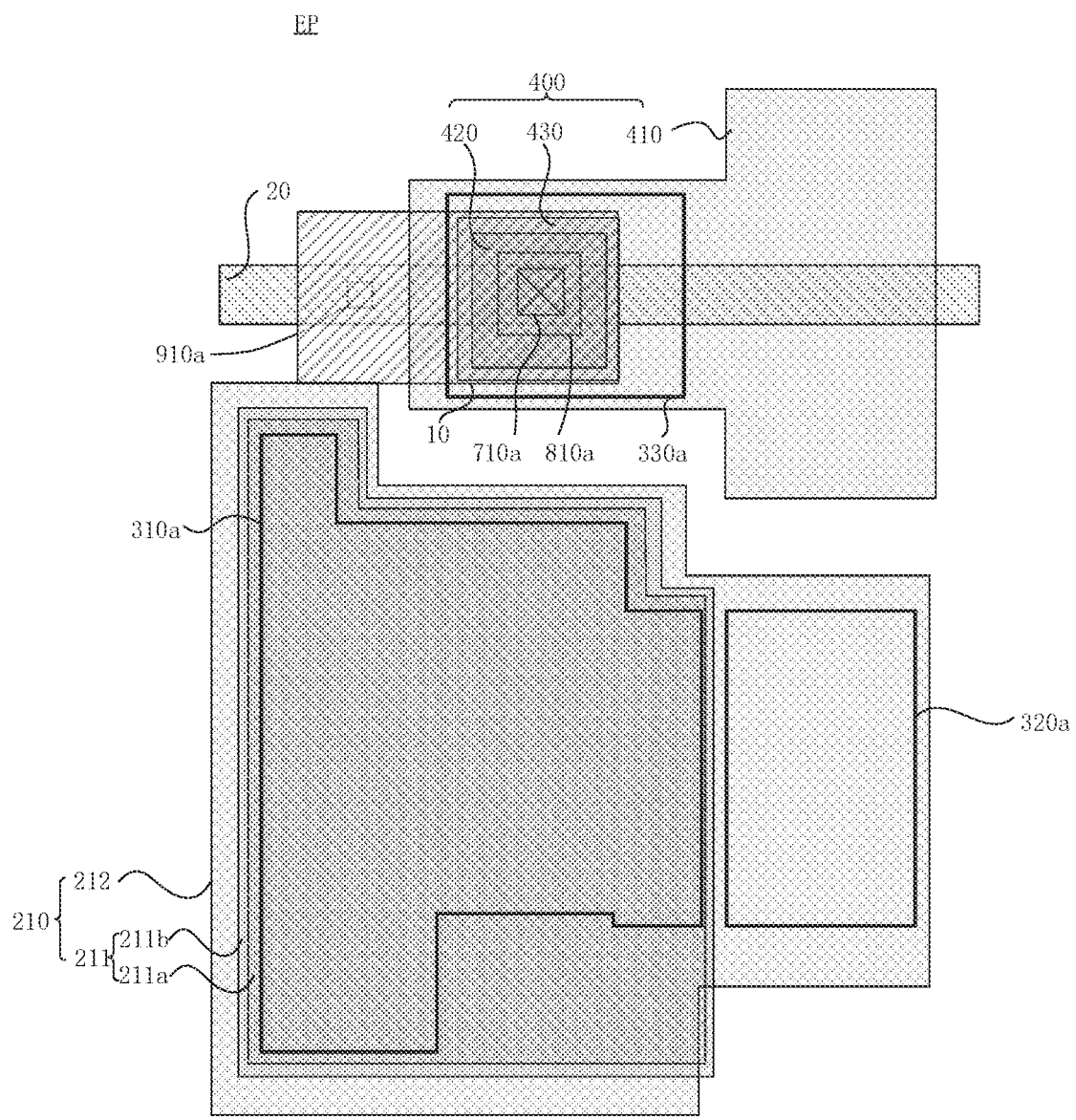
FIG. 10 is a partial top view of yet another light-emitting substrate, in accordance with some embodiments.

In some possible implementations, referring to FIG. 10, the orthogonal projection of the lower edge 910a of the eighth opening on the base substrate may not overlap with the orthogonal projection of the lower edge 810a of the seventh opening on the base substrate. In this case, the second connection portion 10 may extend into the eighth opening, so that the second connection portion 10 is coupled to the auxiliary electrode line 20 through the eighth opening.

Based on the above description, the second connection portion 10 may be coupled to the auxiliary electrode line 20, and the second connection portion 10 may further be coupled to the first connection portion 400. In this way, the auxiliary electrode line 20 is coupled to the first connection portion 400.

The light-emitting substrate provided by some embodiments of the present disclosure may further include light-detecting device(s). A light-detecting device may be configured to detect light emitted by light-emitting device(s). For example, the light-detecting device may be configured to detect light emitted by a light-emitting device. For another example, the light-detecting device may be configured to detect light emitted by a plurality of light-emitting devices.

Figure 11:
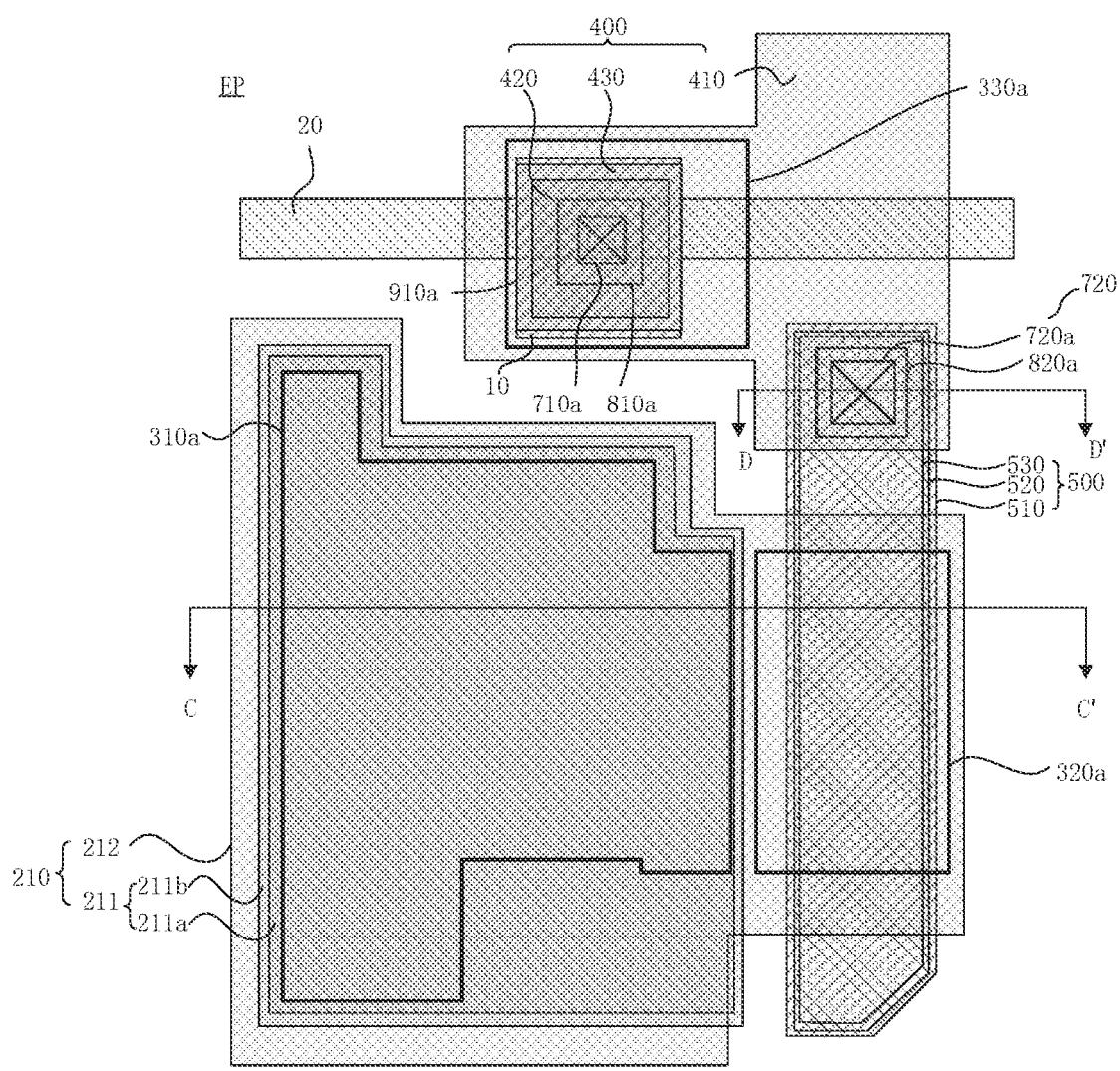
FIG. 11 is a partial top view of yet another light-emitting substrate, in accordance with some embodiments.
Figure 12:
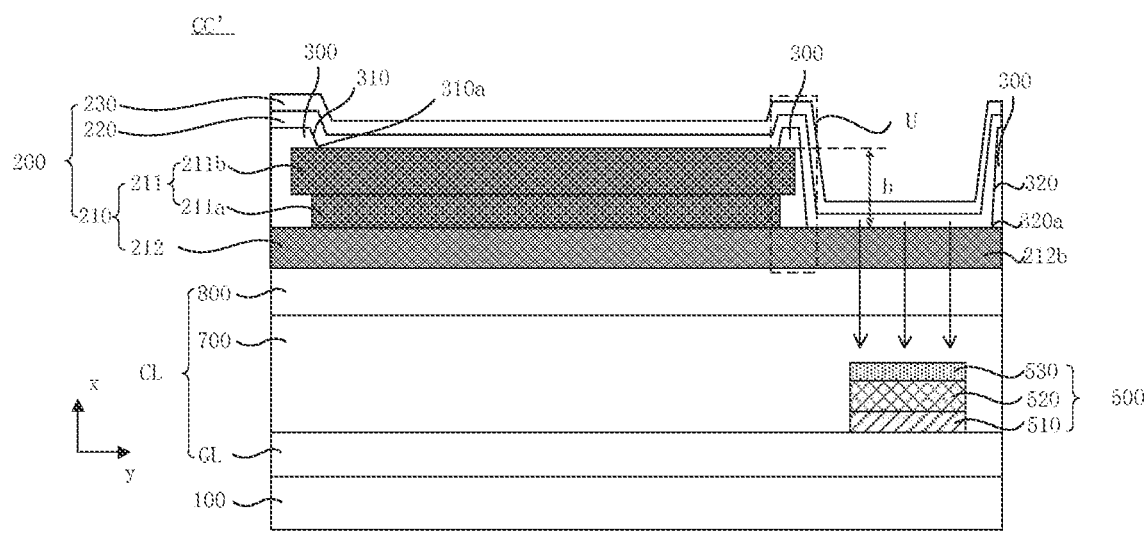
FIG. 12 is a sectional view of the light-emitting substrate in FIG. 11 taken along the line CC'.

FIG. 11 is a partial top view of the light-emitting substrate, and FIG. 12 is a sectional view of the light-emitting substrate taken along the section line CC' in FIG. 11. Referring to FIGS. 11 and 12, in some embodiments, the light-emitting substrate includes the light-emitting device 200, the first connection portion 400, and the light-detecting device 500.

The light-detecting device 500 is disposed above the base substrate 100 and located on a side of the first electrode 210 of the light-emitting device 200 away from the light-emitting functional layer 220. For example, in the thickness direction of the light-emitting substrate EP (e.g., parallel to the x direction), the light-detecting device 500 is located between the first electrode 210 in the light-emitting device 200 and the base substrate 100.

An orthogonal projection of the light-detecting device 500 on the base substrate 100 overlaps with an orthogonal projection of the lower edge 320a of the second opening 320 of the first insulating layer 300 on the base substrate. The lower edge 320a of the second opening 320 may be an edge of the second opening 320 proximate to the light-detecting device 500. The orthogonal projection of the light-detecting device 500 on the base substrate 100 may be a figure enclosed by an orthogonal projection of an outer contour of the light-detecting device 500 on the base substrate 100. In this case, the light emitted by the light-emitting device 200 may be directly incident onto the light-detecting device 500. In addition, since a portion of the light-emitting device 200 that is covered by the first insulating layer 300 may not emit light, a size of a light-emitting region that may be detected by the light-detecting device 500 may be determined through the second opening 320. That is, most of the light reaching the light-detecting device 500 is from the second opening 320. In this way, a source of the light detected by the light-detecting device 500 may be concentrated, and accuracy of the light-detecting device 500 may be improved.

Figure 13:
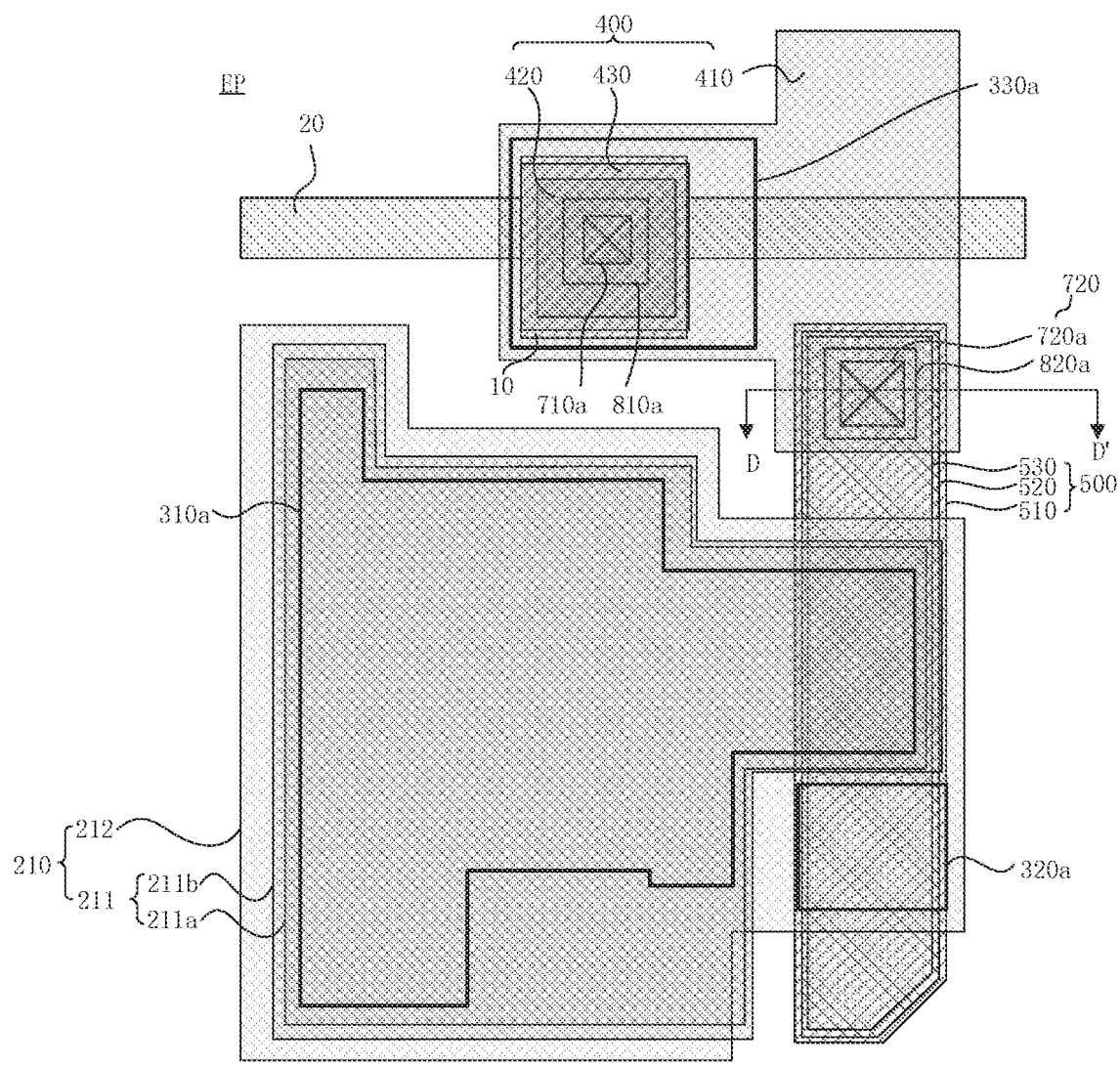
FIG. 13 is a partial top view of yet another light-emitting substrate, in accordance with some embodiments.

In some possible implementations, a positional relationship between the orthogonal projection of the lower edge 320a of the second opening 320 on the base substrate and the orthogonal projection of the light-detecting device 500 on the base substrate may be as shown in FIG. 11. In this case, an overlapping area between the orthogonal projection of the lower edge 320a of the second opening 320 on the base substrate and the orthogonal projection of the light-detecting device 500 on the base substrate is relatively large, so that light emitted by the light-emitting device 200 may reach a relatively large area of the light-detecting device 500. In some other possible implementations, the positional relationship between the orthogonal projection of the lower edge 320a of the second opening 320 on the base substrate and the orthogonal projection of the light-detecting device 500 on the base substrate may be as shown in FIG. 13. In this case, the orthogonal projection of the light-detecting device 500 on the base substrate 100 overlaps with the orthogonal projection of the lower edge 320a of the second opening 320 on the base substrate, and the orthogonal projection of the light-detecting device 500 on the base substrate 100 overlaps with the orthogonal projection of the lower edge 310a of the first opening 310 on the base substrate; correspondingly, the orthogonal projection of the first sub-electrode 211 on the base substrate overlaps with the orthogonal projection of the light-detecting device 500 on the base substrate. In this way, the second opening 320 is relatively small, and the first opening 310 is relatively large. The light-emitting condition of the light-emitting device 200 may be detected by the light-detecting device 500 through the second opening 320. Moreover, the first opening 310 may expose a large area of the first sub-electrode 211, so that more light may be reflected by the first sub-electrode 211 in the first opening 310. As a result, an amount of light exiting from a side of the second electrode 230 may be increased, and the light exit amount may be improved. With continued reference to FIGS. 11, 12, and 13, in some embodiments, in the thickness direction of the light-emitting substrate EP (e.g., parallel to the x direction), at least a portion of the light-detecting device 500 may be located directly below the second opening 320, so that the light emitted by the light-emitting device 200 may be incident on the light-detecting device 500 through the second portion 212b of the second sub-electrode 212 located in the second opening 320. For example, the second portion 212b of the second sub-electrode 212 may have an opening, so that the light emitted by the light-emitting device 200 may be incident on the light-detecting device 500 located below the opening through the opening. For another example, the second portion 212b of the second sub-electrode 212 may be transparent or translucent, so that the light emitted by the light-emitting device 200 may be directly incident onto the light-detecting device 500 located below the second portion of the second sub-electrode 212 through the second portion of the second sub-electrode 212.

A specific type of the light-detecting device 500 is not particularly limited in the present disclosure, as long as the light-detecting device 500 may detect a luminous intensity of the light-emitting device and generate a detection signal, so as to realize optical compensation of the light-emitting device 200. For example, the light-detecting device 500 may be a positive intrinsic negative (PIN) photodiode.

As shown in FIGS. 11 to 13, and 15, the light-detecting device 500 includes a semiconductor pattern 520, and the light-detecting device 500 may further include a third electrode 510 and a fourth electrode 530.

Figure 14:
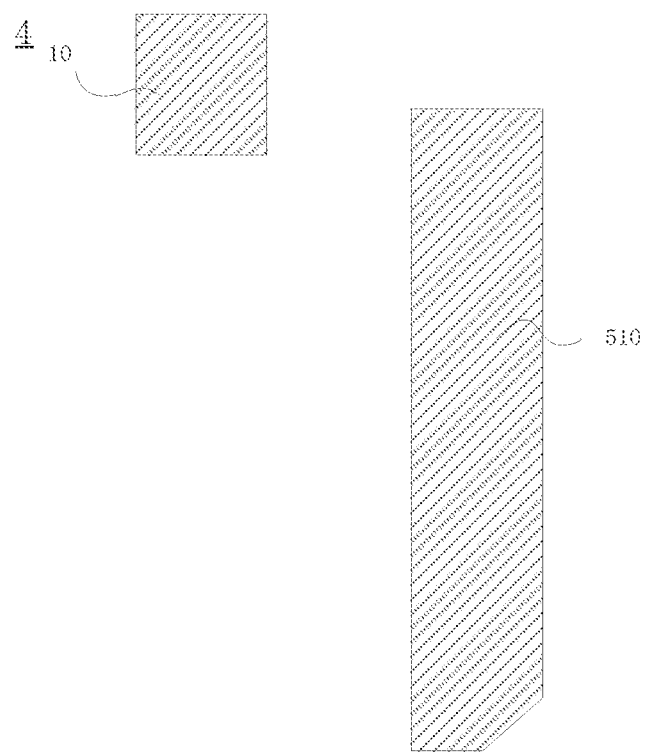
FIG. 14 is a partial top view of a fourth pattern layer in a light-emitting substrate, in accordance with some embodiments.

In some embodiments, the third electrode 510 and the second connection portion 10 may be disposed in a same layer. For example, FIG. 14 is a partial top view of a fourth pattern layer in the light-emitting substrate. Referring to FIG. 14, the fourth pattern layer 4 includes the third electrode 510 and the second connection portion 10.

In some embodiments, referring to FIG. 12, the fourth electrode 530 is closer to the second opening 320 of the first insulating layer 300 than the third electrode 510. In this case, the fourth electrode 530 may be a transparent electrode, so that the light emitted by the light-emitting device 200 may be incident onto the semiconductor pattern 520 through the fourth electrode 530. In this way, the light-detecting device 500 may complete the detection of the light emitted by the light-emitting device 200.

The third electrode 510 or the fourth electrode 530 may be coupled to the auxiliary electrode line 20. In this case, the auxiliary electrode line 20 may not only serve as an auxiliary electrode of the second electrode 230 in the light-emitting device 200, but also provide an electrical signal for the light-detecting device 500. Compared to using a separate signal line to provide an electrical signal to the light-detecting device 500, such the arrangement may save one path of signal.

In some embodiments, the fourth electrode 530 may be coupled to the auxiliary electrode line 20. For example, the fourth electrode 530 may be coupled to the first connection portion 400. Based on the above, the first connection portion 400 may be coupled to the auxiliary electrode line 20. Therefore, the fourth electrode 530 may be coupled to the auxiliary electrode line 20 through the first connection portion 400.

A manner in which the fourth electrode 530 is coupled to the first connection portion 400 will be described below.

Figure 15:
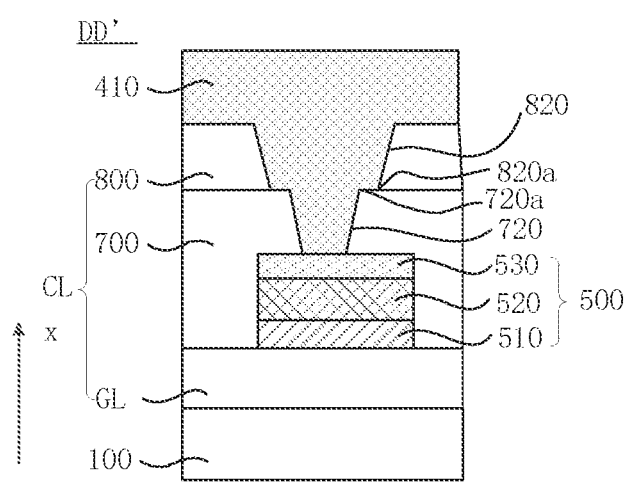
FIG. 15 is a sectional view of the light-emitting substrate in FIG. 11 taken along the line DD'.

FIG. 15 is a sectional view of the light-emitting substrate taken along the section line DD' in FIGS. 11 and 13. Referring to FIGS. 11, 13 and 15, the light-emitting substrate EP provided by the embodiments of the present disclosure further includes the second insulating layer 700 and the third insulating layer 800. Positions of the second insulating layer 700 and the third insulating layer 800 in the light-emitting substrate EP may be as described above. Further, the second insulating layer 700 and the third insulating layer 800 are located on a side of the first connection pattern 410 in the first connection portion 400 proximate to the base substrate 100 and a side of the fourth electrode 530 away from the base substrate 100. For example, in the thickness direction of the light-emitting substrate EP (e.g., parallel to the x direction), the second insulating layer 700 and the third insulating layer 800 are located between the first connection pattern 410 of the first connection portion 400 and the fourth electrode 530 of the light-detecting device 500. For example, the first connection pattern 410 in the first connection portion 400 is located on a side of the third insulating layer 800 away from the base substrate 100, and the fourth electrode 530 is located on a side of the second insulating layer 700 proximate to the base substrate 100.

The second insulating layer 700 further includes a fourth opening 720, and the third insulating layer 800 further includes a fifth opening 820. An orthogonal projection of an upper edge 720a of the fourth opening 720 on the base substrate 100 is within an orthogonal projection of a lower edge 820a of the fifth opening 820 on the base substrate 100, and the orthogonal projection of the upper edge 720a of the fourth opening 720 on the base substrate 100 overlaps with an orthogonal projection of the fourth electrode 530 on the base substrate 100.

It will be first noted that, the upper edge 720a of the fourth opening 720 is an edge of the fourth opening 720 away from the base substrate 100, and the lower edge 820a of the fifth opening 820 is an edge of the fifth opening 820 proximate to the base substrate 100. Reference may be made to the description of the upper edge and the lower edge of the opening described above, which will not be repeated here.

Since the second insulating layer 700 and the third insulating layer 800 have the above structures, the first connection portion 400 disposed on the side of the third insulating layer 800 away from the base substrate 100 may be in direct contact with the fourth electrode 530 disposed on the side of the second insulating layer 700 proximate to the base substrate 100 through the fourth opening 720 and the fifth opening 820. For example, based on the above description, in the first connection portion 400, the first connection pattern 410 is closest to the base substrate 100, so that the orthogonal projection of the first connection pattern 410 on the base substrate 100 may overlap with the orthogonal projection of the upper edge 720a of the four openings 720 on the base substrate 100, and may also overlap with the orthogonal projection of the lower edge 820a of the fifth opening 820 on the base substrate 100. In this way, the first connection pattern 410 may be in contact with the fourth electrode 530 through the fourth opening 720 and the fifth opening 820, thereby achieving that the first connection portion 400 is coupled to the fourth electrode 530.

In addition, since a size of the upper edge 720a of the fourth opening 720 is smaller than a size of the lower edge 820a of the fifth opening 820, it is convenient to control positional accuracy of the openings when the fourth opening 720 and the fifth opening 820 are manufactured.

In some embodiments, the semiconductor pattern 520 of the light-detecting device 500 may include an n-type semiconductor layer, an intrinsic semiconductor layer, and a p-type semiconductor layer. The intrinsic semiconductor layer may be lightly doped, so that the light-detecting device 500 has a good photosensitive performance.

In some embodiments, the light-emitting substrate may further include a plurality of transistors. The transistors may be thin film transistors. Referring to FIGS. 4A, 4B, 8A, 8B, 12, and 15, the plurality of transistors may be disposed on the base substrate, for example, may be disposed in the circuit layer CL.

Figure 16:
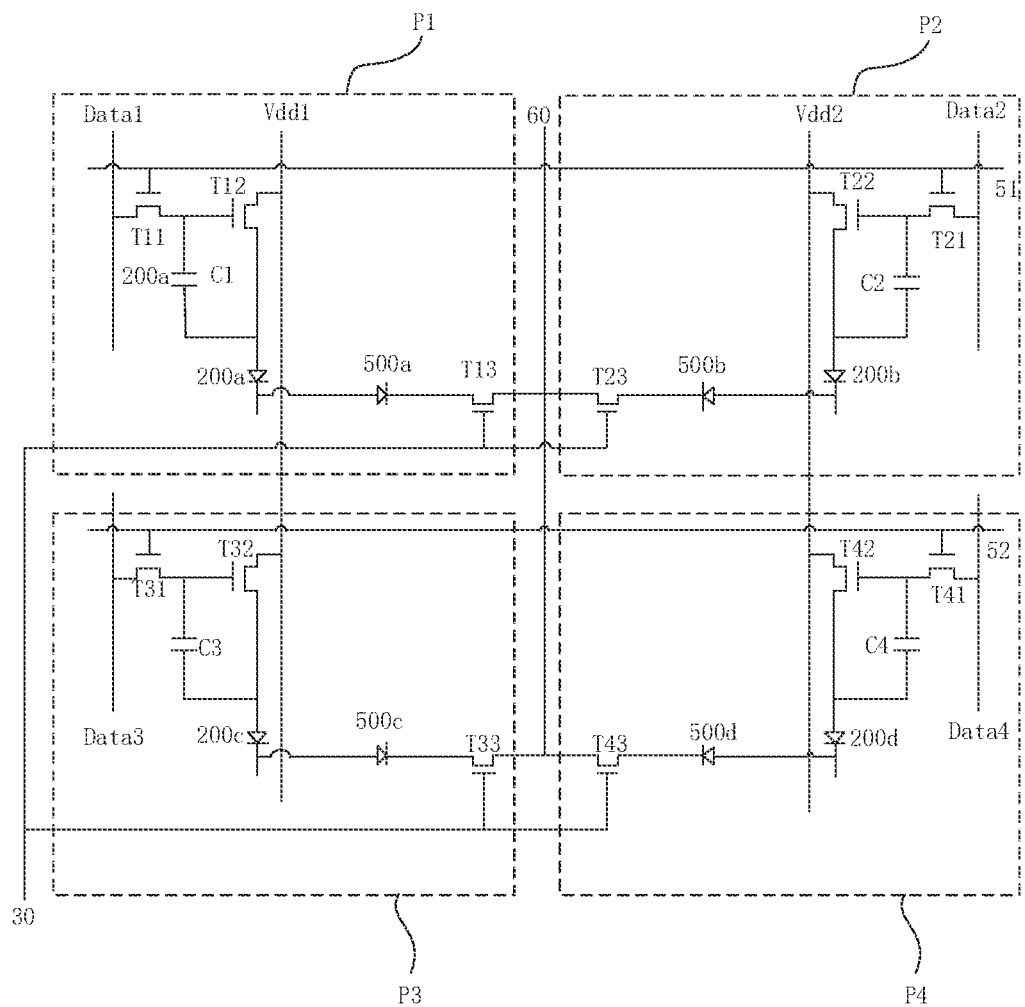
FIG. 16 is an equivalent circuit diagram corresponding to the region X in FIG. 1.

FIG. 16 is an equivalent circuit diagram corresponding to the region X in FIG. 1. Referring to FIG. 16, a sub-pixel unit includes a light-emitting device, a pixel driving circuit coupled to the light-emitting device to drive the light-emitting device to emit light. The sub-pixel unit further includes a light-detecting device, and a control circuit coupled to the light-detecting device. The pixel driving circuit and the control circuit may include a plurality of transistors. For example, the pixel driving circuit may include at least one first transistor coupled to the light-emitting device, and the control circuit may include a second transistor coupled to the light-detecting device. For example, the sub-pixel unit P1 is taken as an example, the plurality of transistors in the sub-pixel unit P1 may include a first transistor T11 and a first transistor T12 that are coupled to the light-emitting device 200a, and a second transistor T13 coupled to the light-detecting device 500a. The first transistor T11 and the first transistor T12 may be disposed in the pixel driving circuit, and the pixel driving circuit is used to drive the light-emitting device 200a to emit light. The second transistor T13 may be disposed in the control circuit of the light-detecting device 500a.

The transistor may include an active layer, a first conductive portion and a second conductive portion that are respectively located on two sides of the active layer and in contact with the active layer, and a gate. Referring to FIGS. 8A, 8B, 12 and 15, in order to form the transistor, the circuit layer CL includes a gate insulating layer GL.

In some embodiments, the first conductive portion may be a drain region of the transistor, and correspondingly, the second conductive portion may be a source region of the transistor. In some other embodiments, the first conductive portion may be a source region of the transistor, and correspondingly, the second conductive portion may be a drain region of the transistor.

Figure 17:
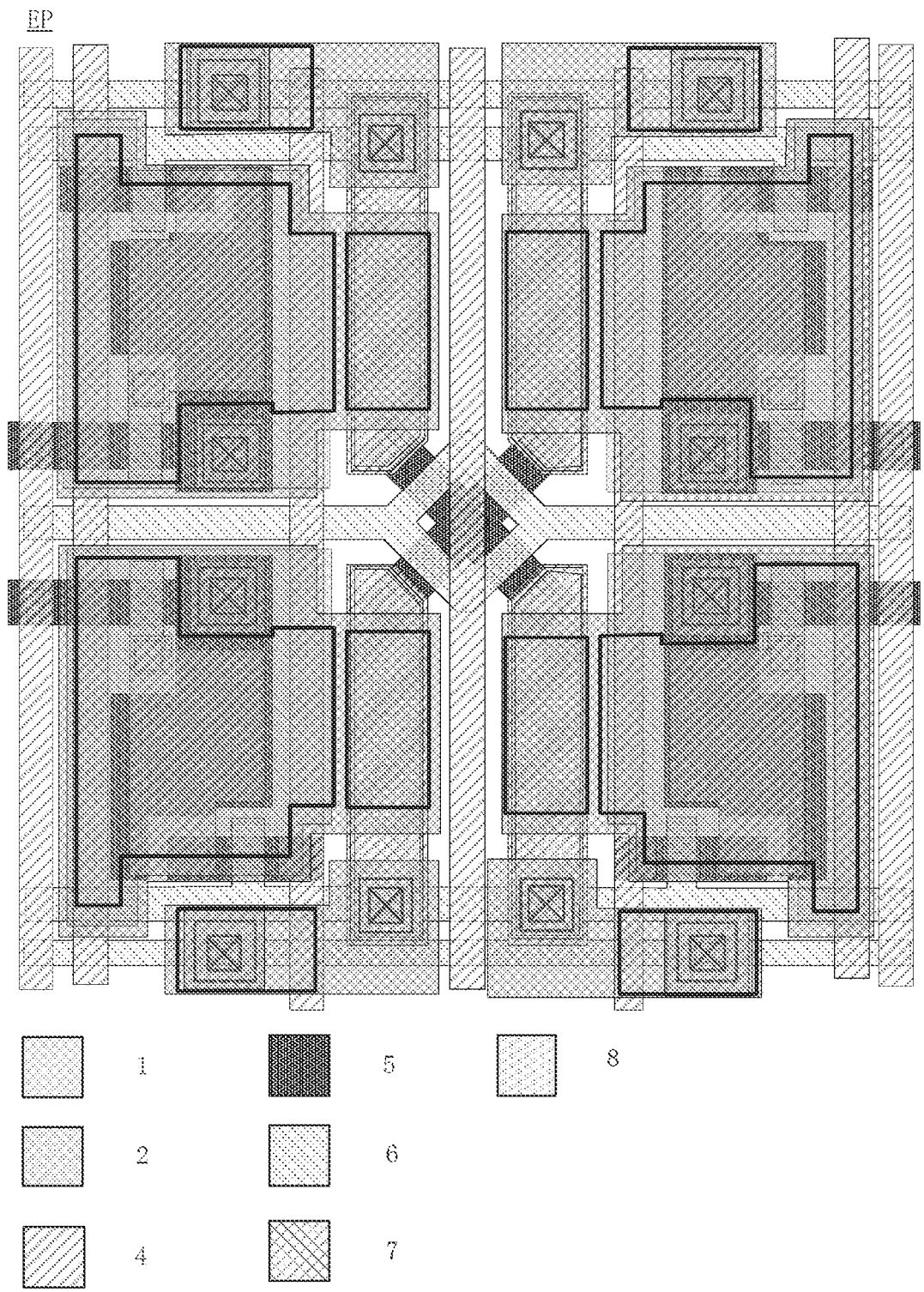
FIG. 17 is a top view of the region X in the light-emitting substrate in FIG. 1.
Figure 18A:
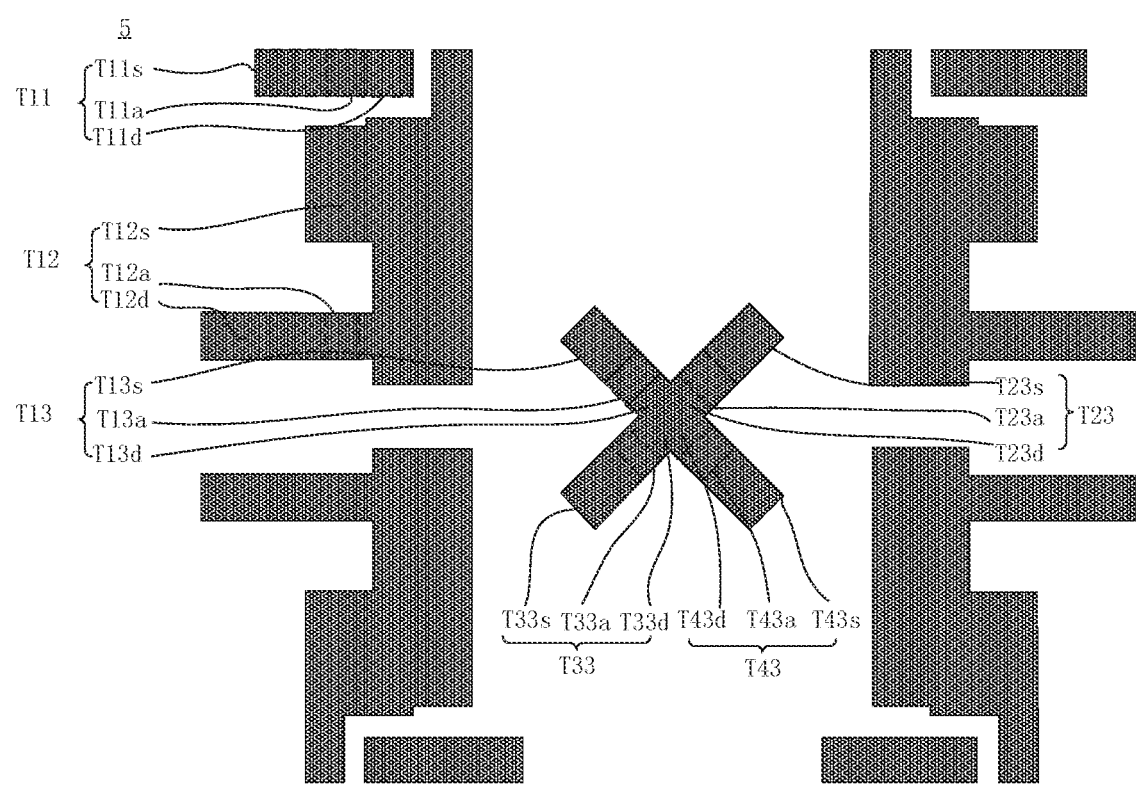
FIG. 18A is a top view of a fifth pattern layer in a light-emitting substrate, in accordance with some embodiments.
Figure 18B:
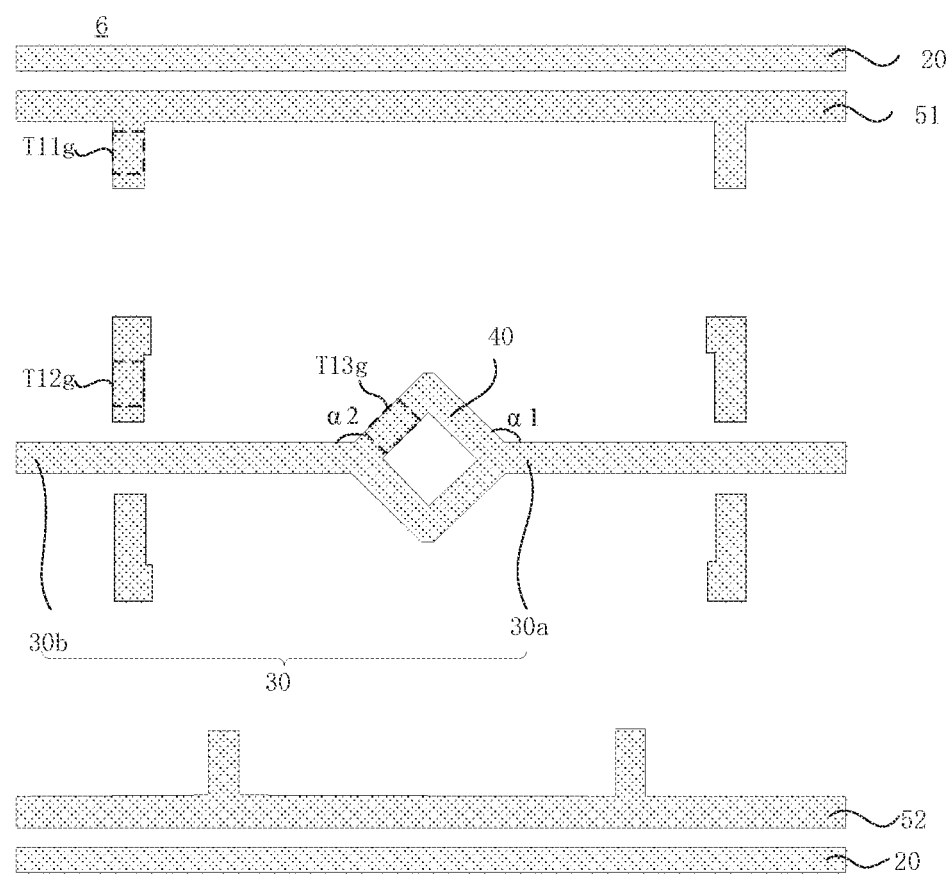
FIG. 18B is a top view of a sixth pattern layer in a light-emitting substrate, in accordance with some embodiments.
Figure 18C:
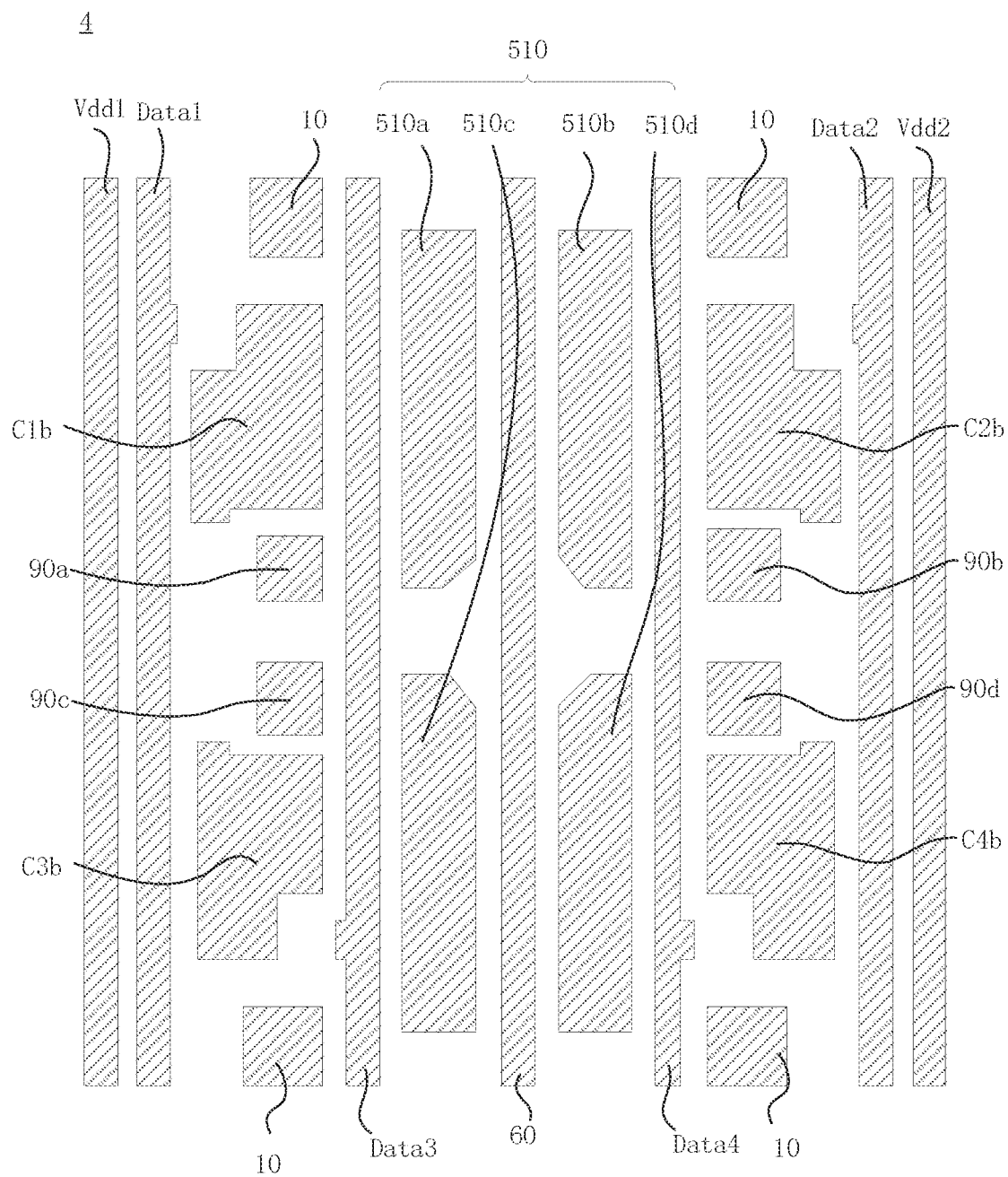
FIG. 18C is a top view of a fourth pattern layer in a light-emitting substrate, in accordance with some embodiments.
Figure 18D:
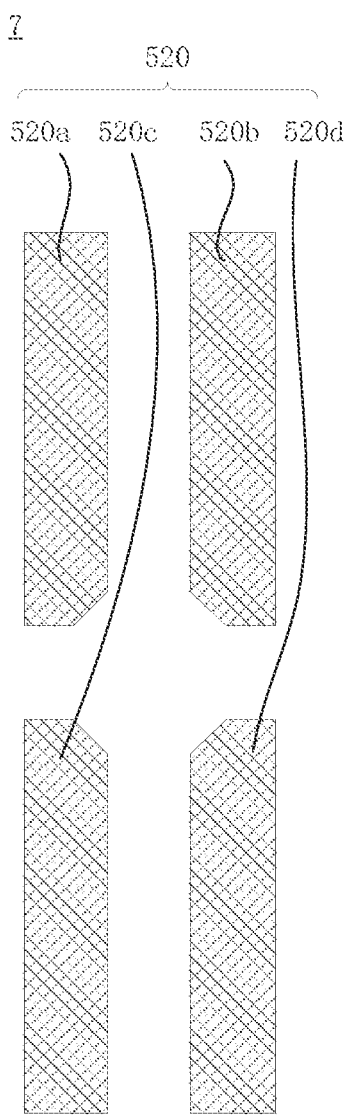
FIG. 18D is a top view of a seventh pattern layer in a light-emitting substrate, in accordance with some embodiments.
Figure 18E:
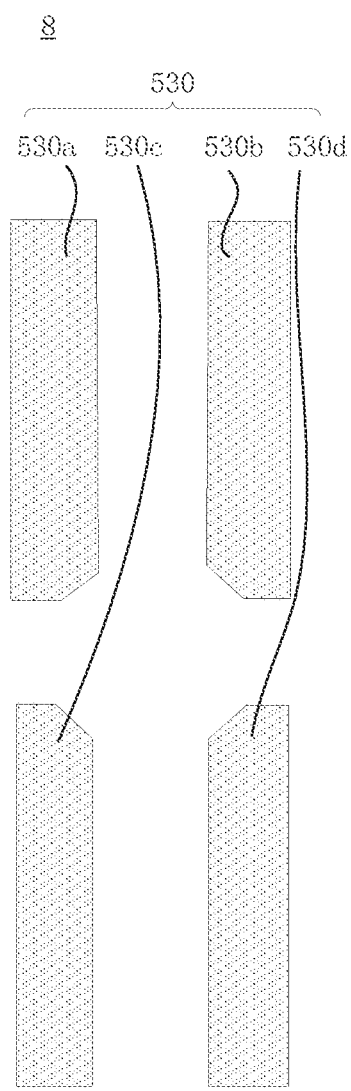
FIG. 18E is a top view of a eighth pattern layer in a light-emitting substrate, in accordance with some embodiments.
Figure 18F:
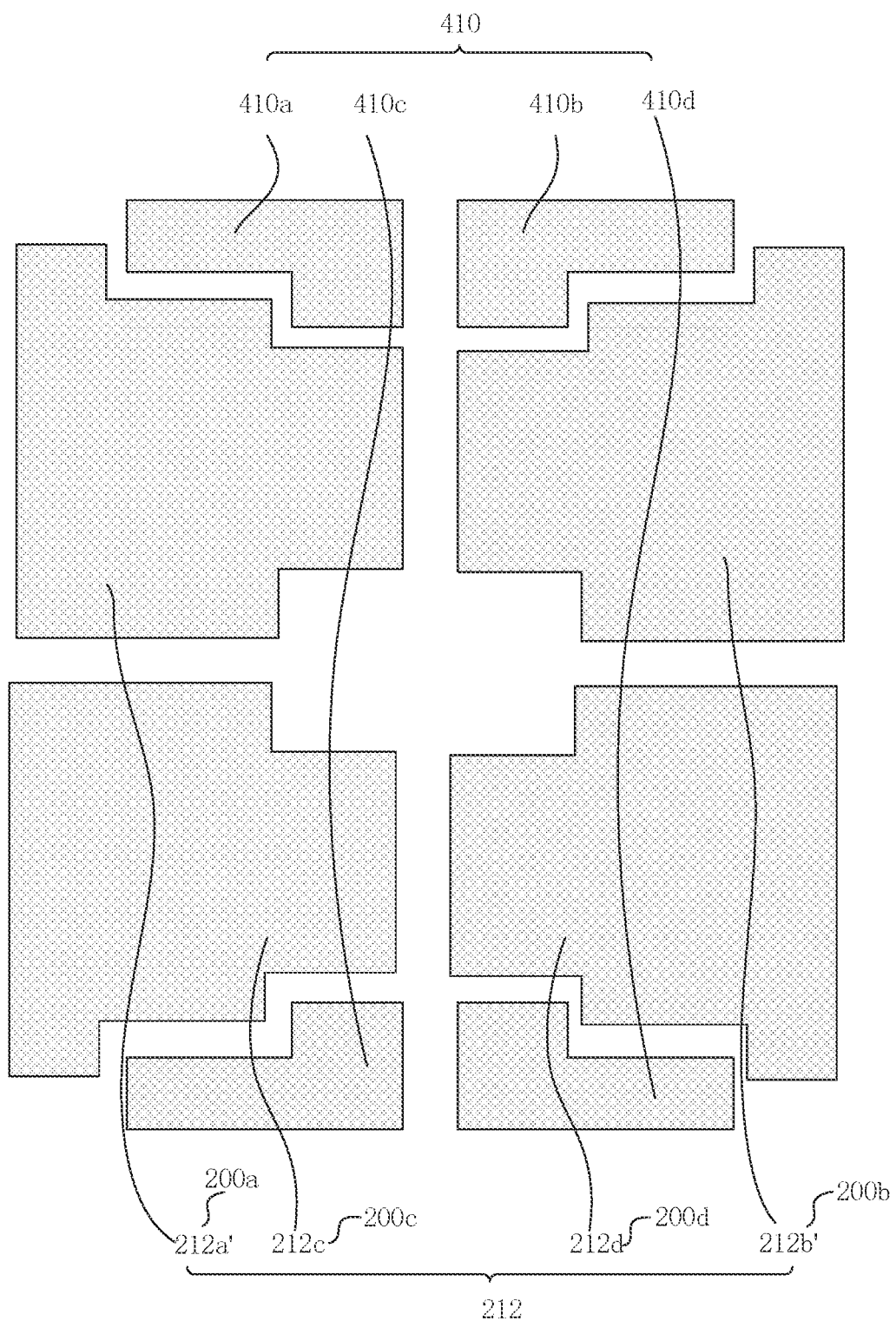
FIG. 18F is a top view of another first pattern layer in a light-emitting substrate, in accordance with some embodiments.
Figure 18G:
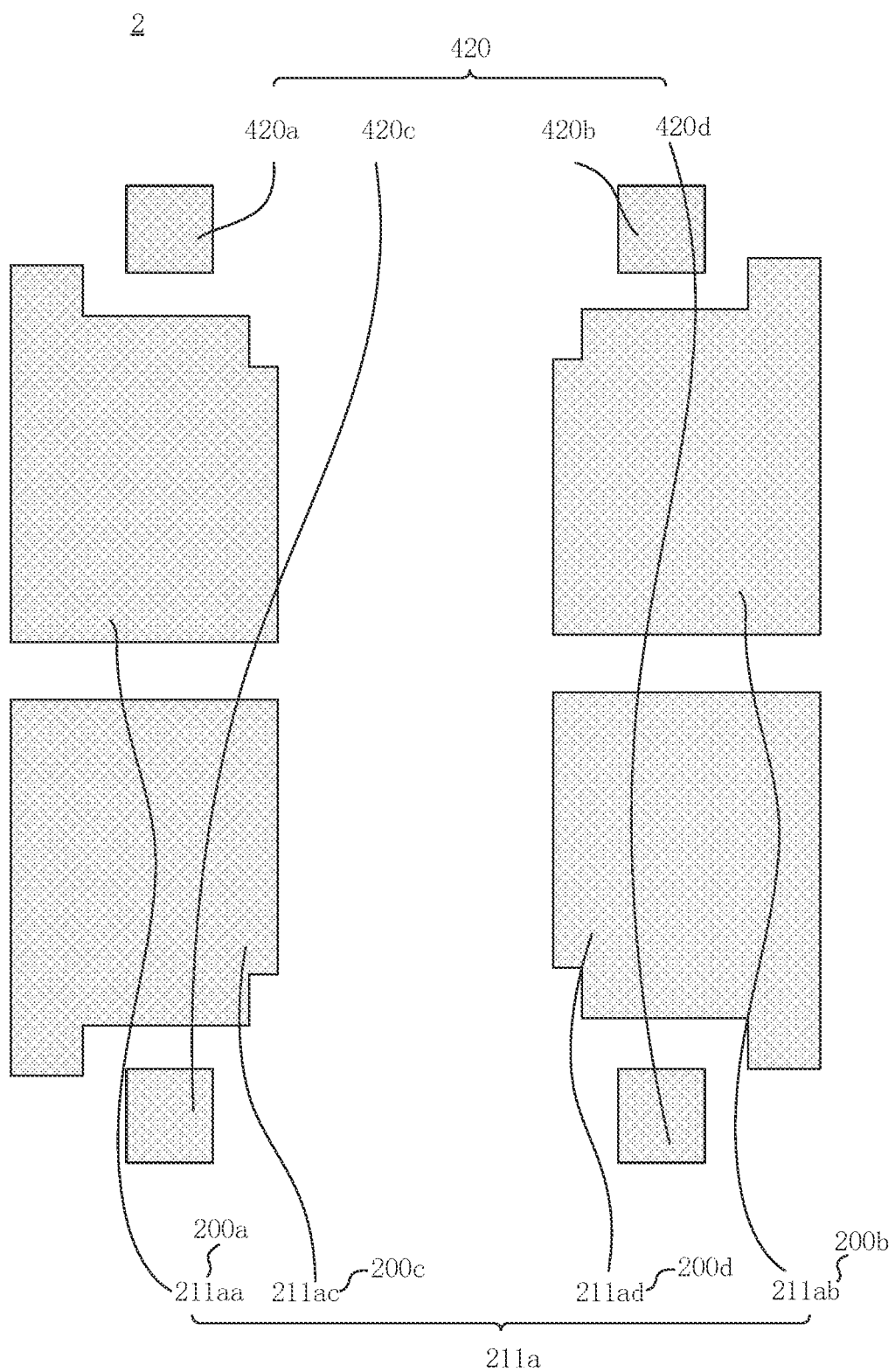
FIG. 18G is a top view of another second pattern layer in a light-emitting substrate, in accordance with some embodiments.
Figure 18H:
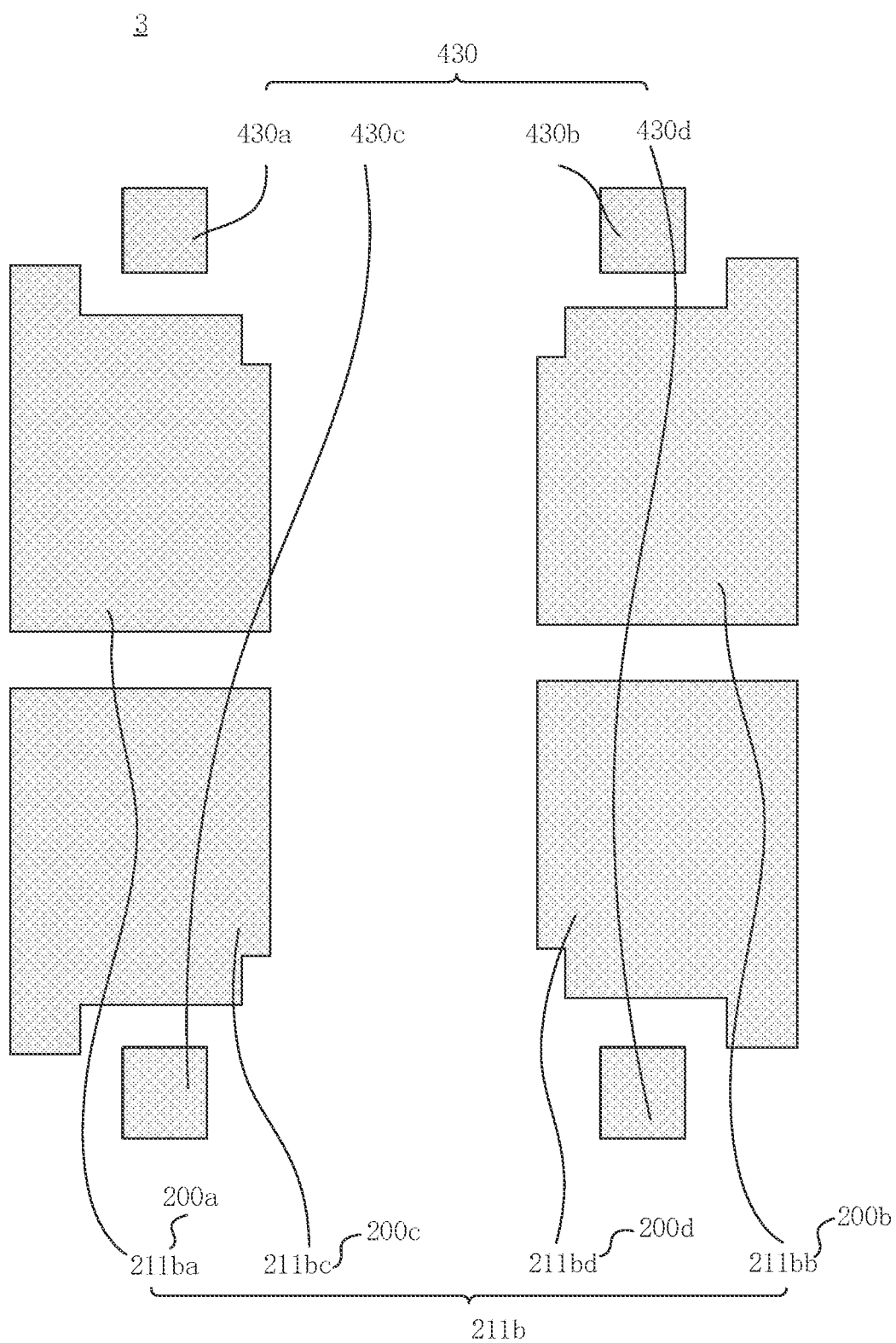
FIG. 18H is a top view of another third pattern layer in a light-emitting substrate, in accordance with some embodiments.

FIG. 17 is a top view of the region X of the light-emitting substrate in FIG. 1, so as to further illustrate the structure of the transistor in the light-emitting substrate. Referring to FIG. 17, the light-emitting substrate EP has a stacked structure including a fifth pattern layer 5, a sixth pattern layer 6, a fourth pattern layer 4, a seventh pattern layer 7, an eighth pattern layer 8, a first pattern layer 1, a second pattern layer 2, and a third pattern layer 3. A stacking sequence of the pattern layers may be as follows. The fifth pattern layer 5, the sixth pattern layer 6, the fourth pattern layer 4, the seventh pattern layer 7, the eighth pattern layer 8, the first pattern layer 1, the second pattern layer 2, and the third pattern layer 3 are sequentially arranged in the direction moving away from the base substrate. FIG. 18A is a top view of the fifth pattern layer 5, FIG. 18B is a top view of the sixth pattern layer 6, FIG. 18C is a top view of the fourth pattern layer 4, FIG. 18D is a top view of the seventh pattern layer 7, FIG. 18E is a top view of the eighth pattern layer 8, FIG. 18F is a top view of the first pattern layer 1, FIG. 18G is a top view of the second pattern layer 2, and FIG. 18H is a top view of the third pattern layer 3. It will be noted that, a shape and size of the second pattern layer 2 and the third pattern layer 3 may be approximately the same respectively. FIG. 17 only shows the second pattern layer 2, and omits the third pattern layer 3.

Figure 19A:
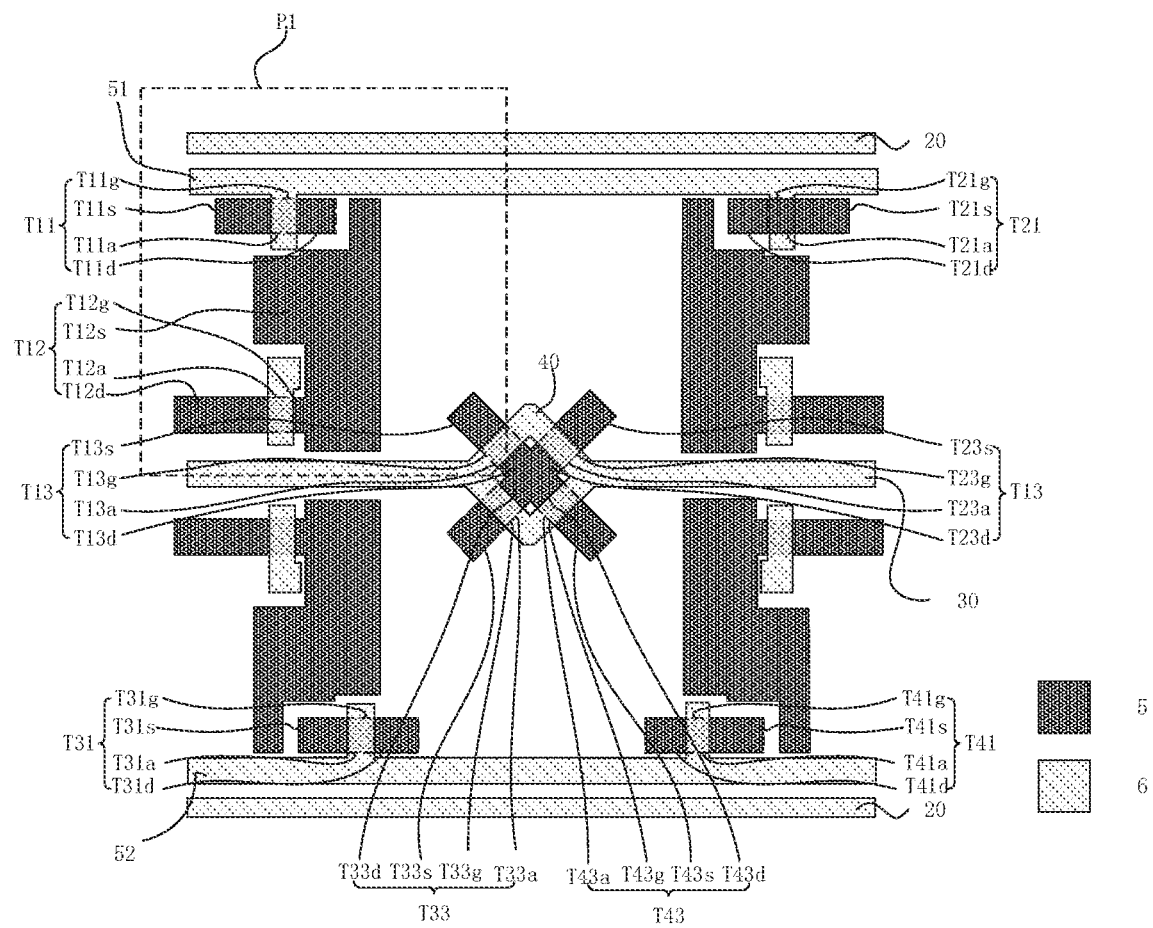
FIG. 19A is a top view of a fifth pattern layer stacked with a sixth pattern layer in a light-emitting substrate, in accordance with some embodiments.

FIG. 19A is a top view of the fifth pattern layer stacked with the sixth pattern layer. Referring to FIGS. 16 and 19A, the sub-pixel unit P1 is taken as an example (structures of the sub-pixel unit P2, the sub-pixel unit P3, and the sub-pixel unit P4 being similar to that of the sub-pixel unit P1, which will not be repeated here), the first transistor T11 includes an active layer T11a, a first conductive portion T11d, a second conductive portion T11s, and a gate T11g. The first transistor T12 includes an active layer T12a, a first conductive portion T12d, a second conductive portion T12s, and a gate T12g. The second transistor T13 includes an active layer T13a, a first conductive portion T13d, a second conductive portion T13s, and a gate T13g. As shown in FIGS. 18A and 19A, the active layer T11a, the first conductive portion T11d, the second conductive portion T11s, the active layer T12a, the first conductive portion T12d, the second conductive portion T12s, the active layer T13a, the first conductive portion T13d, and the second conductive portion T13s are disposed in the fifth pattern layer 5. As shown in FIGS. 18B and 19A, the gate T11g, the gate T12g, and the gate T13g are disposed in the sixth pattern layer 6.

In some embodiments, the first transistors include a driving transistor. Referring to FIGS. 16, 18C, and 19A, the sub-pixel unit P1 is taken as an example, the pixel driving circuit in the sub-pixel unit P1 may have a 2T1C structure, and include two transistors (the first transistor T11 and the first transistor T12), and a capacitor C1. Two electrode plates of the capacitor C1 may be represented by C1b in FIG. 18C and T12s in FIG. 18A, and the electrode plate C1b of the capacitor C1 may be coupled to the light-emitting device 200a through a transfer pattern 90a. In the first transistor T11 and the first transistor T12, the first transistor T12 may be a driving transistor, and may be coupled to the light-emitting device to control a magnitude of a current flowing through the light-emitting device.

On this basis, a width-to-length ratio of a channel region of the second transistor (e.g., the second transistor T13) is less than a width-to-length ratio of a channel region of the driving transistor (e.g., the first transistor T12). The channel region may be located between the first conductive portion and the second conductive portion of the transistor. When the transistor is turned on, the channel region may form a conductive channel, for example, the channel region may be the active layer of the transistor. Correspondingly, an effective length of the channel region may be a length from a border of the active layer connected to the first conductive portion to a border of the active layer connected to the second conductive portion in the active layer. Since the width-to-length ratio of the channel region of the second transistor (e.g., the second transistor T13) is less than the width-to-length ratio of the channel region of the driving transistor (e.g., the first transistor T12), the second transistor may have a small threshold voltage, which may improve the accuracy of each light-detecting device 500.

In some embodiments, a length direction of the channel region of the second transistor (e.g., the second transistor T13) is not parallel to a length direction of a channel region of each first transistor (e.g., the first transistor T11 or the first transistor T12). The length direction of the channel region may be parallel to a direction of the effective length of the channel region. The direction of the effective length of the channel region may be a direction from the border of the active layer connected to the first conductive portion to the border of the active layer connected to the second conductive portion. Since the length direction of the channel region of the second transistor (e.g., the second transistor T13) is not parallel to the length direction of the channel region of each first transistor (e.g., the first transistor T11 or the first transistor T12), the light-emitting substrate may have a greatly irregular structure. In this way, a diffraction effect of light in the light-emitting substrate may be reduced, thereby reducing an effect of the diffraction of light in the light-emitting substrate on the display effect of the light-emitting substrate.

In some embodiments, the active layers of the transistors may be located on a side of the light-detecting device proximate to the base substrate. For example, in the thickness direction of the light-emitting substrate, the active layers may be located between the light-detecting device and the base substrate. For example, referring to FIGS. 16, 18A and 18D, the fifth pattern layer 5 includes the active layers of the transistors (e.g., the active layer T11a of the first transistor T11, the active layer T12a of the first transistor T12, and the active layer T13a of the second transistor T13). The seventh pattern layer 7 includes semiconductor patterns 520 of light-detecting devices (e.g., including a semiconductor pattern 520a of the light-detecting device 500a, a semiconductor pattern 520b of a light-detecting device 500b, a semiconductor pattern 520c of a light-detecting device 500c, and a semiconductor pattern 520d of a light-detecting device 500d). The fifth pattern layer 5 may be located between the seventh pattern layer 7 and the base substrate.

Figure 19B:
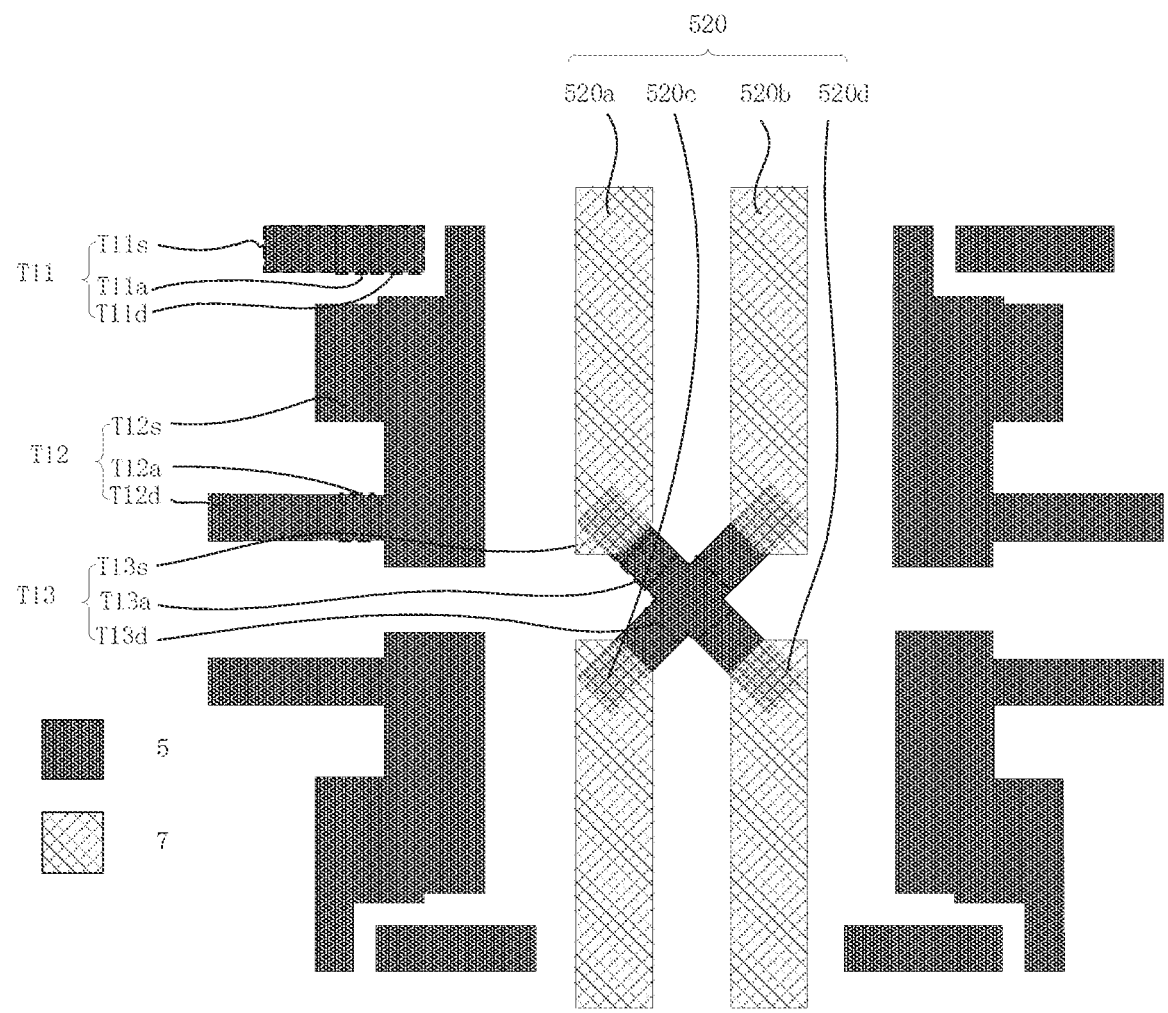
FIG. 19B is a top view of a fifth pattern layer stacked with a seventh pattern layer in a light-emitting substrate, in accordance with some embodiments.

On this basis, FIG. 19B is a top view of the fifth pattern layer stacked with the seventh pattern layer. Referring to FIG. 19B, the orthogonal projections of the semiconductor patterns 520 of the light-detecting devices on the base substrate are non-overlap with an orthogonal projection of an active layer in each transistor (e.g., the active layer T11a of the first transistor T11, the active layer T12a of the first transistor T12, and the active layer T13a of the second transistor T13) on the base substrate. In this way, it is possible to make the light-detecting device to be flat, and it is beneficial to improve the light-detecting performance of the light-detecting device. In addition, a material of the semiconductor pattern 520 of the light-detecting device may include a material containing hydrogen (H). However, it may be possible to make the active layer conductive after H entering the active layer of the transistor, thereby affecting the performance of the transistor. Since the orthogonal projection of the semiconductor pattern of the light-detecting device on the base substrate does not overlap with the orthogonal projection of the active layer of the transistor on the base substrate, an effect of H in the semiconductor pattern of the light-detecting device on the active layer in the transistor may be reduced.

In some embodiments, an area of the orthogonal projection of the semiconductor pattern 520 of the light-detecting device on the base substrate is larger than an area of the orthogonal projection of the active layer of the second transistor (e.g., the active layer T13a of the second transistor T13) on the base substrate. In this way, the area of the semiconductor pattern 520 of the light-detecting device is relatively large, which may make the light-detecting device detect light more accurately.

In some embodiments, the light-emitting substrate may include at least two (e.g., two or n, n being greater than or equal to 3) light-detecting devices and at least two light-emitting devices.

For example, referring to FIG. 16, the light-emitting substrate includes four light-detecting devices (i.e., a light-detecting device 500a, a light-detecting device 500b, a light-detecting device 500c, and a light-detecting device 500d) that are respectively included in four sub-pixel units (i.e., the sub-pixel unit P1, the sub-pixel unit P2, the sub-pixel unit P3, and the sub-pixel unit P4) adjacent to one another. The light-emitting substrate further includes four light-emitting devices (i.e., a light-emitting device 200a, a light-emitting device 200b, a light-emitting device 200c, and a light-emitting device 200d) that are respectively included in the four sub-pixel units. The four light-emitting devices may emit light of different colors. For example, the light-emitting device 200a may emit red light, the light-emitting device 200b may emit green light, the light-emitting device 200c may emit blue light, and the light-emitting device 200d may emit white light.

Referring to FIG. 18C, the fourth pattern layer 4 includes a third electrode 510a of the light-detecting device 550a, a third electrode 510b of the light-detecting device 500b, a third electrode 510c of the light-detecting device 500c, and a third electrode 510d of the light-detecting device 500d. Referring to FIG. 18D, the seventh pattern layer 7 includes a semiconductor pattern 520a of the light-detecting device 500a, a semiconductor pattern 520b of the light-detecting device 500b, a semiconductor pattern 520c of the light-detecting device 500c, and a semiconductor pattern 520d of the light-detecting device 500d. Referring to FIG. 18E, the eighth pattern layer 8 includes a fourth electrode 530a of the light-detecting device 500a, a fourth electrode 530b of the light-detecting device 500b, a fourth electrode 530c of the light-detecting device 500c, and a fourth electrode 530d of the light-detecting device 500d. Referring to FIG. 18F, the first pattern layer 1 includes a second sub-electrode 212a' of the light-emitting device 200a, a second sub-electrode 212b' of the light-emitting device 200b, a second sub-electrode 212c of the light-emitting device 200c, and a second sub-electrode 212d of the light-emitting device 200d. Referring to FIG. 18G, the second pattern layer 2 includes a first conductive pattern 211aa of the first sub-electrode in the light-emitting device 200a, a first conductive pattern 211ab of the first sub-electrode in the light-emitting device 200b, a first conductive pattern 211ac of the first sub-electrode in the light-emitting device 200c, and a first conductive pattern 211ad of the first sub-electrode in the light-emitting device 200d. Referring to FIG. 18H, the third pattern layer 3 includes a second conductive pattern 211ba of the first sub-electrode in the light-emitting device 200a, a second conductive pattern 211bb of the first sub-electrode in the light-emitting device 200b, a second conductive pattern 211bc of the first sub-electrode in the light-emitting device 200c, and a second conductive pattern 211bd of the first sub-electrode in the light-emitting device 200d.

Since a light-emitting device may correspond to a first connection portion, the light-emitting substrate may further include four first connection portions. Referring to FIG. 18F, the first pattern layer 1 further includes first connection patterns 410 of the first connection portions, for example, a first connection pattern 410a of a first connection portion corresponding to the light-emitting device 200a, a first connection pattern 410b of a first connection portion corresponding to the light-emitting device 200b, a first connection pattern 410c of a first connection portion corresponding to the light-emitting device 200c, and a first connection pattern 410d of a first connection portion corresponding to the light-emitting device 200d. Referring to FIG. 18G, the second pattern layer 2 further includes second connection patterns 420 of the first connection portions, for example, a second connection pattern 420a of the first connection portion corresponding to the light-emitting device 200a, a second connection pattern 420b of the first connection portion corresponding to the light-emitting device 200b, a second connection pattern 420c of the first connection portion corresponding to the light-emitting device 200c, and a second connection pattern 420d of the first connection portion corresponding to the light-emitting device 200d.

Referring to FIG. 18H, the third pattern layer 3 further includes third connection patterns 430 of the first connection portions, for example, a third connection pattern 430a of the first connection portion corresponding to the light-emitting device 200a, a third connection pattern 430b of the first connection portion corresponding to the light-emitting device 200b, a third connection pattern 430c of the first connection portion corresponding to the light-emitting device 200c, and a third connection pattern 430d of the first connection portion corresponding to the light-emitting device 200d.

Each light-detecting device may be configured to detect a light-emitting condition of a light-emitting device. For example, the light-detecting device 500a may be configured to detect a light-emitting condition of the light-emitting device 200a, the light-detecting device 500b may be configured to detect a light-emitting condition of the light-emitting device 200b, the light-detecting device 500c may be configured to detect a light-emitting condition of the light-emitting device 200c, and the light-detecting device 500d may be configured to detect a light-emitting condition of the light-emitting device 200d.

The light-emitting substrate may further include at least two second transistors coupled to the at least two light-detecting devices in a one-to-one correspondence. The second transistors are located in a control circuit of the light-detecting devices. Referring to FIGS. 16 and 19A, a second conductive portion of each second transistor may be coupled to a light-detecting device, so that each second transistor may be configured to control a corresponding light-detecting device to be turned on and off. For example, the second conductive portion T13s of the second transistor T13 is coupled to the light-detecting device 500a, so that the second transistor T13 may be configured to control the light-detecting device 500a to be turned on and off. The second conductive portion T23s of the second transistor T23 is coupled to the light-detecting device 500b, so that the second transistor T23 may be configured to control the light-detecting device 500b to be turned on and off. The second conductive portion T33s of the second transistor T33 is coupled to the light-detecting device 500c, so that the second transistor T33 may be configured to control the light-detecting device 500c to be turned on and off. The second conductive portion T43s of the second transistor T43 is coupled to the light-detecting device 500d, so that the second transistor T43 may be configured to control the light-detecting device 500d to be turned on and off.

Among the second transistors coupled to the light-detecting devices in the one-to-one correspondence, first conductive portions of the second transistors may be an integral pattern. For example, referring to FIGS. 18A and 19A, the first conductive portion T13d of the second transistor T13, the first conductive portion T23d of the second transistor T23, the first conductive portion T33d of the second transistor T33, and the first conductive portion T43d of the second transistor T43 may be an integrated pattern. In some possible implementations, referring to FIGS. 16 and 18C, the integral pattern may be coupled to a photoelectric detection signal line 60. In this way, the plurality of transistors may be coupled by using one photoelectric detection signal line 60. Further, the plurality of transistors may be controlled by using one photoelectric detection signal line 60. For example, one photoelectric detection signal line 60 may be used to output the detection signals of the light-detecting device 500a, the light-detecting device 500b, the light-detecting device 500c, and the light-detecting device 500d.

In some embodiments, the at least two second transistors include four second transistors coupled to four light-detecting devices in the one-to-one correspondence. For the four second transistors, for example, referring to FIG. 18A, for the second transistor T13, the second transistor T23, the second transistor T33 and the second transistor T43, the first conductive portions thereof (including the first conductive portion T13d, the first conductive portion T23d, the first conductive portion T33d, and the first conductive portion T43d, which may be the integral pattern), the active layers thereof (including the active layer T13a, the active layer T23a, the active layer T33a and the active layer T43a), and the second conductive portions thereof (including the second conductive portion T13s, the second conductive portion T23s, the second conductive portion T33s, and the second conductive portion T43s) provide a cross pattern.

Referring to FIG. 19A, in some embodiments, the light-emitting substrate further includes at least one (e.g., one or more) conductive ring 40, and each conductive ring 40 may be located on a side of the active layers of the transistors away from the base substrate. For example, the conductive ring 40 may be located in the sixth pattern layer 6, and the active layers of the transistors may be disposed in the fifth pattern layer 5. In the thickness direction of the light-emitting substrate, the sixth pattern layer 6 may be located on a side of the fifth pattern layer 5 away from the base substrate.

A conductive ring 40 may correspond to at least two second transistors. For example, referring to FIG. 19A, the conductive ring 40 corresponds to four second transistors (i.e., the second transistor T13, the second transistor T23, the second transistor T33, and the second transistor T43).

For second transistors corresponding to a same conductive ring, a portion of the conductive ring opposite to the active layer of each second transistor serves as the gate of the second transistor, and an orthogonal projection of the integral pattern formed by the first conductive portions of the second transistors on the base substrate is located inside an orthogonal projection of the conductive ring on the base substrate. For example, a portion of the conductive ring 40 opposite to the active layer T13a of the second transistor T13 serves as the gate T13g of the second transistor T13, a portion of the conductive ring 40 opposite to the active layer T23a of the second transistor T23 serves as a gate T23g of the second transistor T23, a portion of the conductive ring 40 opposite to the active layer T33a of the second transistor T33 serves as the gate T33g of the second transistor T33, and a portion of the conductive ring 40 opposite to the active layer T43a of the second transistor T43 serves as the gate T43g of the second transistor T43; moreover, the orthogonal projection of the integral pattern (i.e., the first conductive portion T13d, the first conductive portion T23d, the first conductive portion T33d, and the first conductive portion T43d) on the base substrate is located inside the orthogonal projection of the conductive ring 40 on the base substrate.

In this case, the gates of the second transistors described above may be portions of the same conductive ring, that is, the gates of the second transistors are coupled with one another. In this way, one signal line may be used to control the second transistors to be turned on or off, thereby controlling the light-detecting devices to be turned on or off. For example, the conductive ring 40 includes the gate T13g of the second transistor T13, the gate T23g of the second transistor T23, the gate T33g of the second transistor T33, and the gate T43g of the second transistor T43. The above four gates are portions of the same conductive ring 40, so that the four gates are coupled with one another. Further, a photoelectric detection control line may be coupled to the conductive ring 40. In this way, the photoelectric detection control line may be used to control the four second transistors to be turned on or off, thereby controlling the four light-detecting devices to be turned on or off.

In some embodiments, the light-emitting substrate further includes a photoelectric detection control line 30, referring to FIG. 18B, for one conductive ring 40, the photoelectric detection control line 30 includes two control line segments (i.e., a control line segment 30a and a control line segment 30b) coupled to the conductive ring 40. Each control line segment and the conductive ring 40 provide an obtuse angle at a position where the control line segment and the conductive ring 40 are coupled. For example, referring to FIG. 18B, the conductive ring 40 is in a shape of a rhombus, and the control line segment 30a and the conductive ring 40 provide an obtuse angle α1 at a position where the control line segment 30a and the conductive ring 40 are coupled, and the control line segment 30b and the conductive ring 40 provide an obtuse angle α2 at a position where the control line segment 30b and the conductive ring 40 are coupled. In this way, an electrostatic effect between the control line segments (e.g., the control line segment 30a and the control line segment 30b) and the conductive ring 40 may be reduced, and the yield of the light-emitting substrate may be improved.

Referring to FIG. 18B, the sixth pattern layer 6 includes the conductive ring 40, the auxiliary electrode lines 20, the photoelectric detection control line 30, and gates of transistors (e.g., gate T11g, gate T12g, and gate T13g). Therefore, the conductive ring 40, the auxiliary electrode lines 20, the photoelectric detection control line 30, and the gates of the transistors may be disposed in a same layer.

The light-emitting substrate provided by the embodiments of the present disclosure may further include other signal lines.

In some embodiments, referring to FIGS. 16, 19A and 18B, the light-emitting substrate further includes gate lines (e.g., a gate line 51 and a gate line 52). The gate lines may be disposed on the base substrate. For example, the gate lines may be disposed in the sixth pattern layer 6, and are disposed in the same layer as the auxiliary electrode lines 20, the conductive ring 40, the photoelectric detection control line 3, and the gates of the transistors. A gate line may be configured to control light-emitting devices to be turned on and off. For example, as shown in FIG. 16, the gate line 51 may be configured to control the light-emitting device 200a and the light-emitting device 200b to be turned on or off, and the gate line 52 may be configured to control the light-emitting device 200c and the light-emitting device 200d to be turned on and off.

In some embodiments, referring to FIGS. 16 and 18C, the light-emitting substrate further includes data lines (e.g., a data line Data1, a data line Data2, a data line Data3, and a data line Data4). The data lines may be disposed above the base substrate. A data line may be configured to provide a data signal to a light-emitting device. For example, the data line Data1, the data line Data2, the data line Data3, and the data line Data4 may be disposed in the fourth pattern layer 4, and the fourth pattern layer 4 further includes the third electrodes 510 of the light-detecting devices (e.g., the third electrode 510a of the light-detecting device 500a, the third electrode 510b of the light-detecting device 500b, the third electrode 510c of the light-detecting device 50c, and the third electrode 510d of the light-detecting device 500d), and the second connection portions 10. That is, the data lines may be disposed in a same layer as the third electrodes 510 of the light-detecting devices and the second connection portions 10. The data line Data1 may be configured to provide a data signal to the light-emitting device 200a, the data line Data2 may be configured to provide a data signal to the light-emitting device 200b, the data line Data3 may be configured to provide a data signal to the light-emitting device 200c, and the data line Data4 may be configured to provide a data signal to the light-emitting device 200d.

In some embodiments, the light-emitting substrate further includes power lines. The power lines may be disposed above the base substrate, for example, may be disposed in the fourth pattern layer 4. A power line may be configured to provide a constant voltage signal ELVDD to pixel driving circuits. For example, referring to FIGS. 16 and 18C, the fourth pattern layer 4 further includes a power line Vdd1 and a power line Vdd2. That is, the power line Vdd1 and the power line Vdd2 are disposed in a same layer as the data lines, the third electrodes 510 of the light-detecting devices, and the second connection portions 10. The power line Vdd1 may provide the voltage signal ELVDD to the pixel driving circuits coupled to the light-emitting device 200a and the light-emitting device 200c respectively, and the power line Vdd2 may provide the voltage signal ELVDD to the pixel driving circuits coupled to the light-emitting device 200b and the light-emitting device 200d respectively.

Figure 20:
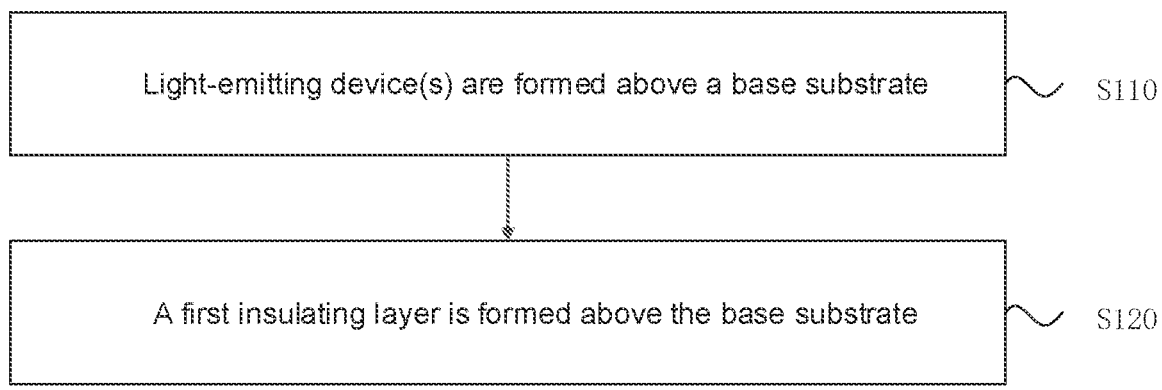
FIG. 20 is a flow diagram of a method for manufacturing a light-emitting substrate, in accordance with some embodiments.

Some embodiments of the present disclosure provide a method for manufacturing a light-emitting substrate. The light-emitting substrate described in any one of the above embodiments may be manufactured by using the manufacturing method. FIG. 20 is a flow diagram of a method for manufacturing a light-emitting substrate. Referring to FIG. 20, the method for manufacturing the light-emitting substrate may include following steps.

In S110, light-emitting device(s) are formed above a base substrate.

The light-emitting device may include a first electrode, a light-emitting functional layer and a second electrode that are sequentially stacked in a direction moving away from the base substrate. The first electrode may include a second sub-electrode and a first sub-electrode that are sequentially stacked in the direction moving away from the base substrate. The second sub-electrode may include a first portion and a second portion except for the first portion, and the first portion is covered by the first sub-electrode.

In some embodiments, a step of forming the first electrode on the base substrate may further include following steps.

In S111, a first pattern layer is formed on the base substrate. The first pattern layer may include a second sub-electrode.

In S112, a conductive film covering the first pattern layer is formed on the base substrate on which the first pattern layer is formed.

In S113, a third pattern layer is formed on the base substrate on which the conductive thin film is formed. The third pattern layer may include a second conductive pattern.

In S114, the conductive film is etched by using the third pattern layer as a mask, so as to pattern the conductive film to be a second pattern layer.

The second pattern layer may include a first conductive pattern. An orthogonal projection of the first conductive pattern on the base substrate may within an orthogonal projection of the second conductive pattern on the base substrate.

After the steps S111, S112, S113, and S114, the second sub-electrode, the first conductive pattern, and the second conductive pattern that are staked are obtained, and the second sub-electrode, the first conductive pattern, and the second conductive pattern may constitute the first electrode of the light-emitting device.

In S120, a first insulating layer is formed above the base substrate.

The first insulating layer may have a first opening and a second opening.

In some embodiments, an orthogonal projection of a lower edge of the first opening on the base substrate is within an orthogonal projection of the first sub-electrode on the base substrate, and an orthogonal projection of a lower edge of the second opening on the base substrate is within an orthogonal projection of the second portion of the second sub-electrode on the base substrate. A portion of a side face of the first sub-electrode located on the second sub-electrode is covered by the first insulating layer. In addition, a portion of the light-emitting functional layer of the light-emitting device located in the first opening is in contact with the first sub-electrode, and a portion of the light-emitting functional layer located in the second opening is in contact with the second portion in the second sub-electrode.

In some embodiments, the method for manufacturing the light-emitting substrate may also manufacture the light-emitting substrate including first and second connection portions as described in the above embodiments, and the light-emitting substrate including the light-detecting device(s) and/or transistors as described in the above embodiments. Correspondingly, referring to FIGS. 21A to 21J, the method for manufacturing the light-emitting substrate may include following steps.

Figure 21A:
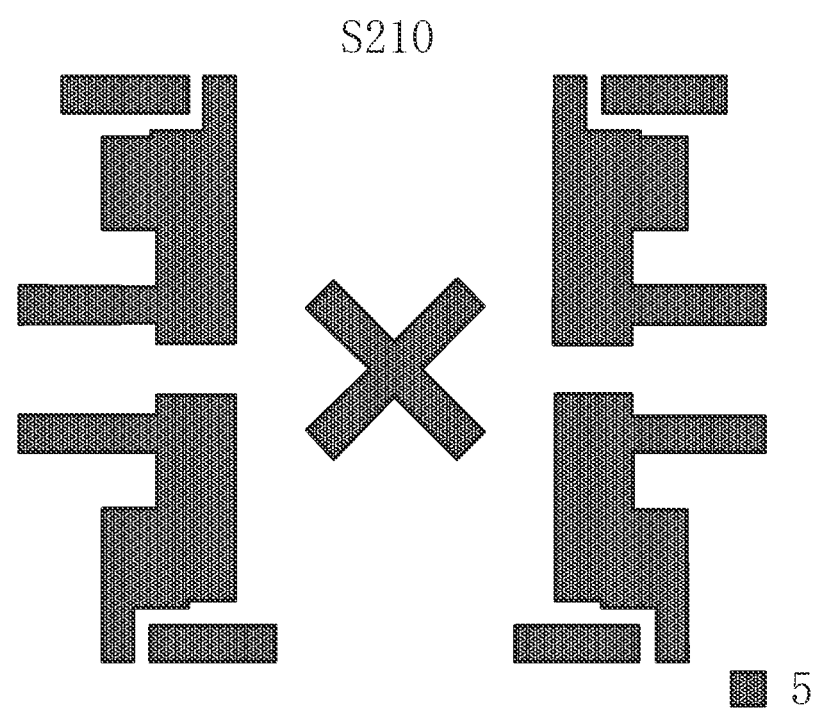
FIGS. 21A to 21J are process flow diagrams of a method for manufacturing a light-emitting substrate, in accordance with some embodiments.

In S210, referring to FIG. 21A, a fifth pattern layer 5 is formed above the base substrate.

A material of the fifth pattern layer to be formed may be a semiconductor material. Portions of the patterns of the fifth pattern layer to be formed may be caused to be conductive through a doping process, the conductive portions may serve as source regions and drain regions of transistors, and the non-conductive portions may serve as active layers of the transistors, so that the fifth pattern layer 5 is obtained.

Figure 21B:
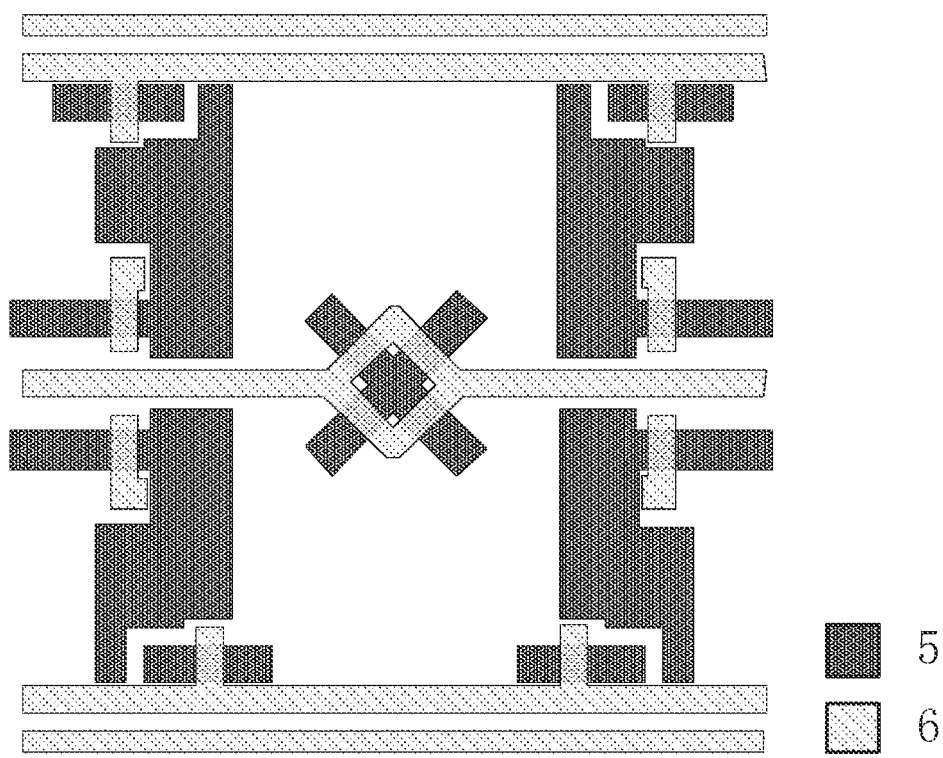

In S220, referring to FIG. 21B, a sixth pattern layer 6 is formed on the base substrate on which the fifth pattern layer 5 is formed.

In some possible implementations, referring to FIG. 8A, a gate insulating layer GL may be formed first on the base substrate on which the fifth pattern layer is formed, so that the gate insulating layer covers the source layers of the transistors, then, the sixth pattern layer is formed on the base substrate on which the gate insulating layer is formed to form the gates of the transistors.

Figure 21C:
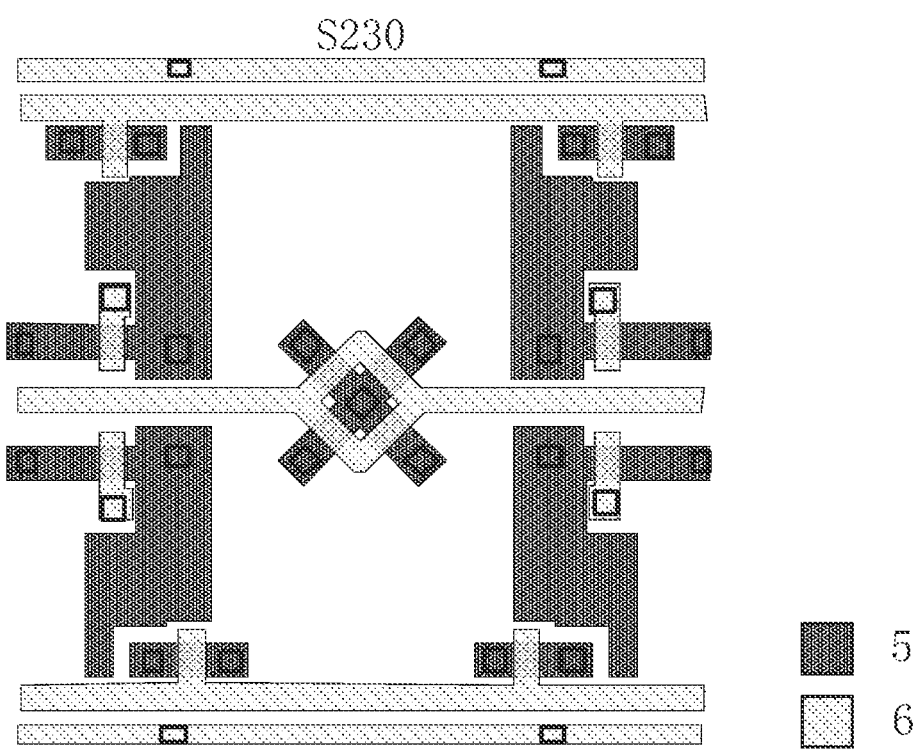

In S230, referring to FIG. 21C, a fourth insulating layer is formed on the base substrate on which the sixth pattern layer 6 is formed.

A material of the fourth insulating layer may be an insulating material, such as silicon dioxide, or silicon nitride. The fourth insulating layer may include an eighth opening.

Figure 21D:
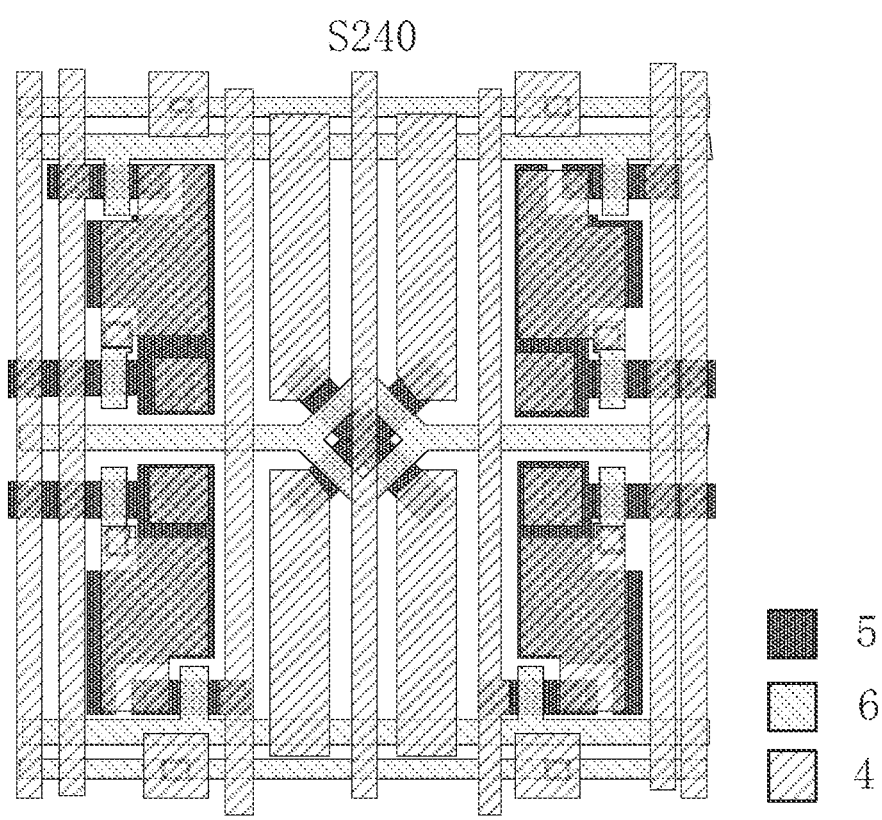

In S240, referring to FIG. 21D, a fourth pattern layer 4 is formed on the base substrate on which the fourth insulating layer is formed. A material of the fourth pattern layer 4 may be metal.

Figure 21E:
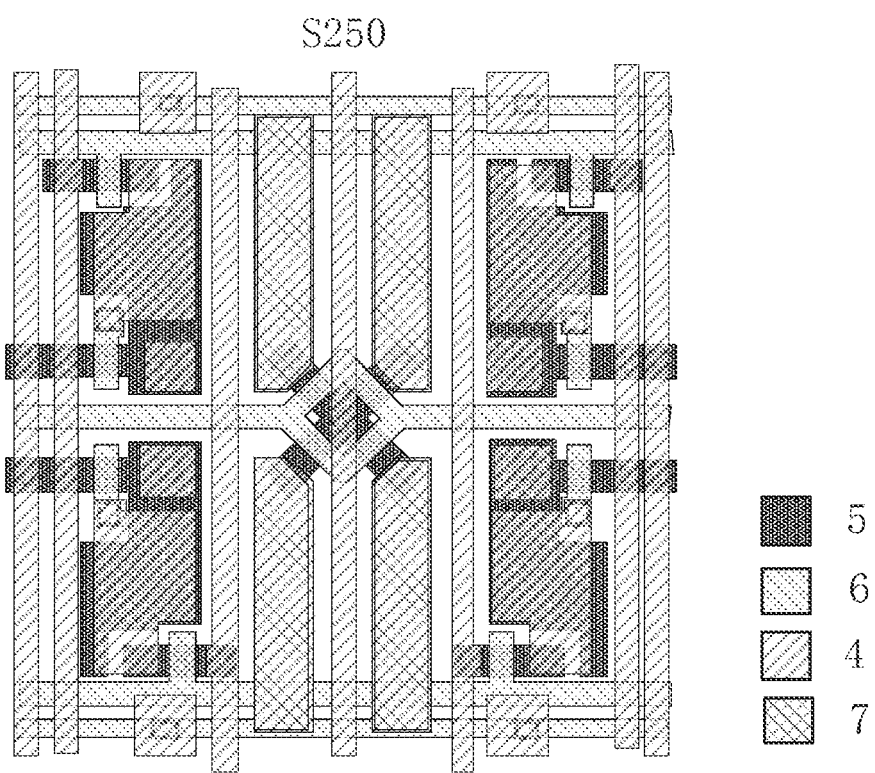

In S250, referring to FIG. 21E, a seventh pattern layer 7 is formed on the base substrate on which the fourth pattern layer 4 is formed. A material of the seventh pattern layer 7 may be a semiconductor material. For example, the material of the seventh pattern layer 7 may include an n-type semiconductor material, an intrinsic semiconductor material, and a p-type semiconductor material. The intrinsic semiconductor material may be lightly doped.

Figure 21F:
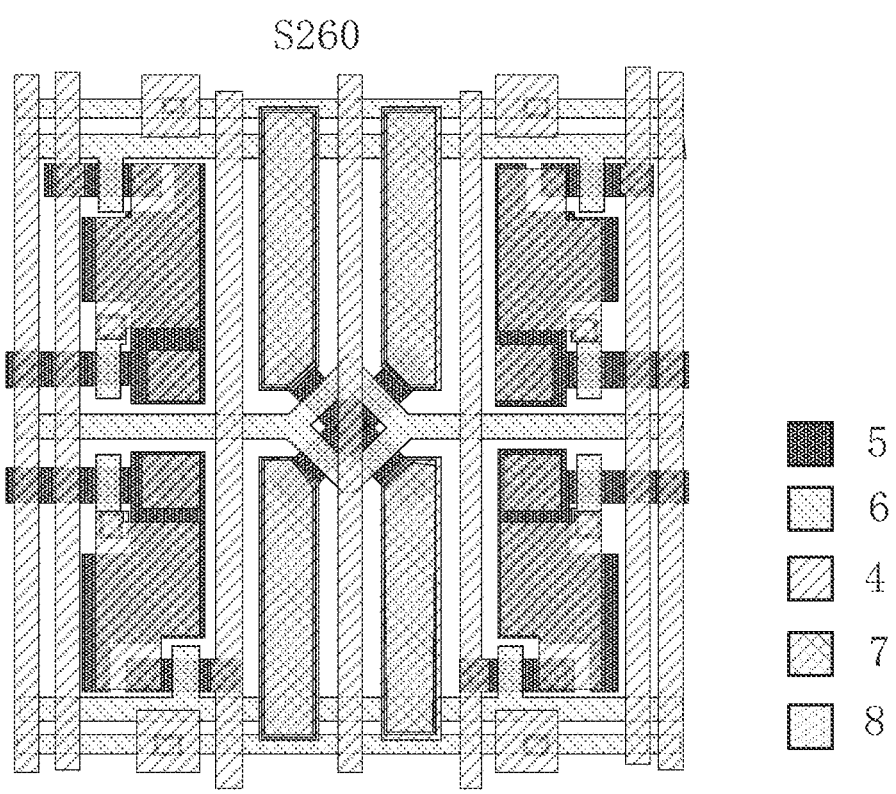

In S260, referring to FIG. 21F, an eighth pattern layer 8 is formed on the base substrate on which the seventh pattern layer 7 is formed. A material of the eighth pattern layer 8 may be a transparent conductive material. For example, the material of the eighth pattern layer 8 may be metal oxide, such as indium tin oxide (ITO), or indium zinc oxide (IZO).

Figure 21G:
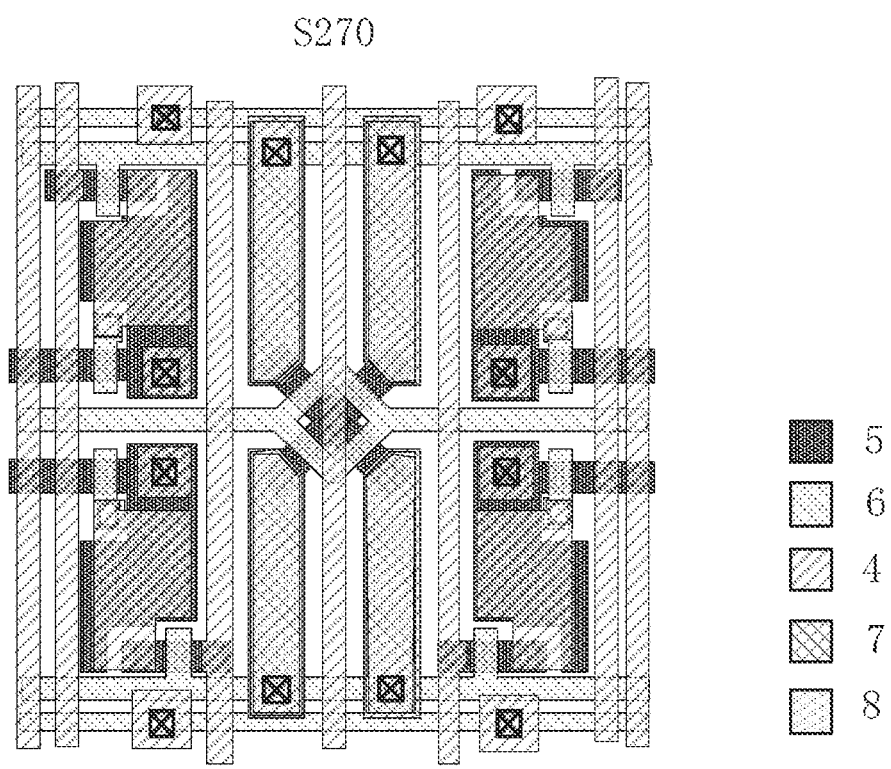

In S270, referring to FIG. 21G, a second insulating layer is formed on the base substrate on which the eighth pattern layer 8 is formed. A material of the second insulating layer may be an insulating material, such as silicon dioxide, or silicon nitride. The second insulating layer may include a fourth opening and/or a sixth opening.

Figure 21H:
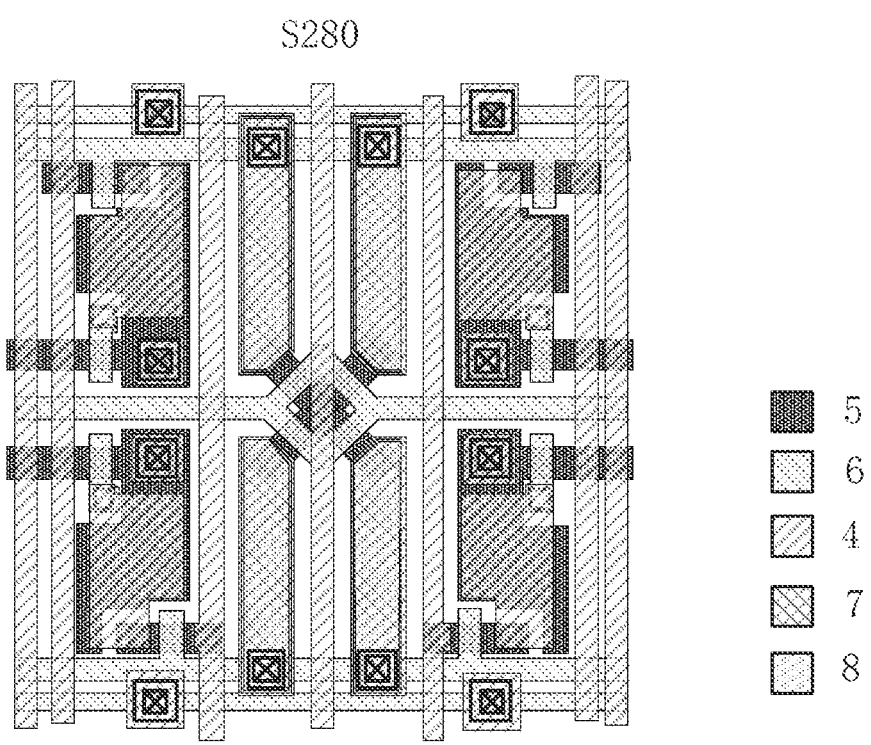

In S280, referring to FIG. 21H, a third insulating layer is formed on the base substrate on which the second insulating layer is formed.

A material of the third insulating layer may be an insulating material, such as silicon dioxide, or silicon nitride. The third insulating layer may include a fifth opening and/or a seventh opening.

Figure 21I:
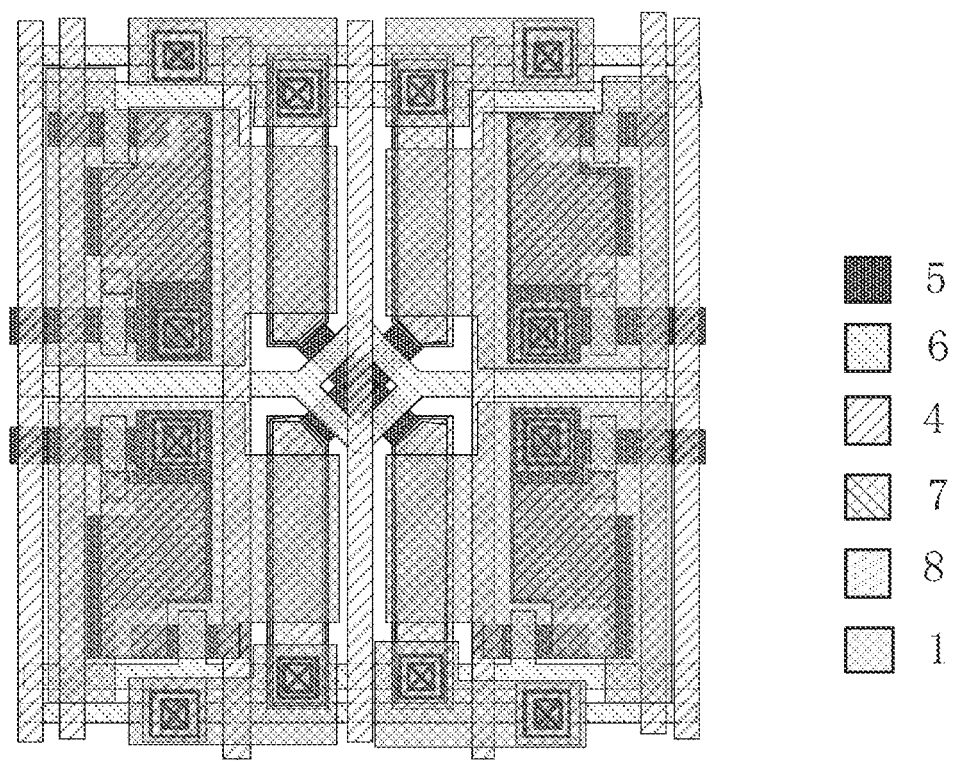

In S290, referring to FIG. 21I, a first pattern layer 1 is formed on the base substrate on which the third insulating layer is formed.

A material of the first pattern layer 1 may be a transparent conductive material. For example, the material of the first pattern layer 1 may be metal oxide, such as indium tin oxide (ITO), or indium zinc oxide (IZO).

Figure 21J:
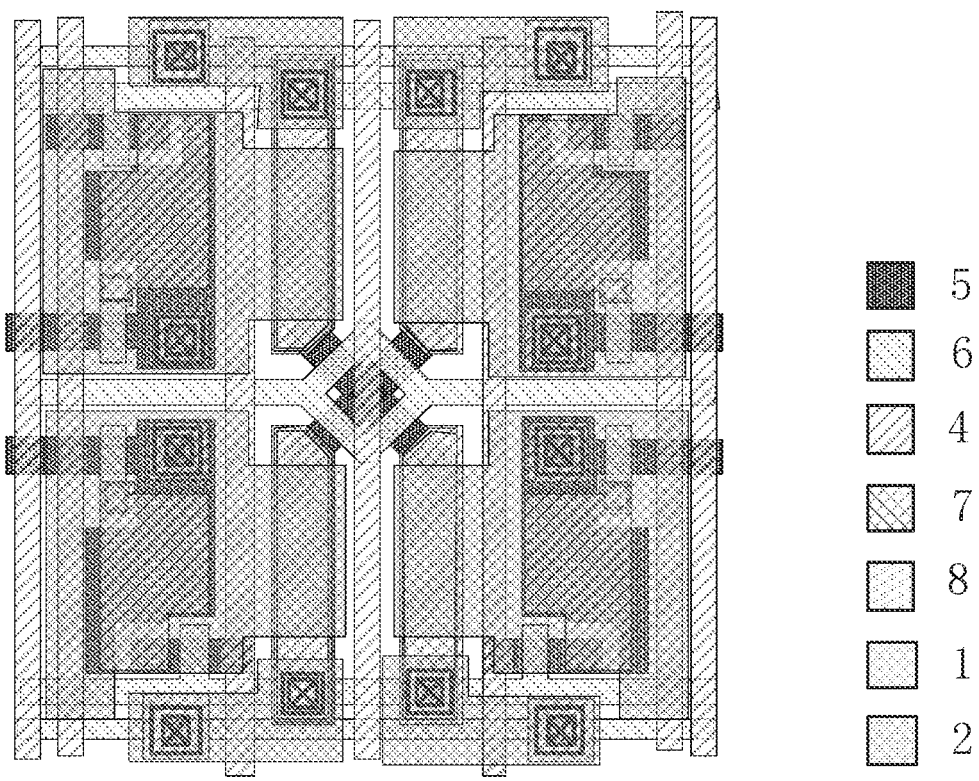

In S300, referring to FIG. 21J, a second pattern layer 2 and a third pattern layer are formed on the base substrate on which the first pattern layer 1 is formed.

In some possible implementations, forming the second pattern layer 2 and the third pattern layer on the base substrate on which the first pattern layer 1 is formed may include: forming a conductive film on the base substrate on which the first pattern layer 1 is formed, the conductive film covering the first pattern layer 1; forming the third pattern layer on the base substrate on which the conductive thin film is formed, and etching the conductive film by using the third pattern layer 3 as a mask to pattern the conductive film to be the second pattern layer 2. A shape of the third pattern layer 3 may be similar to a shape of the second pattern layer 2 through this process. FIG. 21J only shows the second pattern layer 2, and omits the third pattern layer.

A material of the conductive film may be metal, such as Al. A material of the third pattern layer may be a material with a high work function, for example metal oxide, such as indium tin oxide (ITO), or indium zinc oxide (IZO).

In S320, a first insulating layer is formed on the base substrate on which the third pattern layer 3 is formed.

A material of the first insulating layer may be an insulating material, such as silicon dioxide, or silicon nitride. The first insulating layer may include a first opening and a second opening, and the first insulating layer may further include a third opening.

In S330 (optionally), a light-emitting functional layer and/or a second electrode are formed on the base substrate on which the first insulating layer is formed.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the scope of the present disclosure shall be subject to the protection scope of the claims.

What is claimed is:

1. A light-emitting substrate, comprising:
a base substrate;
at least one light-emitting device disposed above the base substrate, a light-emitting device including a first electrode, a light-emitting functional layer and a second electrode that are sequentially stacked in a direction moving away from the base substrate, wherein the first electrode includes a second sub-electrode and a first sub-electrode that are sequentially stacked in the direction moving away from the base substrate, the second sub-electrode includes a first portion and a second portion except for the first portion, and the first portion is covered by the first sub-electrode; and
a first insulating layer disposed above the base substrate, the first insulating layer having a first opening and a second opening, wherein an orthogonal projection of a lower edge of the first opening on the base substrate is within an orthogonal projection of the first sub-electrode on the base substrate, an orthogonal projection of a lower edge of the second opening on the base substrate is within an orthogonal projection of the second portion of the second sub-electrode on the base substrate, and a portion of a side face of the first sub-electrode located on the second sub-electrode is covered by the first insulating layer, wherein
a portion of the light-emitting functional layer located in the first opening is in contact with the first sub-electrode, and a portion of the light-emitting functional layer located in the second opening is in contact with the second portion of the second sub-electrode; and the lower edge of the first opening is an edge of the first opening proximate to the base substrate, and the lower edge of the second opening is an edge of the second opening proximate to the base substrate.

2. The light-emitting substrate according to claim 1, wherein
the first sub-electrode includes a first conductive pattern and a second conductive pattern that are sequentially stacked in the direction moving away from the base substrate, and an orthogonal projection of the first conductive pattern on the base substrate is within an orthogonal projection of the second conductive pattern on the base substrate.

3. The light-emitting substrate according to claim 2, wherein
the second sub-electrode is a transparent conductive electrode; and
the first conductive pattern is a light-reflecting pattern.

4. The light-emitting substrate according to claim 3, wherein
an area of the first opening is larger than an area of the second opening.

5. The light-emitting substrate according to claim 1, further comprising:
at least one light-detecting device disposed above the base substrate and located on a side of the first electrode away from the light-emitting functional layer, wherein an orthogonal projection of a light-detecting device on the base substrate overlaps with the orthogonal projection of the lower edge of the second opening on the base substrate; the light-detecting device is configured to detect light emitted by one or more light-emitting devices.

6. The light-emitting substrate according to claim 5, wherein
the light-detecting device includes a third electrode and a fourth electrode, the fourth electrode is closer to the second opening than the third electrode; and
the fourth electrode is a transparent conductive electrode, and the second sub-electrode is a transparent conductive electrode; or
the light detecting device includes a third electrode and a fourth electrode, the fourth electrode is closer to the second opening than the third electrode, the fourth electrode is a transparent conductive electrode, and the second sub-electrode is a transparent conductive electrode; the light-emitting substrate further comprises data lines disposed above the base substrate, and the third electrode is disposed in a same layer as the data lines.

7. The light-emitting substrate according claim 5, further comprising:
a plurality of transistors including at least one first transistor coupled to the light-emitting device and a second transistor coupled to the light-detecting device, wherein
the plurality of transistors are disposed on the base substrate, each transistor includes an active layer, and the active layer is located on a side of the light-detecting device proximate to the base substrate; and
the light-detecting device further includes a semiconductor pattern, and an orthogonal projection of the semiconductor pattern on the base substrate is non-overlap with an orthogonal projection of each active layer of the plurality of transistors on the base substrate.

8. The light-emitting substrate according to claim 7, wherein an area of the orthogonal projection of the semiconductor pattern of the light-detecting device on the base substrate is larger than an area of an orthogonal projection of an active layer of the second transistor on the base substrate; or
the at least one first transistor includes a driving transistor, and a width-to-length ratio of a channel region of the second transistor is less than a width-to-length ratio of a channel region of the driving transistor; or
a length direction of a channel region second transistor is non-parallel to a length direction of a channel region of each first transistor.

9. The light-emitting substrate according to claim 7, wherein the light-emitting substrate comprises at least two light-detecting devices and at least two second transistors coupled to the at least two light-detecting devices in a one-to-one correspondence;
each second transistor in the at least two second transistors further includes a first conductive portion and a second conductive portion that are respectively located on two sides of an active layer and in contact with the active layer, first conductive portions of the at least two second transistors are an integral pattern, and each second conductive portion is coupled to a light-detecting device of the at least two light-detecting devices.

10. The light-emitting substrate according to claim 9, wherein the at least two second transistors include four second transistors, the at least two light-detecting devices includes four light-detecting devices; and
first conductive portions, active layers and second conductive portions of the four second transistors provide a cross pattern; and/or
the light-emitting substrate further comprises a photoelectric detection signal line coupled to the integral pattern.

11. The light-emitting substrate according to claim 9, further comprising:
- at least one conductive ring, each conductive ring being located on a side of the active layer away from the base substrate, wherein
- a portion of a conductive ring opposite to the active layer of each second transistor of the at least two second transistors serves as a gate of the second transistor; and
- an orthogonal projection of the integral pattern on the base substrate is located inside an orthogonal projection of the conductive ring on the base substrate, or
- the light-emitting substrate further comprising:
- at least one conductive ring, each conductive ring being located on a side of the active layer away from the base substrate, wherein a portion of a conductive ring opposite to the active layer of each second transistor of the at least two second transistors serves as a gate of the second transistor; and an orthogonal projection of the integral pattern on the base substrate is located inside an orthogonal projection of the conductive ring on the base substrate; and
- a photoelectric detection control line including two control line segments coupled to the conductive ring, each control line segment and the conductive ring providing an obtuse angle at a position where the control line segment and the conductive ring are coupled.

12. The light-emitting substrate according to claim 1, further comprising:
- an auxiliary electrode line; wherein
- the auxiliary electrode line is disposed on a side of the second electrode of the light-emitting device proximate to the base substrate, and coupled to the second electrode of the light-emitting device.

13. The light-emitting substrate according to claim 12, further comprising a first connection portion; wherein
- the first connection portion is disposed on a side of the auxiliary electrode line away from the base substrate and the side of the second electrode of the light-emitting device proximate to the base substrate; the first connection portion is coupled to the second electrode and the auxiliary electrode line.

14. The light-emitting substrate according to claim 13, wherein
- the first connection portion includes a first connection pattern, a second connection pattern, and a third connection pattern that are sequentially stacked in the direction moving away from the base substrate, an orthogonal projection of the second connection pattern on the base substrate is within an orthogonal projection of the third connection pattern on the base substrate, and is within an orthogonal projection of the first connection pattern on the base substrate; and
- the first insulating layer further has a third opening, and the third opening exposes at least a portion of the first connection pattern, at least a portion of the second connection pattern and at least a portion of the third connection pattern; the light-emitting functional layer further extends into the third opening, and a portion of the light-emitting functional layer located in the third opening is discontinuous; and the second electrode further extends into the third opening, and a portion of the second electrode located in the third opening is in contact with at least one of the first connection pattern, the second connection pattern, and the third connection pattern.

15. The light-emitting substrate according to claim 14, wherein
- the portion of the second electrode located in the third opening is at least in contact with the first connection pattern; and/or
- the first sub-electrode includes a first conductive pattern and a second conductive pattern that are sequentially stacked in the direction moving away from the base substrate; the first connection pattern of the first connection portion is disposed in a same layer as the second sub-electrode, the second connection pattern of the first connection portion is disposed in a same layer as the first conductive pattern of the first sub-electrode; and the third connection pattern of the first connection portion is disposed in a same layer as the second conductive pattern of the first sub-electrode.

16. The light-emitting substrate according to claim 13, further comprising:
- a second connective portion disposed on a side of the first connection portion proximate to the base substrate and the side of the auxiliary electrode line away from the base substrate, wherein
- the second connection portion is in contact with the first connection portion and the auxiliary electrode line; and/or
- the light-emitting substrate further comprising:
- a light-detecting device disposed above the base substrate and located on a side of the first electrode away from the light-emitting device; the light-detecting device including a third electrode and a fourth electrode, and the fourth electrode being closer to the second opening than the third electrode; and
- a second insulating layer and a third insulating layer that are sequentially stacked above the base substrate in the direction moving away from the base substrate, and located on a side of the first connection portion proximate to the base substrate and a side of the fourth electrode away from the base substrate, wherein
- the second insulating layer has a fourth opening, the third insulating layer has a fifth opening, an orthogonal projection of an upper edge of the fourth opening on the base substrate is within an orthogonal projection of a lower edge of the fifth opening on the base substrate, and overlaps with an orthogonal projection of the fourth electrode on the base substrate; the first connection portion is in contact with the fourth electrode through the fourth opening and the fifth opening, and
- the upper edge of the fourth opening is an edge of the fourth opening away from the base substrate, and the lower edge of the fifth opening is an edge of the fifth opening proximate to the base substrate.

17. The light-emitting substrate according to claim 12, further comprising:
- a light-detecting device disposed above the base substrate and located on a side of the first electrode away from the light-emitting functional layer, and configured to defect light emitted by the at least one light-emitting device; wherein
- the light-detecting device includes a third electrode and a fourth electrode, the fourth electrode is closer to the second opening than the third electrode, and the auxiliary electrode line is coupled to the third electrode or the fourth electrode.

18. The light-emitting substrate according to claim 14, further comprising;
- a light-detecting device disposed above the base substrate and located on a side of the first electrode away from the light-emitting functional layer, and configured to detect light emitted by the at least one light-emitting device; wherein
- the light-detecting device includes a third electrode and a fourth electrode, the fourth electrode is closer to the second opening than the third electrode, and the first connection pattern of the first connection portion is in contact with the fourth electrode.

19. The light-emitting substrate according to claim 1, wherein
- the light-emitting substrate is a display panel.

20. A display apparatus, comprising the light-emitting substrate according to claim 19.

* * * * *

UNITED STATES PATENT AND TRADEMARK OFFICE
CERTIFICATE OF CORRECTION

PATENT NO. : 12,317,695 B2
APPLICATION NO. : 17/789248
DATED : May 27, 2025
INVENTOR(S) : Ying Han et al.

It is certified that error appears in the above-identified patent and that said Letters Patent is hereby corrected as shown below:

In the Specification

Column 31, Line 38: the number "188" should be "18B".

Signed and Sealed this
Twenty-third Day of December, 2025

John A. Squires
*Director of the United States Patent and Trademark Office*